United States Patent
Kim et al.

(10) Patent No.: US 12,068,381 B2
(45) Date of Patent: Aug. 20, 2024

(54) TRANSISTOR, TERNARY INVERTER INCLUDING SAME, AND TRANSISTOR MANUFACTURING METHOD

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); Ji Won Chang, Ulsan (KR); Jae Won Jeong, Ulsan (KR); Youngeun Choi, Ulsan (KR); Wooseok Kim, Ulsan (KR)

(73) Assignee: UNIST(ULSAN NATIONAL INSTITUTE OF SCIENCE AND TECHNOLOGY) (KR)

( * ) Notice: Subject to any disclaimer, the term of this patent is extended or adjusted under 35 U.S.C. 154(b) by 250 days.

(21) Appl. No.: 17/636,026

(22) PCT Filed: Nov. 19, 2020

(86) PCT No.: PCT/KR2020/016416
§ 371 (c)(1),
(2) Date: Feb. 16, 2022

(87) PCT Pub. No.: WO2021/101289
PCT Pub. Date: May 27, 2021

(65) Prior Publication Data
US 2022/0285507 A1    Sep. 8, 2022

(30) Foreign Application Priority Data

Nov. 19, 2019    (KR) .......................... 10-2019-0149120
Nov. 19, 2019    (KR) .......................... 10-2019-0149121
(Continued)

(51) Int. Cl.
*H01L 29/417*      (2006.01)
*H01L 21/8238*    (2006.01)
(Continued)

(52) U.S. Cl.
CPC .................. *H01L 29/41791* (2013.01); *H01L 21/823807* (2013.01); *H01L 21/823814* (2013.01);
(Continued)

(58) Field of Classification Search
CPC ....... H01L 29/41791; H01L 21/823807; H01L 21/823814; H01L 21/823821;
(Continued)

(56) References Cited

U.S. PATENT DOCUMENTS 7,202,131 B2    4/2007  Bang
9,312,188 B2    4/2016  Kim et al.
(Continued)

FOREIGN PATENT DOCUMENTS

JP    2018517331 A    6/2018
KR    20010016838 A    3/2001
(Continued)

OTHER PUBLICATIONS

International Search Report and Written Opinion for PCT/KR2020/016416, mailed Feb. 25, 2021.
(Continued)

*Primary Examiner* — Karen Kusumakar
*Assistant Examiner* — Adam S Bowen
(74) *Attorney, Agent, or Firm* — Klarquist Sparkman, LLP

(57) ABSTRACT

A transistor includes a substrate; a pair of constant current forming regions provided in the substrate; a pair of source/drain regions respectively provided on the pair of constant current forming regions in the substrate; and a gate structure provided between the pair of source/drain regions, wherein any one of the constant current forming regions immediately adjacent to any one of the pair of source/drain regions serving as a drain forms a constant current between the any
(Continued)

one of the pair of source/drain region serving as the drain and the any one of the constant current forming regions.

32 Claims, 45 Drawing Sheets

(30) Foreign Application Priority Data

Jun. 10, 2020 (KR) .................. 10-2020-0070486
Jul. 14, 2020 (KR) .................. 10-2020-0087156

(51) Int. Cl.
*H01L 27/092* (2006.01)
*H01L 29/66* (2006.01)
*H01L 29/78* (2006.01)
*H03K 19/0948* (2006.01)

(52) U.S. Cl.
CPC .. *H01L 21/823821* (2013.01); *H01L 27/0924* (2013.01); *H01L 29/66795* (2013.01); *H01L 29/7851* (2013.01); *H03K 19/0948* (2013.01)

(58) Field of Classification Search
CPC ........... H01L 27/0924; H01L 29/66795; H01L 29/7851; H01L 27/0727; H01L 21/265; H01L 27/092; H01L 29/10; H03K 19/0948

See application file for complete search history.

(56) References Cited

U.S. PATENT DOCUMENTS

| | | | |
|---|---|---|---|
| 10,133,550 B2 | 11/2018 | Kim et al. | |
| 2006/0240622 A1 | 10/2006 | Lee et al. | |
| 2015/0295070 A1* | 10/2015 | Zhu | .................. H01L 29/66795 |
| | | | 257/192 |
| 2018/0337173 A1* | 11/2018 | Tsai | ................. H01L 29/66803 |

FOREIGN PATENT DOCUMENTS

| | | |
|---|---|---|
| KR | 20050070932 A | 7/2005 |
| KR | 20060110702 A | 10/2006 |
| KR | 20140145667 A | 12/2014 |
| KR | 101689159 B1 | 12/2016 |

OTHER PUBLICATIONS

Jeong, J. et al., "Tunnelling-based ternary metal-oxide-semiconductor technology," *Natural Electronics*, 2:307-312 (Jul. 2019).

Kim, K. et al., "Multi-Valued Logic Device Technology; Overview, Status, and Its Future for Peta-Scale Information Density," *Journal of Semiconductor Engineering*, 1(1):57-63 (Jun. 2020).

Notice of Allowance for Korean Patent Application No. 10-2020-0070486, mailed Sep. 28, 2021 (w/English translation).

Notice of Allowance for Korean Patent Application No. 10-2020-0087156, mailed Nov. 25, 2021 (w/English translation).

Office Action for Korean Patent Application No. 10-2020-0070486, mailed May 30, 2021 (w/English translation).

Office Action for Korean Patent Application No. 10-2020-0087156, mailed Aug. 3, 2021 (w/English translation).

* cited by examiner

TRANSISTOR, TERNARY INVERTER INCLUDING SAME, AND TRANSISTOR MANUFACTURING METHOD

CROSS REFERENCE TO RELATED APPLICATIONS

This is the U.S. National Stage of International Application No. PCT/KR2020/016416, filed Nov. 19, 2020, which in turn claims priority to Korean Patent Application No. 10-2019-0149120, filed Nov. 19, 2019, Korean Patent Application No. 10-2019-0149121, filed Nov. 19, 2019, Korean Patent Application No. 10-2020-0070486, filed Jun. 10, 2020, and Korean Patent Application No. 10-2020-0087156, filed Jul. 14, 2020, which applications are incorporated herein in their entireties.

TECHNICAL FIELD

The present invention is funded by the Ministry of Science and ICT for the project No. 1711070269 titled "Graphene Varistor-based Ternary Logic Architecture Research" and a project No. 1711092396 titled "Multi-level Material Design and Application Research".

The present invention is funded by the Ministry of Science and ICT for the project No. 1711093128 titled "Graphene Varistor-based Ternary Logic Architecture Research" and a project No. 1711092396 titled "Multi-level Material Design and Application Research".

The present disclosure relates to a transistor, a ternary inverter, and a transistor manufacturing method.

BACKGROUND ART

Conventional binary logic-based digital systems have focused on increasing the bit density of information through scaling of CMOS devices in order to quickly process large amounts of data. However, as technology node is recently reduced to below 30-nm, there has been a limitation in increasing the bit density due to the increase in a leakage current and power consumption due to a quantum tunneling effect. In order to overcome the bit density limitation, ternary logic elements and circuits, which are one of multi-valued logics, is significantly spotlighted. In particular, standard ternary inverters (STI) are being actively developed as a basic unit for implementing ternary logic. However, unlike a conventional binary inverter that uses two CMOS for one voltage source, conventional techniques related to STI require more voltage sources or a complex circuit configuration.

DESCRIPTION OF EMBODIMENTS

Technical Problem

The present disclosure provides a transistor having a constant current.

The present disclosure provides a ternary inverter having a constant current.

The present disclosure provides a method of manufacturing a transistor having a constant current.

The present disclosure provides a method of manufacturing a transistor having a constant current independent of a gate voltage.

The present disclosure provides a method for manufacturing a ternary inverter having a constant current independent of an input voltage and having three states.

However, technical problems problem to be solved are not limited to those stated above.

Solution to Problem

According to an aspect, a transistor includes a substrate; a pair of constant current forming regions provided in the substrate; a pair of source/drain regions respectively provided on the pair of constant current forming regions in the substrate; and a gate structure provided between the pair of source/drain regions, wherein any one of the constant current forming regions immediately adjacent to any one of the pair of source/drain regions serving as a drain forms a constant current between the any one of the pair of source/drain region serving as the drain and the any one of the constant current forming regions.

The gate structure may include a gate electrode; and a gate insulation layer provided between the gate electrode and the substrate, wherein the constant current may be independent of a gate voltage applied to the gate electrode.

The pair of constant current forming regions may overlap the pair of source/drain regions in a direction perpendicular to a top surface of the substrate.

The pair of constant current forming regions may be in contact with bottom surfaces of the pair of source/drain regions.

The substrate and the pair of constant current forming regions may have a first conductivity type, the pair of source/drain regions may have a second conductivity type different from the first conductivity type, and a doping concentration of the pair of constant current forming regions may be higher than a doping concentration of the substrate.

The doping concentration of the pair of constant current forming regions may be $3 \times 10^{18}$ cm$^{-3}$ or higher.

An electric field of at least $10^6$ V/cm may be formed between the any one of the pair of source/drain regions and the any one of the pair of constant current forming regions.

The transistor may further include a support substrate provided on a opposite side of the gate structure with respect to the substrate, wherein the substrate may protrude from a top surface of the support substrate in a direction perpendicular to the top surface of the support substrate, and the gate structure may cover both side surfaces and the top surface of the substrate.

The gate structure may extend in a first direction parallel to the top surface of the support substrate, and the substrate may extend in a second direction parallel to the top surface of the support substrate and intersecting the first direction.

The transistor may further include a pair of lower insulation layers provided between the support substrate and the gate structure on both side surfaces of the substrate.

The pair of source/drain regions may be exposed on the lower insulation layer.

According to another aspect, a ternary inverter includes an NMOS transistor and a PMOS transistor, wherein the NMOS transistor and the PMOS transistor each includes a substrate, a pair of constant current forming regions provided in the substrate, and a source pattern and a drain region respectively provided on the pair of constant current forming regions, any one of the pair of constant current forming regions immediately adjacent to the drain region forms a constant current between the drain region and the any one of the pair of constant current forming regions, and the drain region of the NMOS transistor and the drain region of the PMOS transistor are electrically connected to each other and have the same voltage as each other.

The NMOS transistor and the PMOS transistor may each include a gate electrode provided on the substrate; and a gate insulation layer provided between the gate electrode and the top surface of the substrate, and the constant current may be independent of a gate voltage applied to the gate electrode.

In each of the NMOS transistor and the PMOS transistor, the substrate and the pair of constant current forming regions may have the same conductivity type, and a doping concentration of each of the pair of constant current forming regions may be higher than the doping concentration of the substrate.

In each of the NMOS transistor and the PMOS transistor, the doping concentration of each of the pair of constant current forming regions may be $3 \times 10^{18}$ cm$^{-3}$ or higher.

According to an aspect, a method of manufacturing a transistor, the method includes forming a gate structure on a substrate; forming a pair of etching regions on the substrate; forming a pair of constant current forming regions in the pair of etched regions, respectively; and forming a pair of source/drain regions on the pair of constant current forming regions, respectively, wherein the pair of etching regions are spaced apart from each other across the gate structure therebetween, and any one of the constant current forming regions immediately adjacent to any one of the pair of source/drain regions serving as a drain forms a constant current between the any one of the pair of source/drain region serving as the drain and the any one of the constant current forming regions.

The substrate and the pair of constant current forming regions may have a first conductivity type, the pair of source/drain regions may have a second conductivity type different from the first conductivity type, and a doping concentration of the pair of constant current forming regions may be higher than a doping concentration of the substrate.

The doping concentration of the pair of constant current forming regions may be $3 \times 10^{18}$ cm$^{-3}$ or higher.

The pair of constant current forming regions may be formed through an epitaxy growth process.

The method may further include forming the substrate protruding from a top surface of a supporting substrate in a direction perpendicular to a top surface of the supporting substrate on a supporting substrate; and forming a pair of lower insulation layers between the support substrate and the gate structure on both side surfaces of the substrate, wherein the gate structure may extend in a first direction parallel to the top surface of the support substrate and cover both side surfaces and the top surface of the substrate, and the substrate may extend in a second direction parallel to the top surface of the support substrate and intersecting the first direction.

According to an aspect, a method of manufacturing a transistor, the method includes forming a fin structure extending in a first direction on a substrate; forming a gate structure extending in a second direction intersecting the first direction on the fin structure; and forming a source region and a drain region in the fin structure, wherein the fin structure includes a constant current forming fin and a channel layer sequentially stacked on the substrate, the source region and the drain region are formed on the channel layer and are spaced apart from each other across the gate electrode therebetween, and the constant current forming fin forms a constant current between the drain region and the substrate and is formed through an epitaxial growth process.

The forming of the fin structure may include forming a preliminary constant current forming layer on the substrate; forming the constant current forming fin by patterning the preliminary constant current forming layer; and forming the channel layer on the constant current forming fin.

The preliminary constant current forming layer and the channel layer may be formed through an epitaxial growth process.

The forming of the fin structure may include forming a preliminary constant current forming layer on the substrate; forming a preliminary channel layer on the preliminary constant current forming layer; and patterning the preliminary channel layer and the preliminary constant current forming layer.

The preliminary constant current forming layer and the preliminary channel layer may be formed through an epitaxial growth process.

The substrate and the constant current forming fin may have a first conductivity type, and the doping concentration of the constant current forming fin may be $3 \times 10^{18}$ cm$^{-3}$ or higher.

An electric field may be formed between the drain region and the constant current forming fin, and the intensity of the electric field may be $10^6$ V/cm or higher.

The method may further include forming a lower insulation layer on side surfaces of the constant current forming fin, wherein a top surface of the lower insulation layer may be disposed at a position identical to or higher than a top surface of the constant current forming fin.

According to an aspect, a method of manufacturing a ternary inverter, the method includes forming a first well region and a second well region different from each other in a substrate; forming a first fin structure and a second fin structure extending in a first direction on the first well region and the second well region, respectively; forming a gate structure extending in a second direction intersecting the first direction on the first fin structure and the second fin structure; and forming a source region and a drain region spaced apart from each other across the gate structure therebetween in each of the first fin structure and the second fin structure, wherein the first fin structure and the second fin structure include a first constant current forming fin and a second constant current forming fin, respectively, the first constant current forming fin forms a constant current between the drain region and the first well region of the first fin structure and is formed through an epitaxial growth process, and the second constant current forming fin forms a constant current between the drain region and the second well region of the second fin structure and is formed through an epitaxial growth process.

The first fin structure may further include a first channel layer formed on the first constant current forming fin, the second fin structure may further include a second channel layer formed on the second constant current forming fin, and the forming of the first fin structure and the second fin structure may include forming a preliminary constant current forming layer on the substrate; forming the first constant current forming fin and the second constant current forming fin by patterning the preliminary constant current forming layer; and forming the first channel layer and the second channel layer on the first constant current forming fin and the second constant current forming fin, respectively.

The preliminary constant current forming layer, the first channel layer, and the second channel layer may be formed through an epitaxial growth process.

The first fin structure may further include a first channel layer formed on the first constant current forming fin, the second fin structure may further include a second channel layer formed on the second constant current forming fin, and the forming of the first fin structure and the second fin structure may include forming a preliminary constant current forming layer on the substrate; forming a preliminary channel layer on the preliminary constant current forming layer; and patterning the preliminary channel layer and the preliminary constant current forming layer.

The preliminary constant current forming layer and the preliminary channel layer may be formed through an epitaxial growth process.

The first well region and the first constant current forming fin may have a first conductivity type, the second well region and the second constant current forming fin may have a second conductivity type different from the first conductivity type, and the doping concentration of each of the first constant current forming fin and the second constant current forming fin may be $3 \times 10^{18}$ cm$^{-3}$ or higher.

An electric field of at least $10^6$ V/cm may be formed between the drain region of the first fin structure and the first constant current forming fin, and an electric field of at least $10^6$ V/cm may be formed between the drain region of the second fin structure and the second constant current forming fin.

The method may further include forming a lower insulation layer on side surfaces of the first constant current forming fin and side surfaces of the second constant current forming fin, wherein a top surface of the lower insulation layer may be disposed at a position equal to or higher than those of a top surface of the first constant current forming fin and a top surface of the second constant current forming fin.

The drain region of the first fin structure and the drain region of the second fin structure may be electrically connected to each other and have the same voltage.

According to an aspect, a method of manufacturing a transistor, the method includes forming a constant current forming layer on a substrate; forming a channel layer on the constant current forming layer; forming a gate electrode on the channel layer; and forming a source region and a drain region in the channel layer, wherein the source region and the drain region are spaced apart from each other across the gate electrode therebetween, and the constant current forming layer forms a constant current between the drain region and the substrate and is formed through an epitaxial growth process.

The substrate and the constant current forming layer may have the same conductivity type. and the doping concentration of the constant current forming layer may be $3 \times 10^{18}$ cm$^{-3}$ or higher.

An electric field may be formed between the drain region and the constant current forming layer, and the intensity of the electric field may be $10^6$ V/cm or higher.

Advantageous Effects of Disclosure

The present disclosure may provide a transistor having a constant current.

The present disclosure may provide a ternary inverter having a constant current.

The present disclosure may provide a method of manufacturing a transistor having a constant current.

The present disclosure may provide a method of manufacturing a transistor having a constant current independent of a gate voltage.

The present disclosure may provide a method for manufacturing a ternary inverter having a constant current independent of an input voltage and having three states.

However, the effects are not limited to those stated above.

BEST MODE

Figure 1:
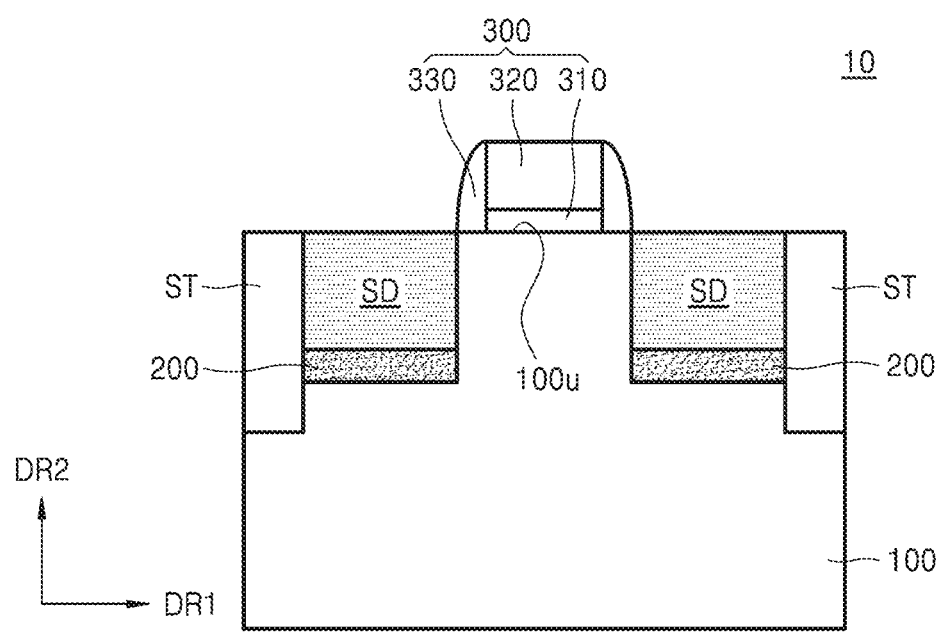
FIG. 1 is a cross-sectional view of a transistor according to example embodiments.

According to an aspect, a transistor includes a substrate; a pair of constant current forming regions provided in the substrate; a pair of source/drain regions respectively provided on the pair of constant current forming regions in the substrate; and a gate structure provided between the pair of source/drain regions, wherein any one of the constant current forming regions immediately adjacent to any one of the pair of source/drain regions serving as a drain forms a constant current between the any one of the pair of source/drain region serving as the drain and the any one of the constant current forming regions.

According to another aspect, a ternary inverter includes an NMOS transistor and a PMOS transistor, wherein the NMOS transistor and the PMOS transistor each includes a substrate, a pair of constant current forming regions provided in the substrate, and a source pattern and a drain region respectively provided on the pair of constant current forming regions, any one of the pair of constant current forming regions immediately adjacent to the drain region forms a constant current between the drain region and the any one of the pair of constant current forming regions, and the drain region of the NMOS transistor and the drain region of the PMOS transistor are electrically connected to each other and have the same voltage as each other.

According to an aspect, a method of manufacturing a transistor, the method includes forming a gate structure on a substrate; forming a pair of etching regions on the substrate; forming a pair of constant current forming regions in the pair of etched regions, respectively; and forming a pair of source/drain regions on the pair of constant current forming regions, respectively, wherein the pair of etching regions are spaced apart from each other across the gate structure therebetween, and any one of the constant current forming regions immediately adjacent to any one of the pair of source/drain regions serving as a drain forms a constant current between the any one of the pair of source/drain region serving as the drain and the any one of the constant current forming regions.

According to an aspect, a method of manufacturing a transistor, the method includes forming a fin structure extending in a first direction on a substrate; forming a gate structure extending in a second direction intersecting the first direction on the fin structure; and forming a source region and a drain region in the fin structure, wherein the fin structure includes a constant current forming fin and a channel layer sequentially stacked on the substrate, the source region and the drain region are formed on the channel layer and are spaced apart from each other across the gate electrode therebetween, and the constant current forming fin forms a constant current between the drain region and the substrate and is formed through an epitaxial growth process.

According to an aspect, a method of manufacturing a ternary inverter. the method includes forming a first well region and a second well region different from each other in a substrate; forming a first fin structure and a second fin structure extending in a first direction on the first well region and the second well region, respectively; forming a gate structure extending in a second direction intersecting the first direction on the first fin structure and the second fin structure; and forming a source region and a drain region spaced apart from each other across the gate structure therebetween in each of the first fin structure and the second fin structure, wherein the first fin structure and the second fin structure include a first constant current forming fin and a second constant current forming fin, respectively, the first constant current forming fin forms a constant current between the drain region and the first well region of the first fin structure and is formed through an epitaxial growth process, and the second constant current forming fin forms a constant current between the drain region and the second well region of the second fin structure and is formed through an epitaxial growth process.

According to an aspect, a method of manufacturing a transistor, the method includes forming a constant current forming layer on a substrate; forming a channel layer on the constant current forming layer; forming a gate electrode on the channel layer; and forming a source region and a drain region in the channel layer, wherein the source region and the drain region are spaced apart from each other across the gate electrode therebetween, and the constant current forming layer forms a constant current between the drain region and the substrate and is formed through an epitaxial growth process.

MODE OF DISCLOSURE

Hereinafter, example embodiments will be described in detail with reference to the accompanying drawings. In the drawings, like reference numerals denote like elements, and the size of each component in the drawings may be exaggerated for clarity and convenience of explanation. Meanwhile, the embodiments described below are merely examples, and various modifications are possible from these embodiments.

It will be understood that when a layer, region, or component is referred to as being "formed on" another layer, region, or component, it can be directly or indirectly formed on the other layer, region, or component.

An expression used in the singular encompasses the expression of the plural, unless it has a clearly different meaning in the context. In addition, unless explicitly described to the contrary, the word "comprise" and variations such as "comprises" or "comprising" will be understood to imply the inclusion of stated elements but not the exclusion of any other elements.

In addition, the terms "-er", "-or", and "module" described in the specification mean units for processing at least one function and operation and can be implemented by hardware components or software components and combinations thereof.

FIG. 1 is a cross-sectional view of a transistor according to example embodiments.

Referring to FIG. 1, a transistor 10 may be provided. The transistor 10 may include a substrate 100, a pair of device isolation regions ST, a pair of source/drain regions SD, a pair of constant current forming regions 200, and a gate structure 300.

The substrate 100 may be a semiconductor substrate. For example, the substrate 100 may include silicon (Si). The substrate 100 may have a first conductivity type. For example, the first conductivity type may be n-type or p-type. When the conductivity type of the substrate 100 is n-type, the substrate 100 may include a group V element (e.g., P or As) as an impurity. Men the conductivity type of the substrate 100 is p-type, the substrate 100 may include a group III element (e.g., B or In) as an impurity.

The pair of device isolation regions ST may be provided on the substrate 100. The pair of device isolation regions ST may be spaced apart from each other in a first direction DR1 parallel to a top surface 100u of the substrate 100. The pair of device isolation regions ST may extend in a second direction DR2 perpendicular to the top surface 100u of the substrate 100. The pair of device isolation regions ST may include an electrically insulating material. For example, the pair of device isolation regions ST may include $SiO_2$ or a high-k material (e.g., SiON, $HfO_2$, or $ZrO_2$).

The pair of source/drain regions SD may be provided on the substrate 100. The pair of source/drain regions SD may be spaced apart from each other in the first direction DR1. One of the pair of source/drain regions SD may be a source of the transistor 10. The other one of the pair of source/drain regions SD may be a drain of the transistor 10. The pair of source/drain regions SD may have a second conductivity type different from the first conductivity type. When the conductivity type of the pair of source/drain regions SD is p-type, the pair of source/drain regions SD may include a group III element (e.g., B or In) as an impurity. When the conductivity type of the pair of source/drain regions SD is n-type, the pair of source/drain regions SD may include a group V element (e.g., P or As) as an impurity.

The pair of constant current forming regions 200 may be provided under the pair of source/drain regions SD, respectively. The pair of constant current forming regions 200 may respectively overlap the pair of source/drain regions SD in the second direction DR2. The pair of constant current forming regions 200 may be electrically connected to the pair of source/drain regions SD. For example, the pair of constant current forming regions 200 may directly contact the pair of source/drain regions SD. The pair of constant current forming regions 200 may be spaced apart from each other in the first direction DR1. The pair of constant current forming regions 200 may have the first conductivity type. When the conductivity type of the pair of constant current forming regions 200 is n-type, the pair of constant current forming regions 200 may include a group V element (e.g., P or As) as an impurity. When the conductivity type of the pair of constant current forming regions 200 is p-type, the pair of constant current forming regions 200 may include a group III element (e.g., B or In) as an impurity. The doping concentration of the pair of constant current forming regions 200 may be higher than that of the substrate 100. For example, the doping concentration of the pair of constant current forming regions 200 may be $3 \times 10^{18}$ $cm^{-3}$ or higher. An electric field may be formed between the pair of constant current forming regions 200 and the pair of source/drain regions SD. For example, the intensity of the electric field may be $10^6$ V/cm or higher.

The gate structure 300 may be provided on the substrate 100. The gate structure 300 may include a gate insulation layer 310, a gate electrode 320, and a pair of spacers 330. The gate electrode 320 may include an electrically conductive material. For example, the gate electrode 320 may include a doped semiconductor material, a metal, an alloy, or a combination thereof. For example, the gate electrode 320 may include doped polysilicon, tungsten (W), titanium nitride (TiN), or a combination thereof.

The gate insulation layer 310 may be provided between the gate electrode 320 and the substrate 100. The gate insulation layer 310 may electrically insulate the gate electrode 320 and the substrate 100 from each other. The gate insulation layer 310 may include an electrically insulating material. For example, the gate insulation layer 310 may include at least one material selected from among silicon oxide, silicon nitride, silicon oxynitride, oxide/nitride/oxide (ONO), and a high-k material. For example, the gate insulation layer 310 may include a material having a dielectric constant from about 10 to about 25. For example, the gate insulation layer 310 may include at least one material selected from among hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

The pair of spacers 330 may be provided on both sidewalls of the gate electrode 320, respectively. The pair of spacers 330 may extend onto the both sidewalls of the gate insulation layer 310, respectively. The pair of spacers 330 may include an electrically insulating material. For example, the pair of spacers 330 may include $SiO_2$ or a high-k material (e.g., SiON, $HfO_2$, or $ZrO_2$).

In an embodiment, the threshold voltage of the transistor 10 may be adjusted by a doping concentration of the substrate 100 and/or a work function of the gate electrode 320. For example, the work function of the gate electrode 320 may be controlled by the material constituting the gate electrode 320 or by an additional work function control layer (not shown). For example, the additional work function control layer may be disposed between the gate insulation layer 310 and the substrate 100.

Any one of the pair of constant current forming regions 200 immediately adjacent to any one of the pair of source/drain regions SD serving as the drain may form a constant current between a source/drain region SD serving as the drain and a constant current forming region 200 immediately adjacent thereto. The constant current may be a band-to-band tunneling (BTBT) current between the source/drain region SD serving as the drain and the constant current forming region 200 immediately adjacent thereto. The constant current may be independent from a gate voltage applied to the gate electrode 320. In other words, the constant current may flow regardless of the gate voltage. When the transistor 10 is an NMOS transistor, a constant current may flow to the substrate 100 from the source/drain region SD serving as the drain through the constant current forming region 200 immediately adjacent thereto. When the transistor 10 is a PMOS transistor, a constant current may flow from the substrate 100 to the source/drain region SD serving as the drain through the constant current forming region 200 immediately adjacent to the source/drain region SD serving as the drain.

The present disclosure may provide the transistor 10 in which a constant current is formed between any one of the pair of source/drain regions SD serving as the drain and the constant current forming region 200 immediately adjacent thereto.

Figure 2:
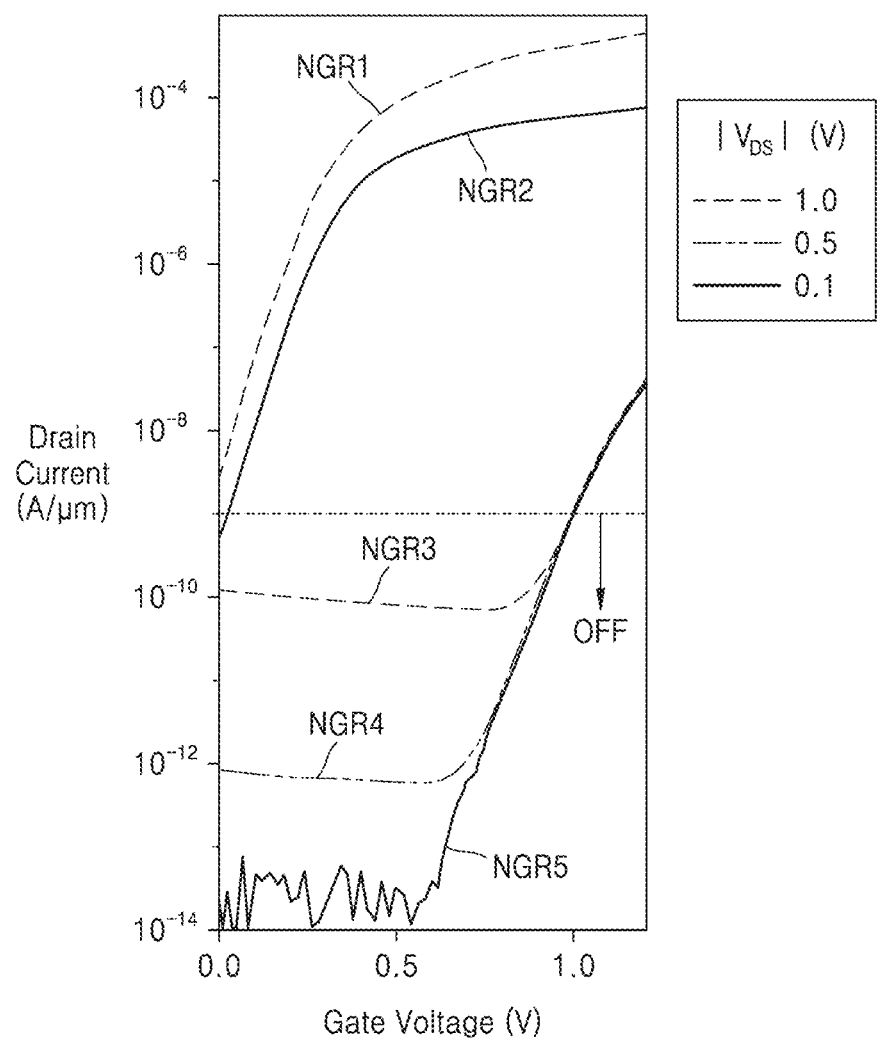
FIG. 2 shows gate voltage-drain current graphs of NMOS transistors according to the present disclosure and conventional NMOS transistors.

FIG. 2 shows gate voltage-drain current graphs of NMOS transistors according to the present disclosure and conventional NMOS transistors.

Referring to FIG. 2, gate voltage-drain current graphs NGR1 and NGR2 of conventional NMOS transistors and gate voltage-drain current graphs NGR3, NGR4, and NGR5 of NMOS transistors according to the present disclosure are shown.

Drain currents of the conventional NMOS transistors do not have a constant current component that flows regardless of a gate voltage.

Drain currents of the NMOS transistors of the present disclosure have a constant current component that flows regardless of a gate voltage. For example, even when the NMOS transistors of the present disclosure are in an OFF state, a constant current flows through the NMOS transistors of the present disclosure.

Figure 3:
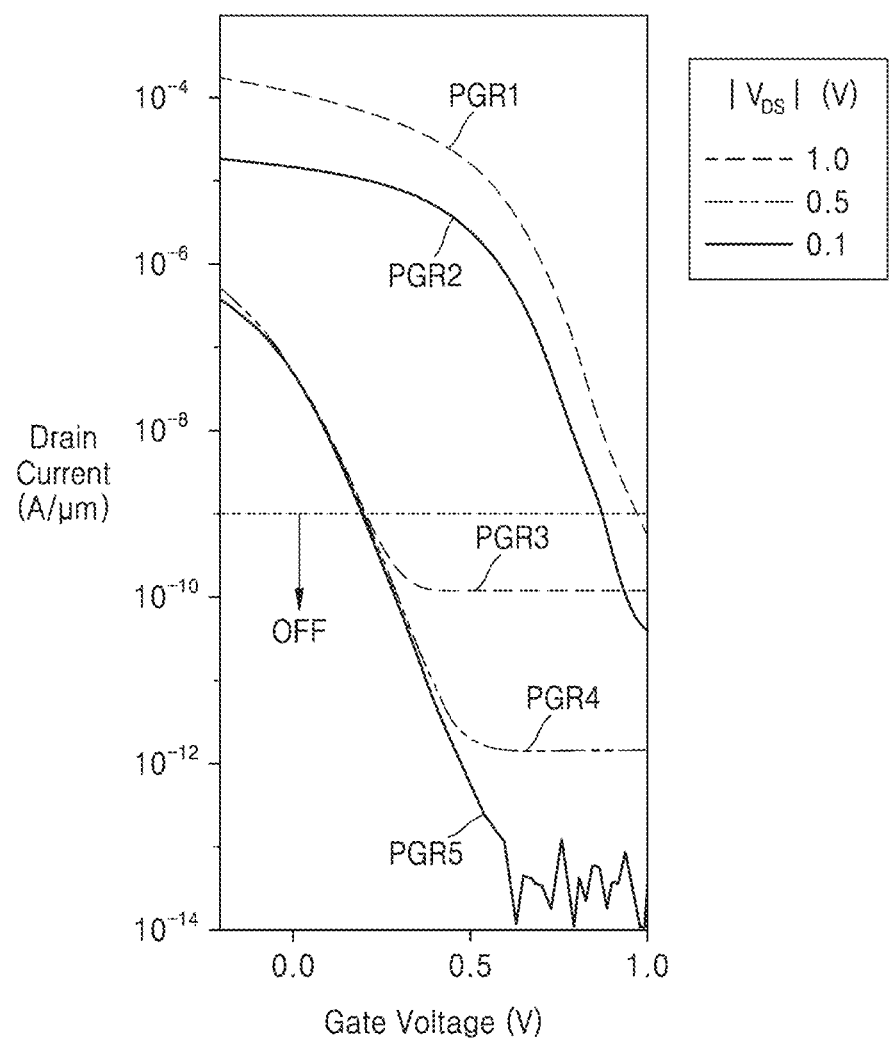
FIG. 3 shows gate voltage-drain current graphs of PMOS transistors according to the present disclosure and conventional PMOS transistors.

FIG. 3 shows gate voltage-drain current graphs of PMOS transistors according to the present disclosure and conventional PMOS transistors.

Referring to FIG. 3, gate voltage-drain current graphs PGR1 and PGR2 of conventional PMOS transistors and gate voltage-drain current graphs PGR3, PGR4, and PGR5 of PMOS transistors of the present disclosure are shown.

Drain currents of the conventional PMOS transistors do not have a constant current component that flows regardless of a gate voltage.

Drain currents of the PMOS transistors of the present disclosure have a constant current component that flows regardless of a gate voltage. For example, even when the PMOS transistors of the present disclosure are in an OFF state, a constant current flows through the PMOS transistors of the present disclosure.

Figure 4:
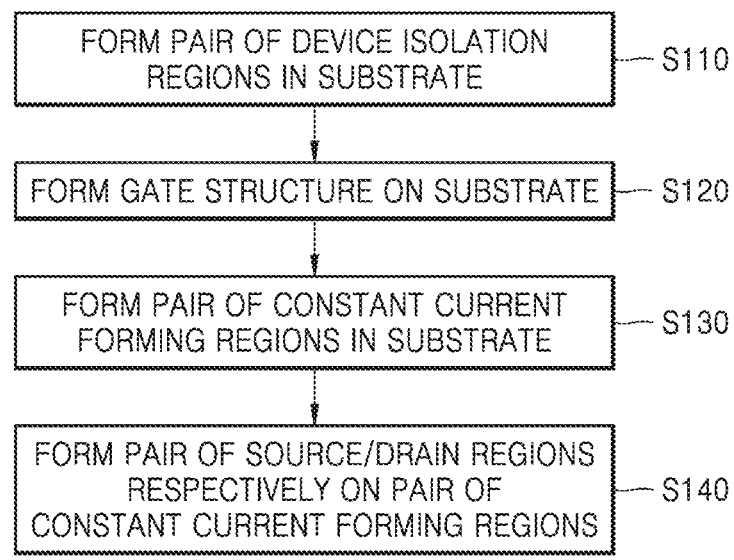
FIG. 4 is a flowchart of a method of manufacturing the transistor of FIG. 1 according to an example embodiment.
Figure 5:
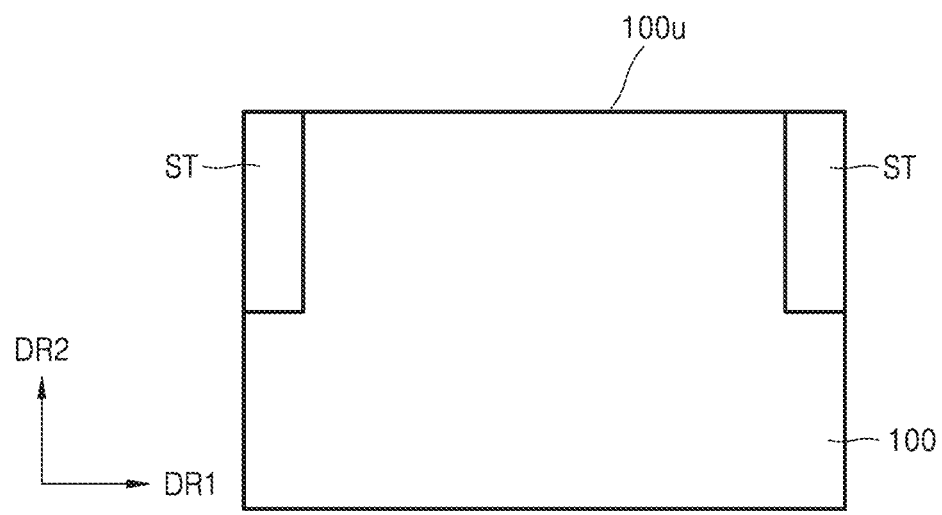
FIGS. 5 to 7 are cross-sectional views for describing the method of manufacturing a transistor of FIG. 4.
Figure 6:
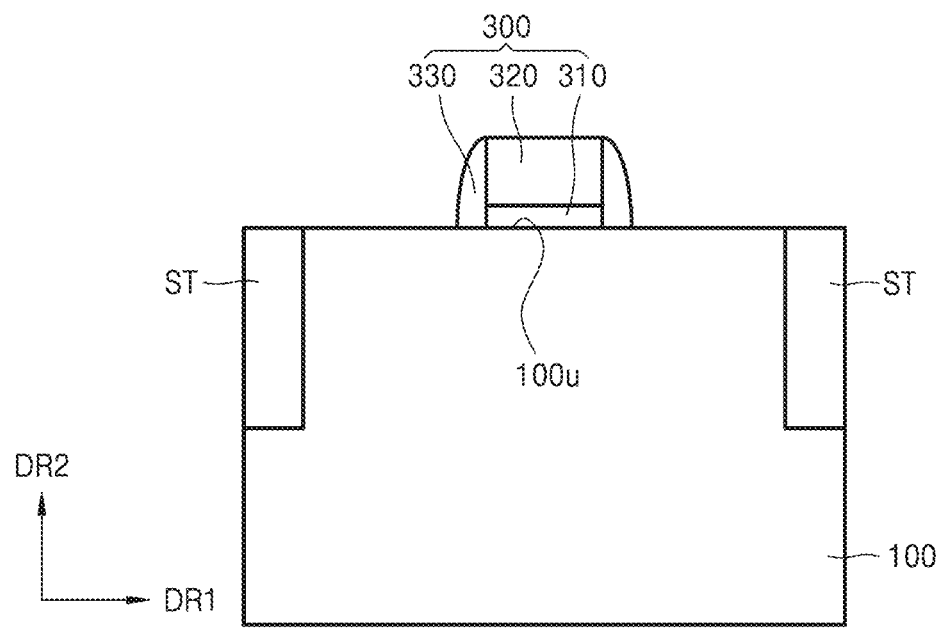
Figure 7:
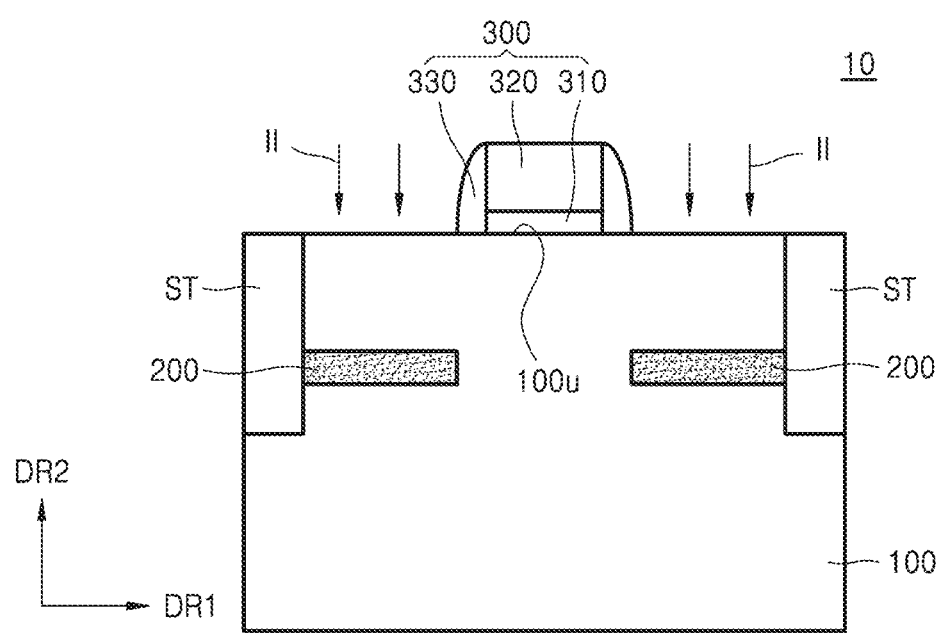

FIG. 4 is a flowchart of a method of manufacturing the transistor of FIG. 1 according to an example embodiment. FIGS. 5 to 7 are cross-sectional views for describing the method of manufacturing a transistor of FIG. 4.

Referring to FIGS. 4 and 5, the pair of device isolation regions ST may be formed on the substrate 100 (operation S110). The substrate 100 may be a semiconductor substrate. For example, the substrate 100 may include silicon (Si). The substrate 100 may have a first conductivity type. For example, the first conductivity type may be n-type or p-type. When the conductivity type of the substrate 100 is n-type, the substrate 100 may include a group V element (e.g., P or As) as an impurity. When the conductivity type of the substrate 100 is p-type, the substrate 100 may include a group III element (e.g., B or In) as an impurity.

The pair of device isolation regions ST may be formed in the substrate 100. A process of forming the pair of device isolation regions ST may include recessing the substrate 100 to a partial depth and filling a recessed region with an electrically insulating material. For example, the substrate 100 may recessed by performing an anisotropic etching process on the substrate 100. For example, the electrically insulating material may be provided to a pair of recessed regions through a chemical vapor deposition process or a physical vapor deposition process. For example, the electrically insulating material may include $SiO_2$ or a high-k material (e.g., SiON, $HfO_2$, or $ZrO_2$).

Referring to FIGS. 4 and 6, the gate structure 300 may be formed on the substrate 100 (operation S120). The gate structure 300 may include the gate insulation layer 310 and the gate electrode 320 that are sequentially stacked and may include the pair of spacers 330 covering side surfaces of the gate insulation layer 310 and the gate electrode 320. A process of forming the gate insulation layer 310 and the gate electrode 320 may include sequentially depositing an electrically insulating film and an electrically conductive film on the substrate 100 and patterning the electrically conductive film and the electrically insulating film. For example, the electrically insulating film may include at least one material selected from among silicon oxide, silicon nitride, silicon oxynitride, oxide/nitride/oxide (ONO), and a high-k material. For example, the electrically insulating film may include a material having a dielectric constant from about 10 to about 25. For example, the electrically insulating film may include at least one material selected from among hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the electrically conductive film may include a doped semiconductor material, a metal, an alloy, or a combination thereof. For example, the electrically conductive film may include doped polysilicon, tungsten (W), titanium nitride (TiN), or a combination thereof.

A process of forming the pair of spacers 330 may include forming an electrically insulating film extending along surfaces of the pair of device isolation regions ST, the substrate 100, the gate insulation layer 310, and the gate electrode 320 and performing a large-area anisotropic etching process to remove a portion of the electrically insulating film. After an etching process is finished, the gate insulation layer 310 and the electrically insulating film on the side surfaces of the gate electrode 320 may remain. For example, the electrically insulating film may include $SnO_2$ or a high-k material (e.g., SiON, $HfO_2$, or $ZrO_2$).

Referring to FIGS. 4 and 7, the pair of constant current forming regions 200 may be formed on the substrate 100 (operation S130). A process of forming the pair of constant current forming regions 200 may include performing an ion implantation process II. The pair of constant current forming regions 200 may have the same conductivity type as that of the substrate 100. When the conductivity type of the substrate 100 is n-type, a group V element (e.g., P or As) may be further implanted into the substrate 100 to form a pair of n-type constant current forming regions 200. When the conductivity type of the substrate 100 is p-type, a group III element (e.g., B or In) may be further implanted into the substrate 100 to form a pair of p-type constant current forming regions 200. The doping concentration of the pair of constant current forming regions 200 may be higher than that of the substrate 100. For example, the doping concentration of the pair of constant current forming regions 200 may be $3 \times 10^{18}$ $cm^{-3}$ or higher.

Referring to FIGS. 4 and 1, the pair of source/drain regions SD may be respectively formed on the pair of constant current forming regions 200 (operation S140). A process of forming the pair of source/drain regions SD may include performing a process of doping a portion of the substrate 100 between a spacer 330 and a device isolation region ST immediately adjacent to each other. For example, a doping process may include an ion implantation process. The pair of source/drain regions SD may have a conductivity type different from that of the pair of constant current forming regions 200. When the conductivity type of the substrate 100 is n-type, a group III element (e.g., B or In) may be implanted into a portion of the substrate 100 between the spacer 330 and the device isolation region ST immediately adjacent to each other, thereby forming a p-type source/drain region SD. When the conductivity type of the substrate 100 is p-type, a group V element (e.g., P or As) may be implanted into a portion of the substrate 100 between the spacer 330 and the device isolation region ST immediately adjacent to each other, thereby forming an n-type source/drain region SD. The pair of source/drain regions SD may be formed to overlap the pair of constant current forming regions 200 in the second direction DR2. The pair of source/drain regions SD may be electrically connected to the pair of constant current forming regions 200. For example, the pair of source/drain regions SD may directly contact the pair of constant current forming regions 200.

After the pair of constant current forming regions 200 and the pair of source/drain regions SD are formed, the substrate 100 may be heat-treated. The thermal budget of a heat treatment process may affect the threshold voltage characteristics and the constant current of the transistor 10. For example, when the thermal budget is larger than demanded, impurities implanted into the upper portion of the substrate 100 may diffuse into a channel and change the threshold voltage. For example, when the thermal budget is larger than demanded, the doping concentration between the pair of source/drain regions SD and the pair of constant current forming regions 200 may be gently changed, and thus the magnitude of the constant current may be reduced. When a heat treatment process is performed, the thermal budget may be adjusted to prevent or minimize the threshold voltage characteristic of the transistor 10 from being changed. The thermal budget may be adjusted, such that the transistor 10 has a demanded constant current.

The present disclosure may provide a method of manufacturing the transistor 10 in which a constant current flows between any one of the pair of source/drain regions SD serving as the drain and the constant current forming region 200 immediately adjacent thereto.

Figure 8:
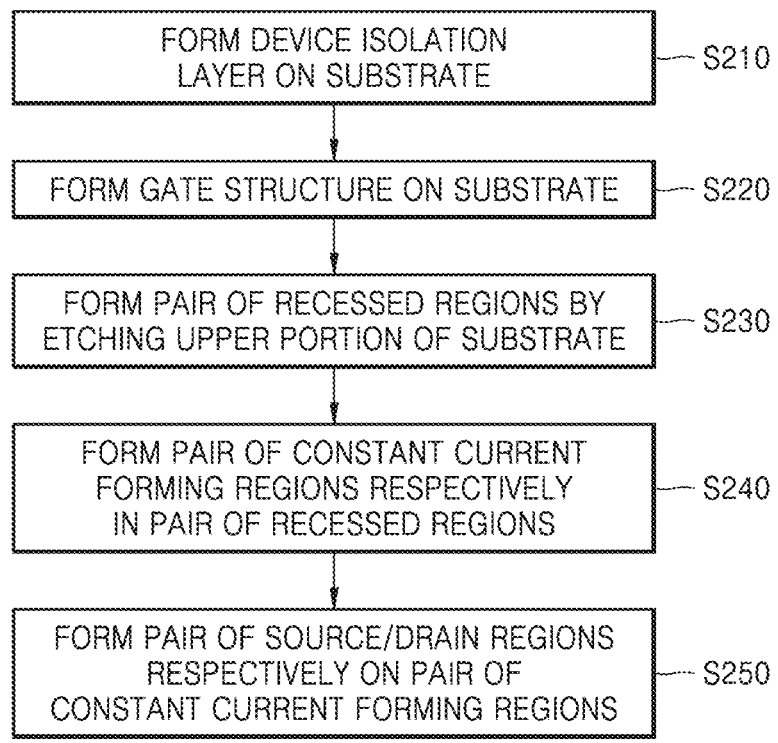
FIG. 8 is a flowchart of a method of manufacturing the transistor of FIG. 1 according to an example embodiment.
Figure 9:
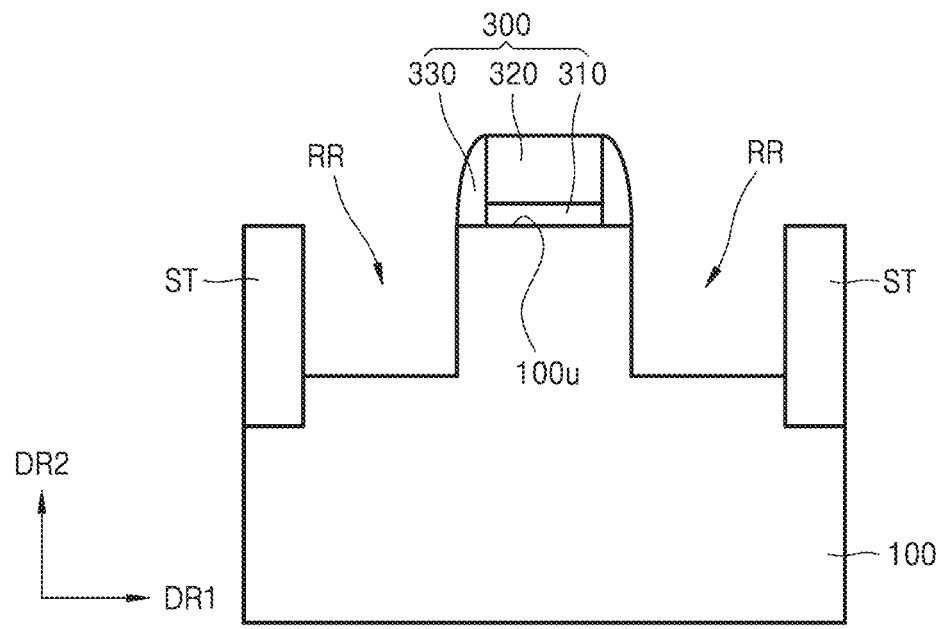
FIGS. 9 and 10 are cross-sectional views for describing the method of manufacturing a transistor of FIG. 8.
Figure 10:
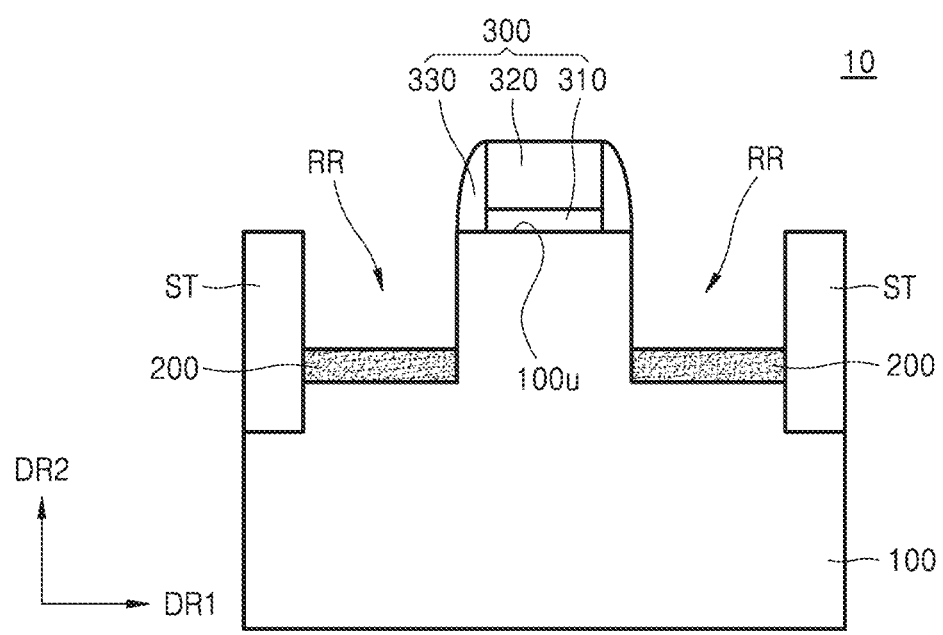

FIG. 8 is a flowchart of a method of manufacturing the transistor 10 of FIG. 1 according to an example embodiment. FIGS. 9 and 10 are cross-sectional views for describing the method of manufacturing a transistor of FIG. 8. For brevity of description, descriptions substantially identical to those given above with reference to FIGS. 4 to 7 may not be given.

Referring to FIGS. 8 and 5, the pair of device regions ST may be formed on the substrate 100 (operation S210). A process of forming the pair of device regions ST on the substrate 100 may be substantially identical to that described with reference to FIGS. 4 and 5.

Referring to FIGS. 8 and 6, the gate structure 300 may be formed on the substrate 100 (operation S220). A process of forming the gate structure 300 on the substrate 100 may be substantially identical to that described with reference to FIGS. 4 and 6.

Referring to FIGS. 8 and 9, the upper portion of the substrate 100 may be etched to form a pair of recessed regions RR (operation S230). A process of forming the pair of recessed regions RR may include performing an anisotropic etching process on the substrate 100 by using an etching mask provided on the substrate 100. The pair of recessed regions RR may be spaced apart from each other across the gate structure 300 therebetween. The etching mask may be removed during or after an etching process.

Referring to FIGS. 8 and 10, the pair of constant current forming regions 200 may be respectively formed in the pair of recessed regions RR (operation S240). In an embodiment, the pair of constant current forming regions 200 may be formed through an epitaxy growth process. For example, the pair of constant current forming regions 200 may include silicon (Si). The pair of constant current forming regions 200 may have the first conductivity type. When the conductivity type of the pair of constant current forming regions 200 is n-type, the pair of constant current forming regions 200 may include a group V element (e.g., P or As) as an impurity. When the conductivity type of the pair of constant current forming regions 200 is p-type, the pair of constant current forming regions 200 may include a group III element (e.g., B or In) as an impurity. The doping concentration of the pair of constant current forming regions 200 may be higher than that of the substrate 100. For example, the doping concentration of the pair of constant current forming regions 200 may be $3 \times 10^{18}$ cm$^{-3}$ or higher.

Referring to FIGS. 8 and 1, the pair of source/drain regions SD may be respectively formed on the pair of constant current forming regions 200 (operation S250). In an embodiment, the pair of source/drain regions SD may be formed through an epitaxial growth process. For example, the pair of source/drain regions SD may include silicon (Si). The pair of source/drain regions SD may have the second conductivity type. When the conductivity type of the pair of source/drain regions SD is n-type, the pair of constant current forming regions 200 may include a group V element (e.g., P or As) as an impurity. When the conductivity type of the pair of constant current forming regions 200 is p-type, the pair of constant current forming regions 200 may include a group III element (e.g., B or In) as an impurity.

The present disclosure may provide a method of manufacturing the transistor 10 in which a constant current flows between any one of the pair of source/drain regions SD serving as the drain and the constant current forming region 200 immediately adjacent thereto.

Figure 11:
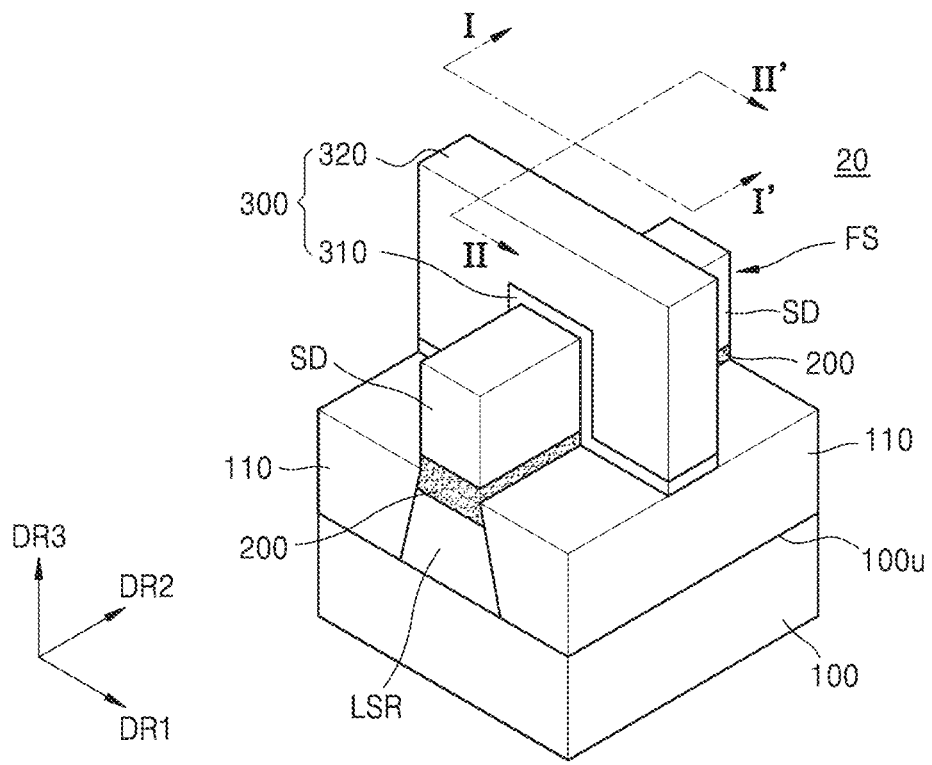
FIG. 11 is a perspective view of a transistor according to an example embodiment.
Figure 12:
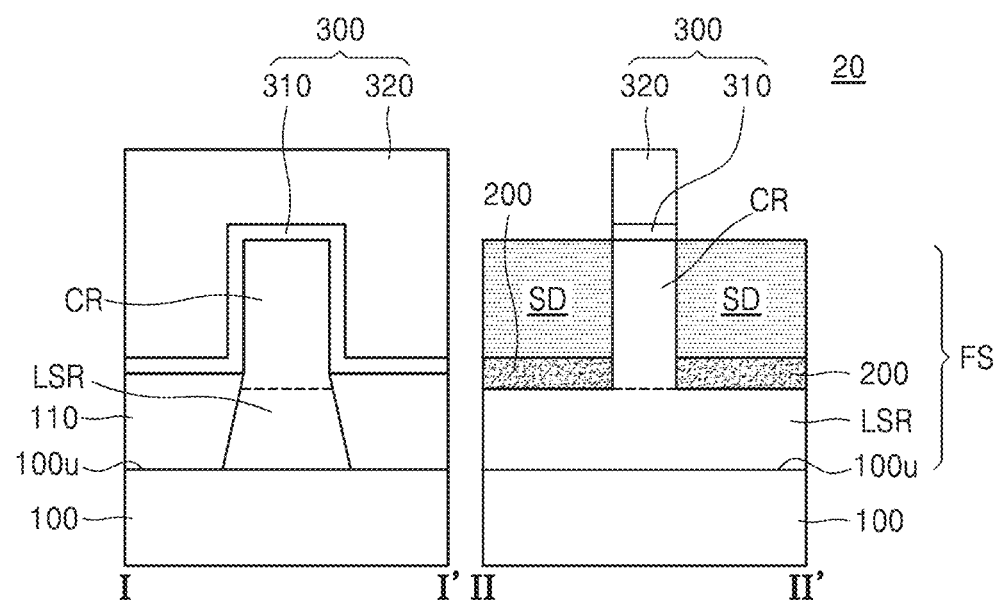
FIG. 12 shows cross-sectional views taken along lines I-I' and II-II' of FIG. 11.

FIG. 11 is a perspective view of a transistor according to an example embodiment. FIG. 12 shows cross-sectional views taken along lines I-I' and II-II' of FIG. 11. For brevity of description, descriptions substantially identical to those given above with reference to FIG. 1 may not be given.

Referring to FIGS. 11 and 12, a transistor 20 may be provided. The transistor 10 may include the substrate 100, a fin structure FS, a pair of lower insulation layers 110, and the gate structure 300.

The substrate 100 may be a semiconductor substrate. For example, the substrate 100 may include silicon (Si). The substrate 100 may have a first conductivity type. For example, the first conductivity type may be n-type or p-type. When the conductivity type of the substrate 100 is n-type, the substrate 100 may include a group V element (e.g., P or As) as an impurity. When the conductivity type of the substrate 100 is p-type, the substrate 100 may include a group III element (e.g., B or In) as an impurity.

The fin structure FS may be provided on the substrate 100. The fin structure FS may include a lower semiconductor region LSR, the pair of constant current forming regions 200, the pair of source/drain regions SD, and a channel region CR. The lower semiconductor region LSR may be provided under the fin structure FS. The lower semiconductor region LSR may extend in the second direction DR2 parallel to the top surface 100u of the substrate 100. The lower semiconductor region LSR may protrude from the top surface 100u of the substrate 100. The lower semiconductor region LSR may include silicon (Si). The lower semiconductor region LSR may have the first conductivity type. When the conductivity type of the lower semiconductor region LSR is n-type, the lower semiconductor region LSR may include a group V element (e.g., P or As) as an impurity. When the conductivity type of the lower semiconductor region LSR is p-type, the lower semiconductor region LSR may include a group III element (e.g., B or In) as an impurity.

The pair of constant current forming regions 200 may be provided on the lower semiconductor region LSR. The pair of constant current forming regions 200 may be spaced apart from each other across the gate structure 300 therebetween. For example, the pair of constant current forming regions 200 may be spaced apart from each other in the second direction DR2. For example, the pair of constant current forming regions 200 may include silicon (Si). The pair of constant current forming regions 200 may have the first conductivity type. When the conductivity type of the pair of constant current forming regions 200 is n-type, the pair of constant current forming regions 200 may include a group V element (e.g., P or As) as an impurity. When the conductivity type of the pair of constant current forming regions 200 is p-type, the pair of constant current forming regions 200 may include a group III element (e.g., B or In) as an impurity. The doping concentration of the pair of constant current forming regions 200 may be higher than those of the substrate 100 and the lower semiconductor region LSR. For example, the doping concentration of the pair of constant current forming regions 200 may be $3 \times 10^{18}$ cm$^{-3}$ or higher.

The pair of source/drain regions SD may be respectively provided on the pair of constant current forming regions 200. The pair of source/drain regions SD may be spaced apart from each other across the gate structure 300 therebetween. For example, the pair of source/drain regions SD may be spaced apart from each other in the second direction DR2. One of the pair of source/drain regions SD may be a source of the transistor 20. The other one of the pair of source/drain regions SD may be a drain of the transistor 20. The pair of source/drain regions SD may have the second conductivity type different from the first conductivity type. When the second conductivity type is p-type, the pair of source/drain regions SD may include a group III element (e.g., B or In) as an impurity. When the second conductivity type is n-type, the pair of source/drain regions SD may include a group V element (e.g., P or As) as an impurity. The pair of source/drain regions SD may be electrically connected to the pair of constant current forming regions 200. For example, the pair of source/drain regions SD may directly contact the pair of constant current forming regions 200. An electric field may be formed between the pair of constant current forming regions 200 and the pair of source/drain regions SD. For example, the intensity of the electric field may be $10^6$ V/cm or higher.

The channel region CR may be provided on the lower semiconductor region LSR. The channel region CR may extend from the lower semiconductor region LSR to a region between the pair of source/drain regions SD. The channel region CR may be provided between the pair of constant current forming regions 200 and between the pair of source/drain regions SD. The channel region CR may include silicon (Si). The channel region CR may have the first conductivity type. When the conductivity type of the channel region CR is n-type, the channel region CR may include a group V element (e.g., P or As) as an impurity. When the conductivity type of the channel region CR is p-type, the channel region CR may include a group III element (e.g., B or In) as an impurity. The doping concentration of the channel region CR may be lower than that of the pair of constant current forming regions 200. For example, the doping concentration of the channel region CR may be substantially identical to that of the lower semiconductor region LSR. The channel region CR may be a region in which a channel of the transistor 20 is formed.

The pair of lower insulation layers 110 may be spaced apart from each other across the fin structure FS therebetween. For example, the pair of lower insulation layers 110 may be spaced apart from each other in the first direction DR1 that is parallel to the top surface 100u of the substrate 100 and intersects the second direction DR2. The pair of lower insulation layers 110 may overlap the lower semiconductor region LSR in the first direction DR1. The pair of lower insulation layers 110 may include an electrically insulating material. For example, the pair of lower insulation layers 110 may include $SiO_2$ or a high-k material (e.g., SiON, $HfO_2$, or $ZrO_2$).

The gate structure 300 may be provided on the fin structure FS and the pair of lower insulation layers 110. The gate structure 300 may include the gate insulation layer 310 and the gate electrode 320 that are sequentially stacked. The gate structure 300 may extend in the first direction DR1. The gate structure 300 may overlap the channel region CR in a third direction DR3. The gate structure 300 may extend along surfaces of the pair of lower insulation layers 110 and a channel fin 220. The gate insulation layer 310 may include an electrically insulating material. For example, the gate insulation layer 310 may include at least one material selected from among silicon oxide, silicon nitride, silicon oxynitride, oxide/nitride/oxide (ONO), and a high-k material. For example, the gate insulation layer 310 may include a material having a dielectric constant from about 10 to about 25. For example, the gate insulation layer 310 may include at least one material selected from among hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TIO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). The gate electrode 320 may include an electrically conductive material. For example, the gate electrode 320 may include a doped semiconductor material, a metal, an alloy, or a combination thereof. For example, the gate electrode 320 may include doped polysilicon, tungsten (W), titanium nitride (TiN), or a combination thereof.

In an embodiment, the threshold voltage of the transistor 20 may be adjusted by a doping concentration of the channel region CR and/or the work function of the gate electrode 320. For example, the work function of the gate electrode 320 may be controlled by the material constituting the gate electrode 320 or by an additional work function control layer (not shown). For example, the additional work function control layer may be disposed between the gate insulation layer 310 and the channel region CR.

The constant current forming region 200 immediately adjacent to the source/drain region SD serving as the drain of the transistor 20 from between the pair of source/drain regions SD may form a constant current between the source/drain region SD serving as the drain and the constant current forming region 200. The constant current may be a band-to-band tunneling (BTBT) current between the source/drain region SD serving as the drain and the constant current forming region 200 immediately adjacent thereto. The constant current may be independent from a gate voltage applied to the gate electrode 320. In other words, the constant current may flow regardless of the gate voltage. When the transistor 20 is an NMOS transistor, a constant current may flow to the lower semiconductor region LSR and the substrate 100 from the source/drain region SD serving as the drain through the constant current forming region 200 immediately adjacent thereto. When the transistor is a PMOS transistor, a constant current may flow to the source/drain region SD serving as the drain from the substrate 100 through the lower semiconductor region LSR and the constant current forming region 200 immediately adjacent to the source/drain region SD serving as the drain.

The present disclosure may provide the transistor 20 in which a constant current flows between the source/drain region SD serving as the drain and the constant current forming region 200 immediately adjacent thereto.

Figure 13:
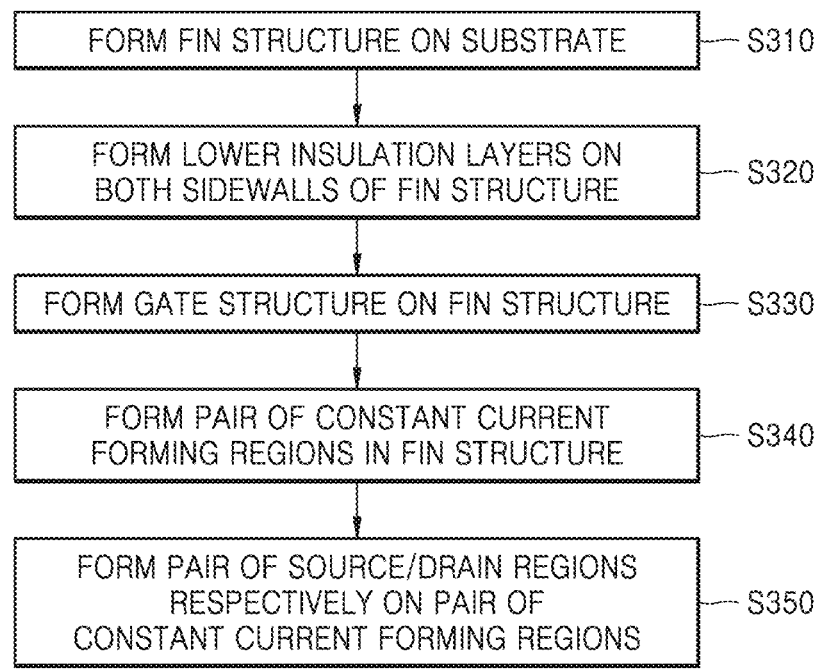
FIG. 13 is a flowchart of a method of manufacturing the transistor of FIG. 11 according to an example embodiment.

FIG. 13 is a flowchart of a method of manufacturing the transistor of FIG. 11 according to an example embodiment. FIGS. 14, 16, 18, and 20 are perspective views for describing the method of manufacturing a transistor of FIG. 13. FIGS. 15, 17, 19, and 21 are cross-sectional views taken along lines I-I' and II-II' of FIGS. 14, 16, 18, and 20, respectively.

Figure 14:
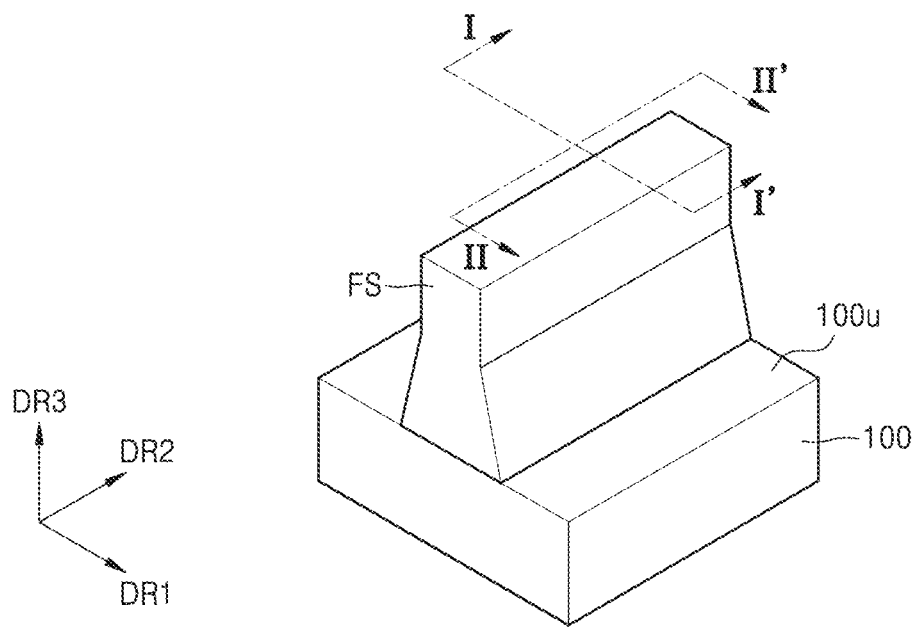
FIGS. 14, 16, 18, and 20 are perspective views for describing the method of manufacturing a transistor of FIG. 13.
Figure 15:
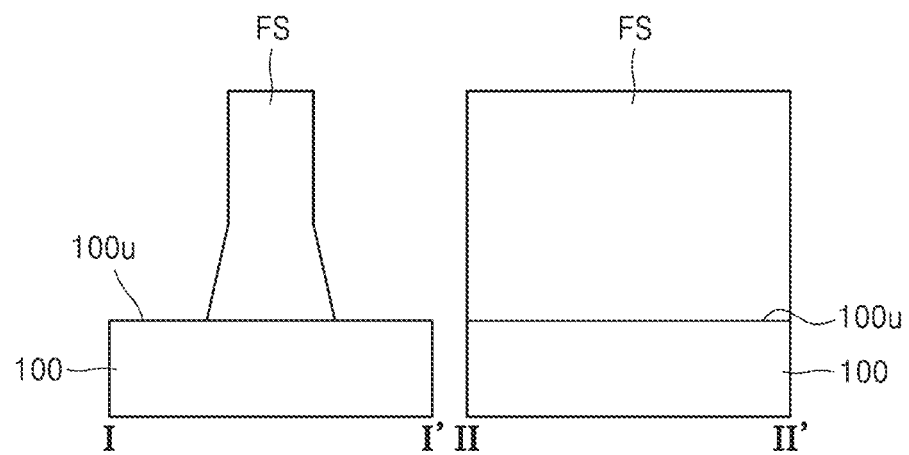
FIGS. 15, 17, 19, and 21 are cross-sectional views taken along lines I-I' and II-II' of FIGS. 14, 16, 18, and 20, respectively.

Referring to FIGS. 13 to 15, the fin structure FS may be formed on the substrate 100 (operation S310). A process of forming the fin structure FS may include preparing a semiconductor film (not shown) and exposing the fin structure FS by patterning the upper portion of the semiconductor film.

The semiconductor film may be, for example, a silicon (Si) film. The semiconductor film may have the first conductivity type. For example, the first conductivity type may be n-type or p-type. When the conductivity type of the semiconductor film is n-type, the semiconductor film may include a group V element (e.g., P or As) as an impurity. When the conductivity type of the semiconductor film is p-type, the semiconductor film may include a group III element (e.g., B or In) as an impurity.

For example, a patterning process may include forming a mask pattern on the semiconductor film and performing an anisotropic etching process by using the mask pattern as an etching mask on the semiconductor film. The mask pattern may be removed during or after the anisotropic etching process.

Figure 16:
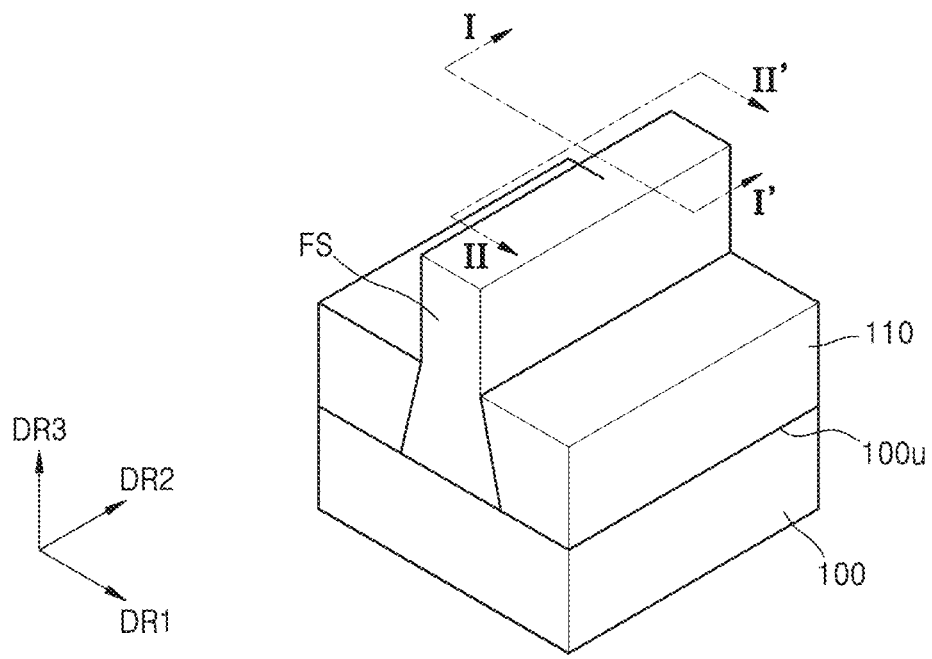
Figure 17:
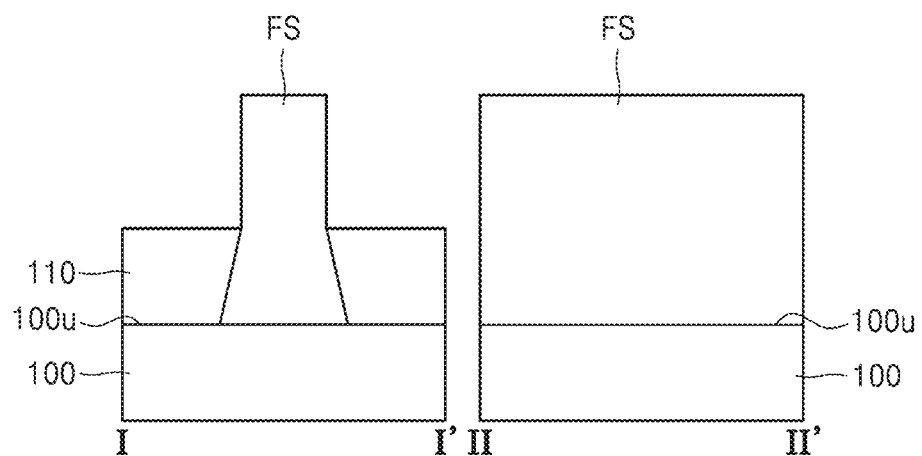

Referring to FIGS. 13, 16, and 17, the pair of lower insulation layers 110 may be formed on the substrate 100 (operation S320). A process of forming the pair of lower insulation layers 110 may include a process of forming a deposition film (not shown) by depositing an electrically insulating material on the substrate 100 and a process of exposing the upper portion of the fin structure FS by etching the deposition film. A deposition process may include a chemical vapor deposition process or a physical vapor deposition process. For example, the electrically insulating material may include $SiO_2$ or a high-k material (e.g., SiON, $HfO_2$, or $ZrO_2$).

Figure 18:
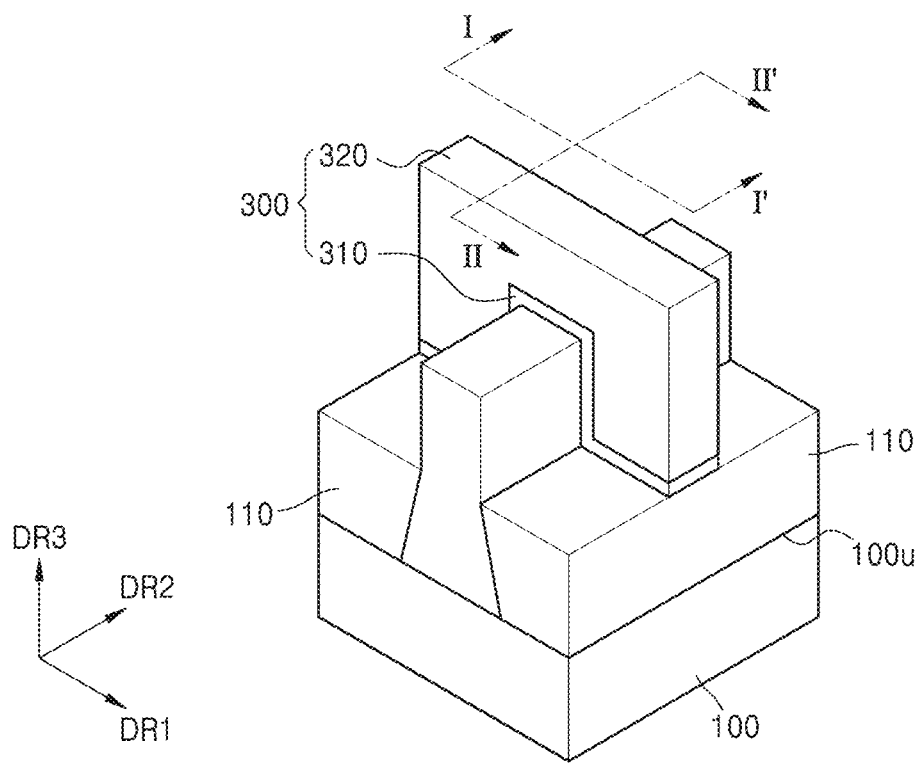
Figure 19:
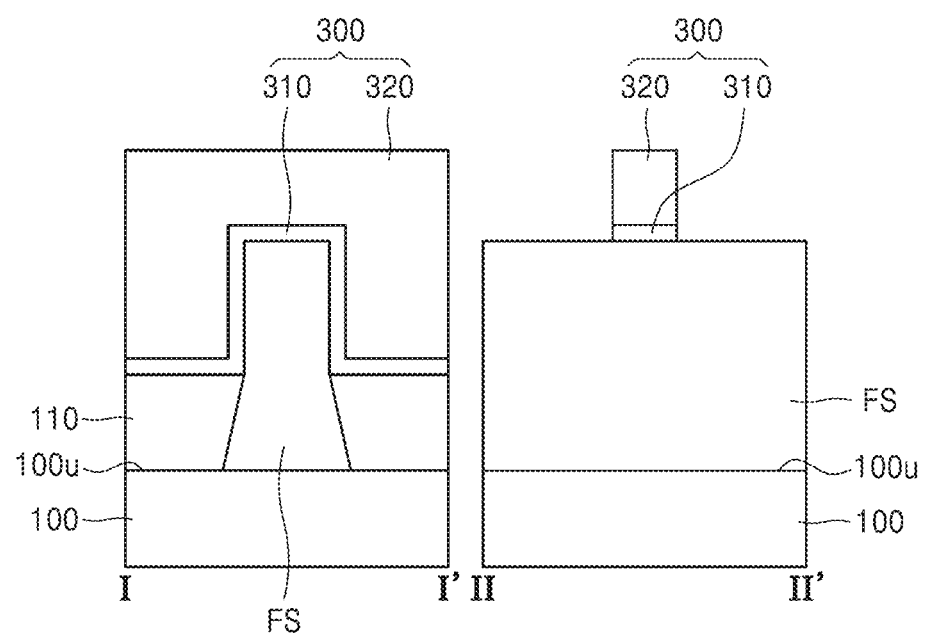

Referring to FIGS. 13, 18, and 19, the gate structure 300 may be formed on the fin structure FS (operation S330). A process of forming the gate structure 300 may include a process of sequentially depositing an electrically insulating material and an electrically conductive material on the pair of lower insulation layers 110 and the fin structure FS and a process of patterning the electrically insulating material and the electrically conductive material. A deposition process may include a chemical vapor deposition (CVD) process, a physical vapor deposition (PVD) process, or an atomic layer deposition (ALD) process. For example, the electrically insulating material may include at least one material selected from among silicon oxide, silicon nitride, silicon oxynitride, oxide/nitride/oxide (ONO), and a high-k material. For example, the electrically insulating material may include a material having a dielectric constant from about 10 to about 25. For example, the electrically insulating material may include at least one material selected from among hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the electrically conductive material may include a doped semiconductor material, a metal, an alloy, or a combination thereof. For example, the electrically conductive material may include doped polysilicon, tungsten (W), titanium nitride (TIN), or a combination thereof.

Figure 20:
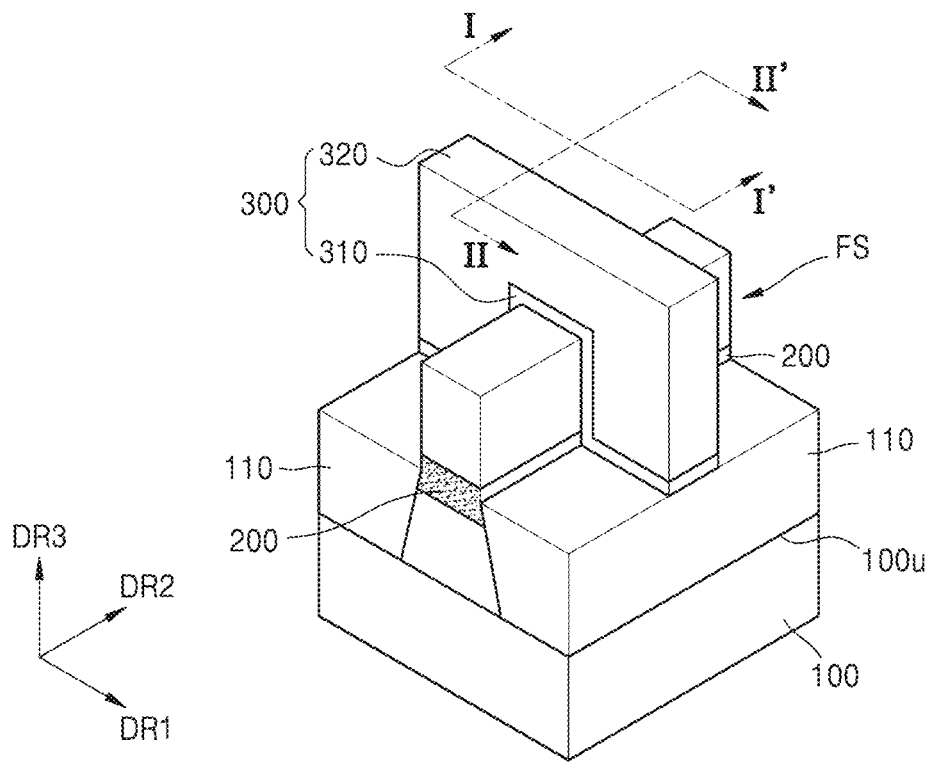
Figure 21:
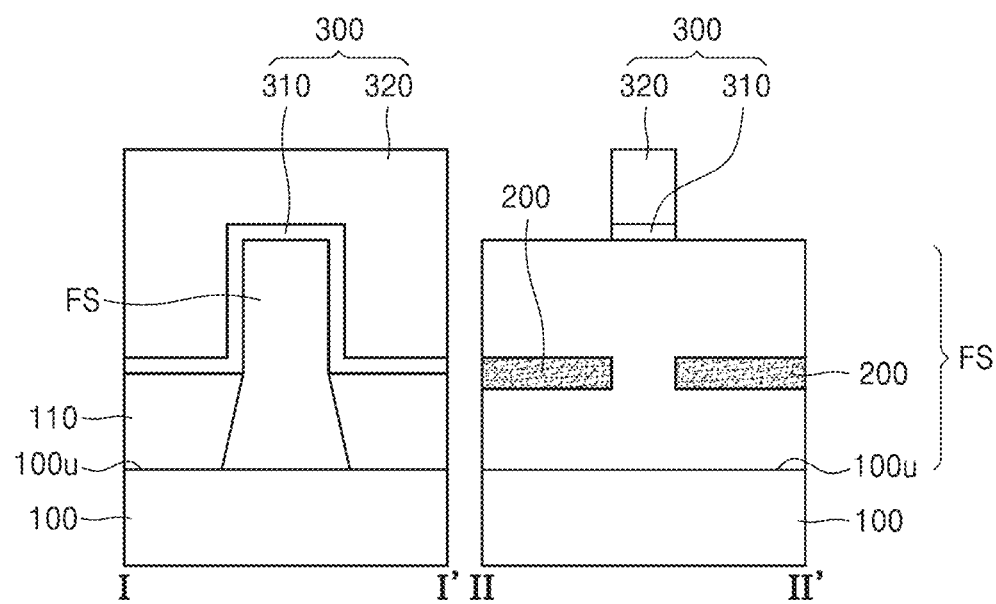

Referring to FIGS. 13, 20, and 21, the pair of constant current forming regions 200 may be formed in the fin structure FS (operation S340). A process of forming the pair of constant current forming regions 200 may include a process of doping the fin structure FS on sidewalls of the gate structure 300. The pair of constant current forming regions 200 may have the same conductivity type as that of the fin structure FS. When the conductivity type of the fin structure FS is n-type, a group V element (e.g., P or As) may be further implanted into the fin structure FS to form a pair of n-type constant current forming regions 200. When the conductivity type of the fin structure FS is p-type, a group III element (e.g., B or In) may be further implanted into the fin structure FS to form a pair of p-type constant current forming regions 200. The doping concentration of the pair of constant current forming regions 200 may be higher than that of the fin structure FS. For example, the doping concentration of the pair of constant current forming regions 200 may be $3 \times 10^{18}$ cm$^{-3}$ or higher.

Referring to FIGS. 13, 11, and 12, the pair of source/drain regions SD may be respectively formed in portions of the fin structure FS exposed on both side surfaces of the gate structure 300 (operation S350). A process of forming the pair of source/drain regions SD may include a process of doping the portions of the fin structure FS exposed on both side surfaces of the gate structure 300. For example, a doping process may include an ion implantation process. The pair of source/drain regions SD may have the second conductivity type different from the first conductivity type. When the first conductivity type is p-type, the second conductivity type may be n-type. When the conductivity type of the pair of source/drain regions SD is n-type, group V elements (e.g., P or As) may be implanted into the portions of the fin structure FS exposed on both side surfaces of the gate structure 300. When the first conductivity type is n-type, the second conductivity type may be p-type. When the conductivity type of the pair of source/drain regions SD is p-type, a group III element (e.g., B or In) may be implanted into the portions of the fin structure FS exposed on both side surfaces of the gate structure 300. One of the pair of source/drain regions SD may be a source of the transistor 20, and the other one may be a drain of the transistor 20.

After the pair of constant current forming regions 200 and the pair of source/drain regions SD are formed in the fin structure FS, the fin structure FS may be heat-treated. The thermal budget of a heat treatment process may affect the threshold voltage characteristics and the constant current of the transistor 20. For example, when the thermal budget is larger than demanded, impurities implanted into the fin structure FS may diffuse into a channel and change the threshold voltage. For example, when the thermal budget is larger than demanded, the doping concentration between the pair of source/drain regions SD and the pair of constant current forming regions 200 may be gently changed, and thus the magnitude of the constant current may be reduced. When a heat treatment process is performed, the thermal budget may be adjusted to prevent or minimize the threshold voltage characteristic of the transistor 20 from being changed. The thermal budget may be adjusted, such that the transistor 20 has a demanded constant current.

The present disclosure may provide a method of manufacturing the transistor 20 in which a constant current flows between the source/drain region SD serving as the drain and the constant current forming region 200 immediately adjacent thereto.

Figure 22:
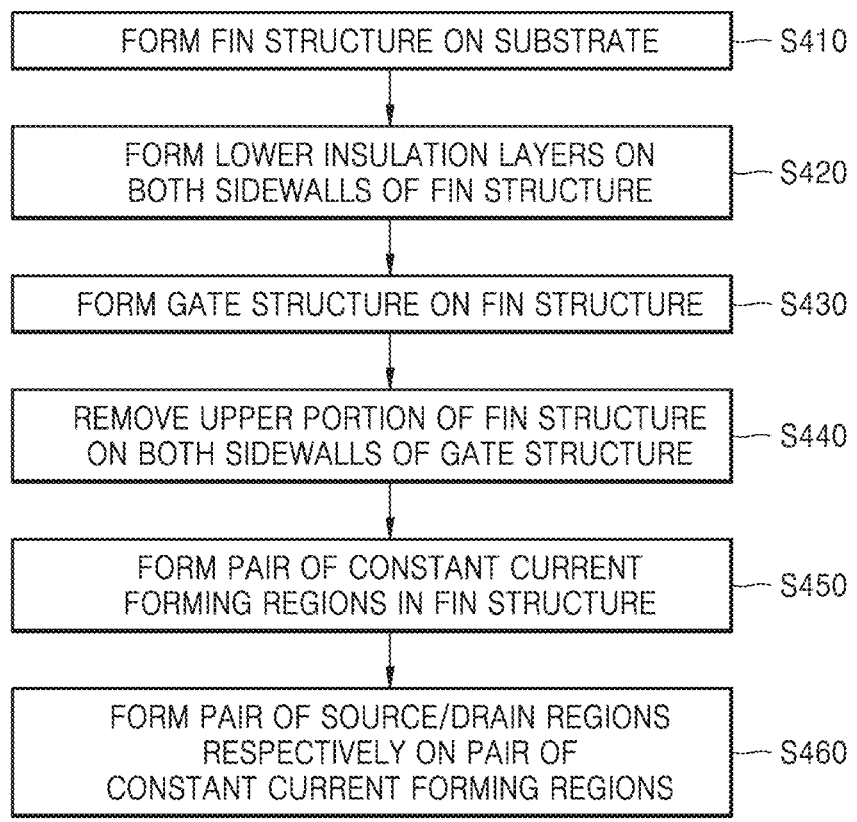
FIG. 22 is a flowchart of a method of manufacturing the transistor of FIG. 11 according to an example embodiment.
Figure 23:
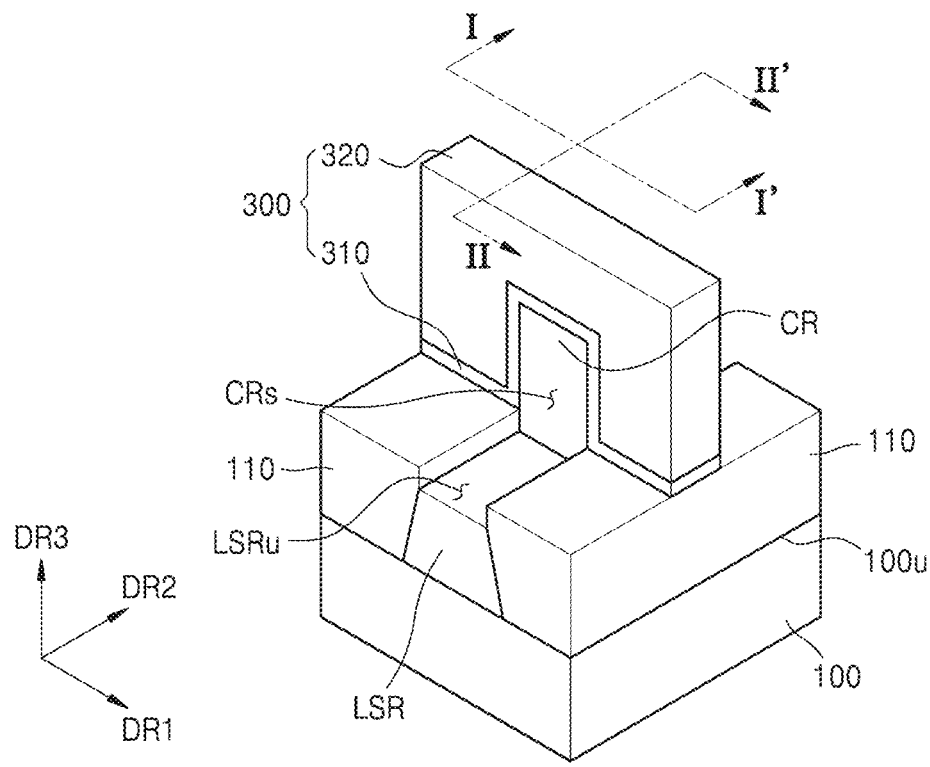
FIGS. 23 and 25 are perspective views for describing the method of manufacturing a transistor of FIG. 22.
Figure 24:
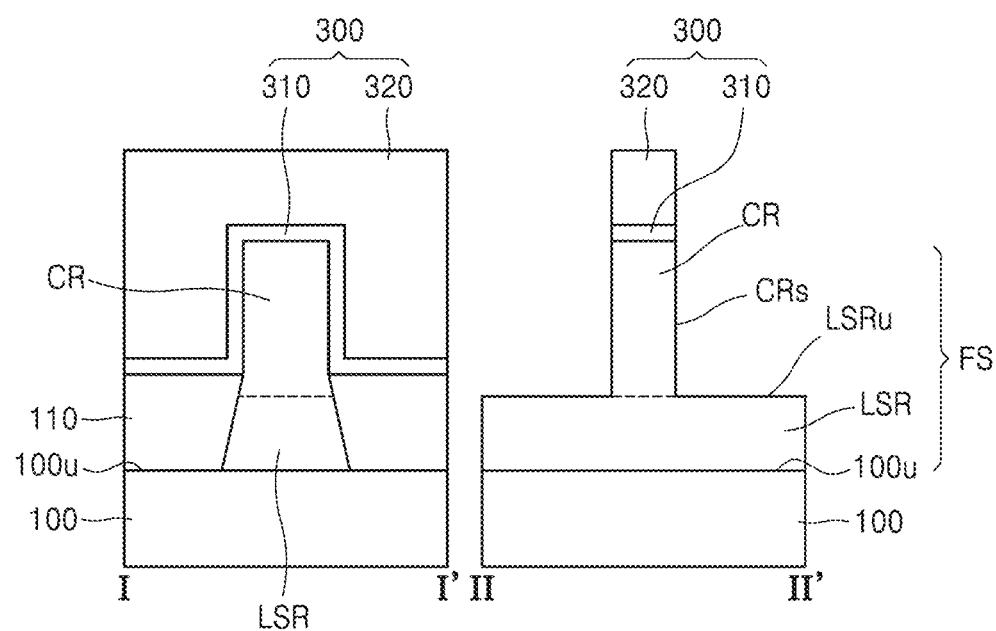
FIGS. 24 and 26 are cross-sectional views taken along fines I-I' and II-II' of FIGS. 23 and 25, respectively.
Figure 25:
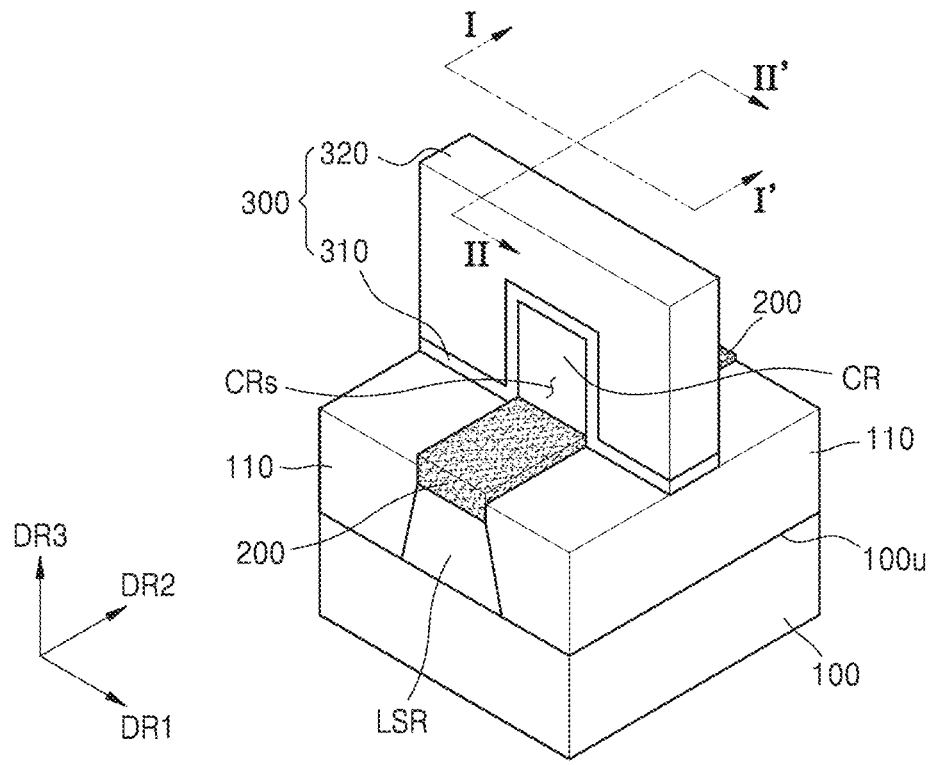
Figure 26:
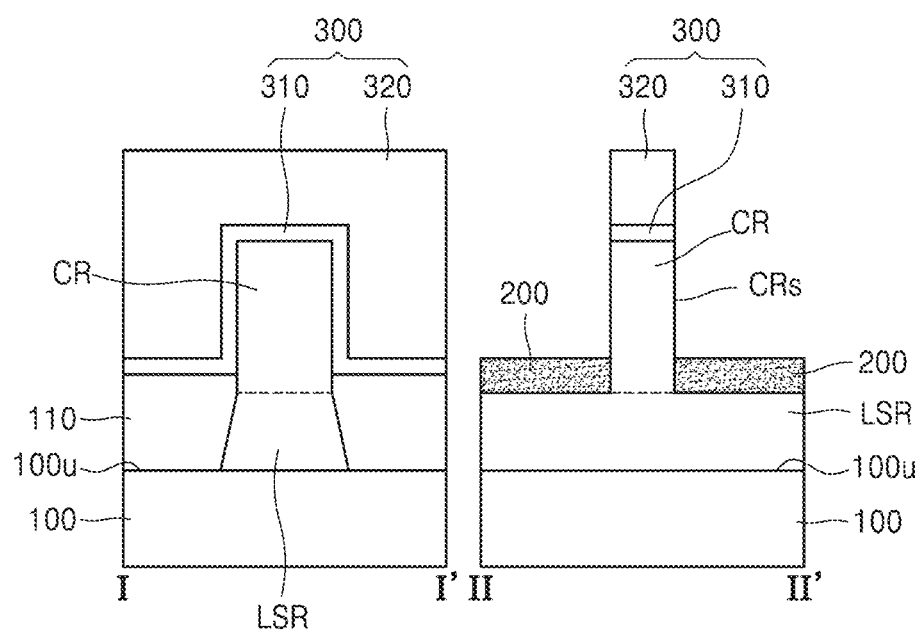

FIG. 22 is a flowchart of a method of manufacturing the transistor of FIG. 11 according to an example embodiment. FIGS. 23 and 25 are perspective views for describing the method of manufacturing a transistor of FIG. 22. FIGS. 24 and 26 are cross-sectional views taken along lines I-I' and II-II' of FIGS. 23 and 25, respectively. For brevity of description, descriptions substantially identical to those given above with reference to FIGS. 13 to 21 may not be given.

Referring to FIG. 22, the fin structure FS may be formed on the substrate 100 (operation S410). A process of forming the fin structure FS may be substantially identical to that described with reference to FIGS. 13 to 15.

The pair of lower insulation layers 110 may be formed on both side surfaces of the fin structure FS (operation S420). A process of forming the pair of lower insulation layers 110 may be substantially identical to that described with reference to FIGS. 13, 16, and 17.

The gate structure 300 may be formed on the fin structure FS (operation S430). A process of forming the gate structure 300 may be substantially identical to that described with reference to FIGS. 13, 18, and 19.

Referring to FIGS. 22 to 24, the upper portion of the fin structure FS may be removed on both side surfaces of the gate structure 300 (operation S440). A process of removing the upper portion of the fin structure FS may include performing an etching process by using a mask pattern (not shown). As the upper portion of the fin structure FS is removed, both side surfaces CRs of the channel region CR may be exposed. In an embodiment, an etching process of removing the upper portion of the fin structure FS may be performed, such that the top surface LSRu of the lower semiconductor region LSR on the both side surfaces CRs of the channel region CR has a height lower than that of the top surfaces of the pair of lower insulation layers 110. However, the height of the top surface LSRu of the lower semiconductor region LSR is not limited to be lower than the height of the top surfaces of the pair of lower insulation layers 110. In another embodiment, the top surface LSRu of the lower semiconductor region LSR may be placed at the same height as or higher than the top surfaces of the pair of lower insulation layers 110.

Referring to FIGS. 22, 25, and 26, the pair of constant current forming regions 200 may be formed on the top surface LSRu of the lower semiconductor region LSR on both side surfaces CRs of the channel region CR (operation S450). For example, the pair of constant current forming regions 200 may be formed through an epitaxy growth process. In other words, the pair of constant current forming regions 200 may be an epitaxial layer. For example, the pair of constant current forming regions 200 may include silicon (Si). The pair of constant current forming regions 200 may have the first conductivity type. When the conductivity type of the pair of constant current forming regions 200 is n-type, the pair of constant current forming regions 200 may include a group V element (e.g., P or As) as an impurity. When the conductivity type of the pair of constant current forming regions 200 is p-type, the pair of constant current forming regions 200 may include a group III element (e.g., B or In) as an impurity. The doping concentration of the pair of constant current forming regions 200 may be higher than that of the substrate 100. For example, the doping concentration of the pair of constant current forming regions 200 may be $3 \times 10^{18}$ cm$^{-3}$ or higher.

Referring to FIGS. 22, 11, and 12, the pair of source/drain regions SD may be respectively formed on the pair of constant current forming regions 200 (operation S460). For example, the pair of source/drain regions SD may be formed through an epitaxial growth process. In other words, the pair of source/drain regions SD may be an epitaxial layer. For example, the pair of source/drain regions SD may include silicon (Si). The pair of source/drain regions SD may have the second conductivity type different from the first conductivity type. When the second conductivity type is p-type, the pair of source/drain regions SD may include a group III element (e.g., B or In) as an impurity. When the second conductivity type is n-type, the pair of source/drain regions SD may include a group V element (e.g., P or As) as an impurity. In an embodiment, the impurities may be implanted into the pair of source/drain regions SD through an in-situ process when an epitaxial growth process is performed.

The present disclosure may provide a method of manufacturing the transistor 20 in which a constant current flows between the source/drain region SD serving as the drain and the constant current forming region 200 immediately adjacent thereto.

Figure 27:
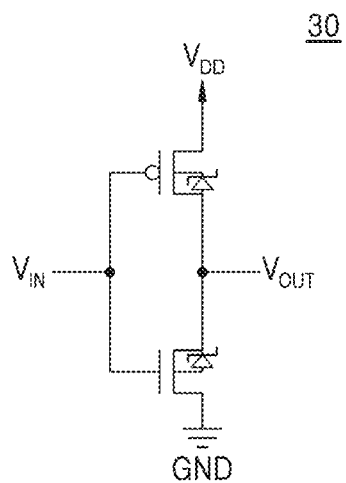
FIG. 27 is a circuit diagram of a ternary inverter according to example embodiments.

FIG. 27 is a circuit diagram of a ternary inverter according to example embodiments. For brevity of description, descriptions substantially identical to those given above with reference to FIGS. 1 and 11 may not be given.

Referring to FIG. 27, a ternary inverter 30 including an NMOS transistor and a PMOS transistor may be provided.

In an embodiment, the NMOS transistor may be the transistor 10 described with reference to FIG. 1 having a p-type substrate, a pair of p-type constant current forming regions, and a pair of n-type source/drain regions. The PMOS transistor may be the transistor 10 described with reference to FIG. 1 having an n-type substrate, a pair of n-type constant current forming regions, and a pair of p-type source/drain regions.

In an embodiment, the NMOS transistor may be the transistor 20 described with reference to FIG. 11 having a p-type substrate, a pair of p-type constant current forming regions, and a pair of n-type source/drain regions. The PMOS transistor may be the transistor 20 described with reference to FIG. 11 having an n-type substrate, a pair of n-type constant current forming regions, and a pair of p-type source/drain regions.

A ground voltage may be applied to the source and the substrate of the NMOS transistor. For brevity of explanation, it is assumed that the ground voltage is 0 volts (V) hereinafter. A driving voltage $V_{DD}$ may be applied to the source and the substrate of the PMOS transistor. An input voltage Vin may be applied to each of a gate electrode of the NMOS transistor and a gate electrode of the PMOS transistor.

A drain of the NMOS transistor may be electrically connected to a drain of the PMOS transistor and may have the same voltage. The voltage of the drain of the NMOS transistor and the drain of the PMOS transistor may be an output voltage Vout of the ternary inverter 30.

A constant current may flow from the drain of the NMOS transistor to the substrate of the NMOS transistor. A constant current may flow from the substrate of the PMOS transistor to the drain of the PMOS transistor. The constant currents may be independent of the input voltage Vin.

In an embodiment, a first input voltage may be applied to the gate electrode of the PMOS transistor and the gate electrode of the NMOS transistor, such that the PMOS transistor has a constant current dominant over a channel current and the NMOS transistor has a channel current dominant over a constant current. In this case, the output voltage Vout of the ternary inverter 30 may be a first voltage.

In another embodiment, a second input voltage may be applied to the gate electrode of the NMOS transistor and the gate electrode of the PMOS transistor, such that the NMOS transistor has a constant current dominant over a channel current and the PMOS transistor has a channel current dominant over a constant current. In this case, the output voltage of the ternary inverter 30 may be a second voltage greater than the first voltage.

In another embodiment, a third input voltage may be applied to the gate electrode of the PMOS transistor and the gate electrode of the NMOS transistor, such that each of the NMOS transistor and the PMOS transistor has a constant current that is dominant over the channel current. In this case, the output voltage of the ternary inverter 30 may be a third voltage between the first voltage and the second voltage.

The constant current flowing from the drain of the NMOS transistor to the substrate of the NMOS transistor and the constant current flowing from the substrate of the PMOS transistor to the drain of the PMOS transistor may flow regardless of gate voltages applied to the gate electrodes of the PMOS transistor and the NMOS transistor. A current in the ternary inverter 30 may flow from the substrate of the PMOS transistor to the substrate of the NMOS transistor through the drain of the PMOS transistor and the drain of the NMOS transistor. The driving voltage VW applied to the substrate of the PMOS transistor may be distributed to a resistor between the substrate of the PMOS transistor and the drain of the PMOS transistor and a resistor between the substrate of the NMOS transistor and the drain of the NMOS transistor. The output voltage Vout may be a voltage applied to the resistor between the substrate of the NMOS transistor and the drain of the NMOS transistor. The output voltage Vout may have a value between the driving voltage $V_{DD}$ and 0 V.

The output voltage Vout may have a state of 0 V ('0' state), a state of a voltage between the driving voltage $V_{DD}$ and 0 V ('1' state), or a state of the driving voltage VW ('2' state) according to the input voltage Vin. The present disclosure may provide a ternary inverter having three states according to the input voltage Vin.

Figure 28:
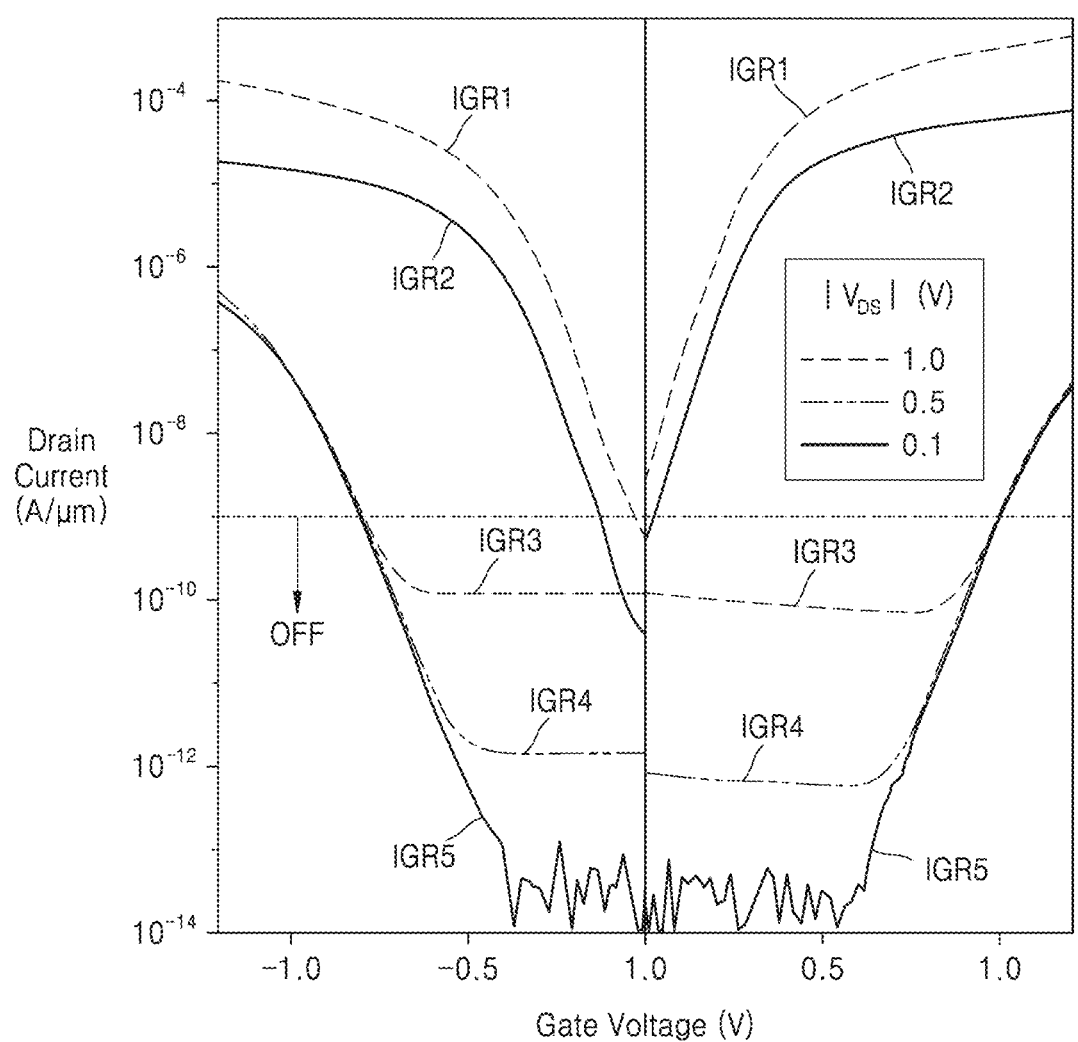
FIG. 28 is a gate voltage-drain current graph of ternary inverters of the present disclosure and binary inverters.

FIG. 28 is a gate voltage-drain current graph of ternary inverters of the present disclosure and binary inverters.

Referring to FIG. 28, gate voltage-drain current graphs IGR1 and IGR2 of binary inverters and gate voltage-drain current graphs IGR3, IGR4, and IGR5 of ternary inverters of the present disclosure are shown.

Drain currents of binary inverters do not have a constant current component that flows regardless of a gate voltage.

Drain currents of the ternary inverters of the present disclosure have a constant current component that flows regardless of a gate voltage. For example, even when the ternary inverters of the present disclosure are in an OFF state, a constant current flows through the ternary inverters of the present disclosure.

Figure 29:
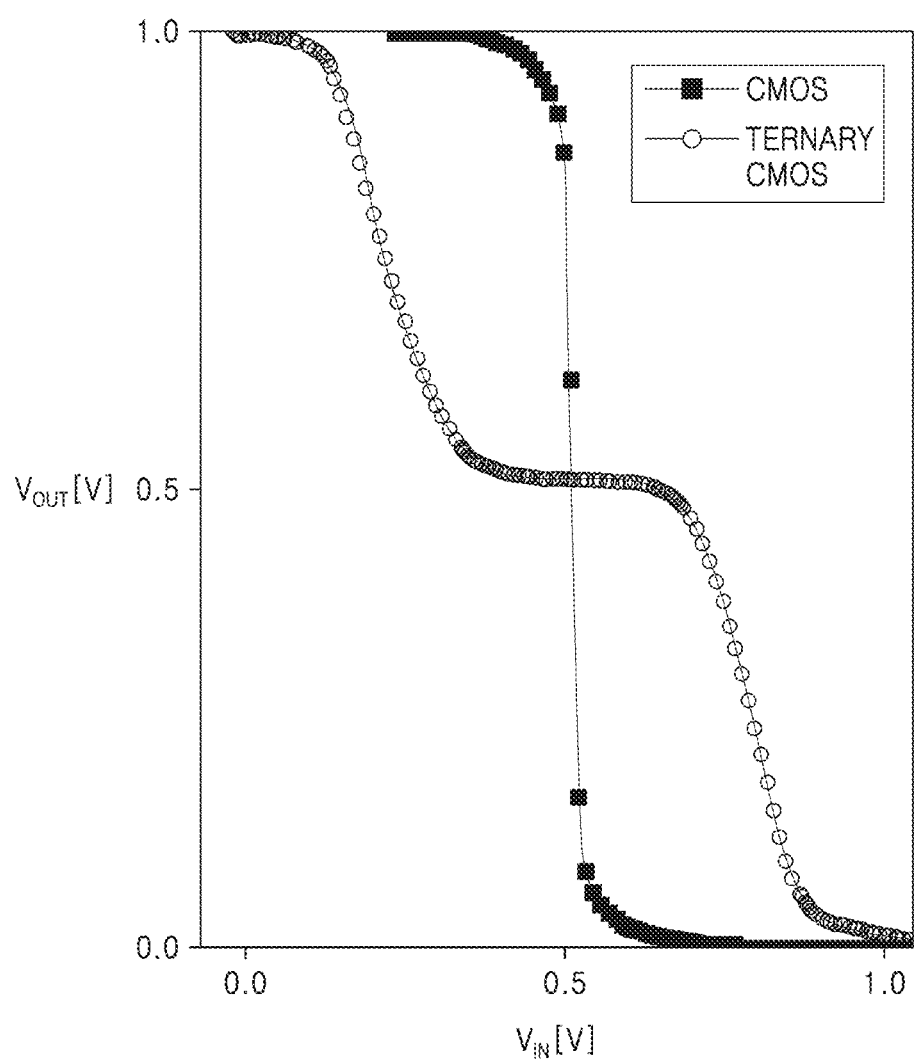
FIG. 29 is a graph showing an input voltage Vin-output voltage Vout of a ternary inverter of the present disclosure and a binary inverter.

FIG. 29 is a graph showing an input voltage Vin-output voltage Vout of a ternary inverter of the present disclosure and a binary inverter.

Referring to FIG. 29, the driving voltage $V_{DD}$ of the ternary inverter of the present disclosure and the binary inverter was 1.0 V, and the ground voltage GND was 0 V. The input voltage Vin of the ternary inverter and the binary inverter was from 0 V to 1.0 V.

In the case of the binary inverter, when the input voltage was changed from 0 V to 1 V, the output voltage Vout rapidly decreased from 1 V to 0 V when the input voltage was nearby 0.5 V. In other words, the binary inverter had two states (e.g., a '0' state and a '1' state).

In the case of the ternary inverter of the present disclosure, when the input voltage was changed from 0 V to 1 V, the output voltage Vout rapidly decreased from 1 V to 0.5 V, maintained 0.5 V, and then rapidly decreased from 0.5 V to 0 V again. In other words, the ternary inverter of the present disclosure had three states (e.g., a '0' state, a '1' state, and a '2' state).

Figure 30:
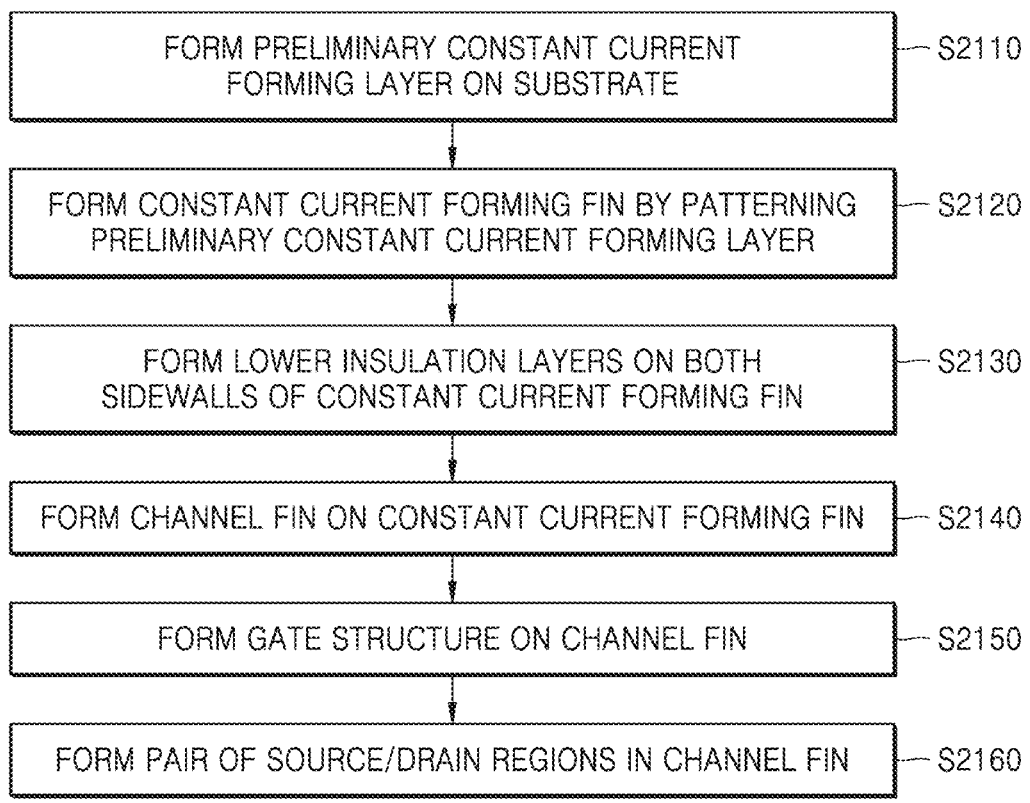
FIG. 30 is a flowchart of a method of manufacturing a transistor according to an example embodiment.

FIG. 30 is a flowchart of a method of manufacturing a transistor according to an example embodiment. FIGS. 31, 32, 33, 34, 35, and 37 are perspective views for describing the method of manufacturing the transistor of FIG. 1. FIGS. 36 and 38 are cross-sectional views taken along lines I-I' and II-II' of FIGS. 35 and 37, respectively.

Figure 31:
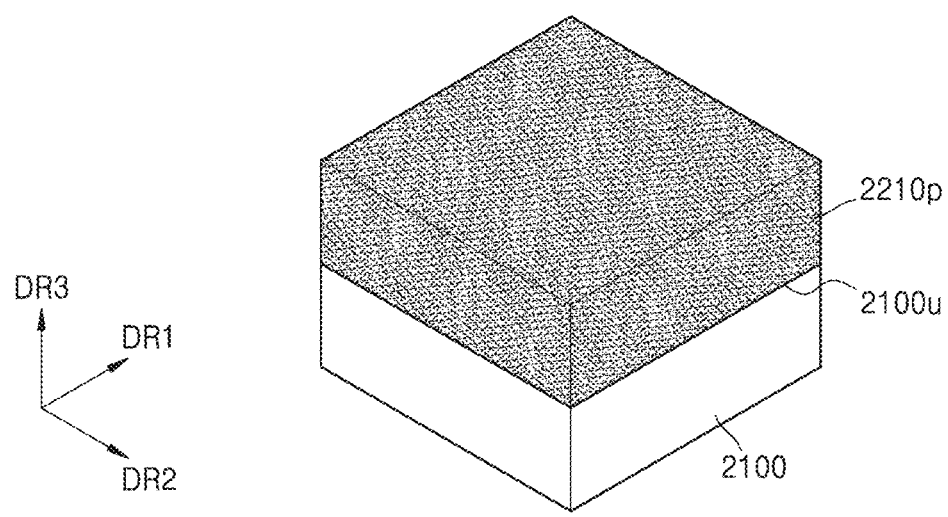
FIGS. 31, 32, 33, 34, 35, and 37 are perspective views for describing the method of manufacturing the transistor of FIG. 1.

Referring to FIGS. 30 and 31, a preliminary constant current forming layer 2210*p* may be formed on a substrate 2100 (operation S2110). The substrate 2100 may be a semiconductor substrate. For example, the substrate 2100 may include silicon (Si). The substrate 2100 may have the first conductivity type. For example, the first conductivity type may be n-type or p-type. When the conductivity type of the substrate 2100 is n-type, the substrate 2100 may include a group V element (e.g., P or As) as an impurity. When the conductivity type of the substrate 2100 is p-type, the substrate 2100 may include a group III element (e.g., B or In) as an impurity.

The preliminary constant current forming layer 2210*p* may be formed through an epitaxy growth process. In other words, the preliminary constant current forming layer 2210*p* may be an epitaxial layer. For example, the preliminary constant current forming layer 2210*p* may include silicon (Si). The preliminary constant current forming layer 2210*p* may have the first conductivity type. When the conductivity type of the preliminary constant current forming layer 2210*p* is n-type, the preliminary constant current forming layer 2210*p* may include a group V element (e.g., P or As) as an impurity. When the conductivity type of the preliminary constant current forming layer 2210*p* is p-type, the preliminary constant current forming layer 2210*p* may include a group III element (e.g., B or In) as an impurity.

The doping concentration of the preliminary constant current forming layer 2210*p* may be higher than that of the substrate 2100. For example, the doping concentration of the preliminary constant current forming layer 2210*p* may be $3 \times 10^{18}$ cm$^{-3}$ or higher.

Figure 32:
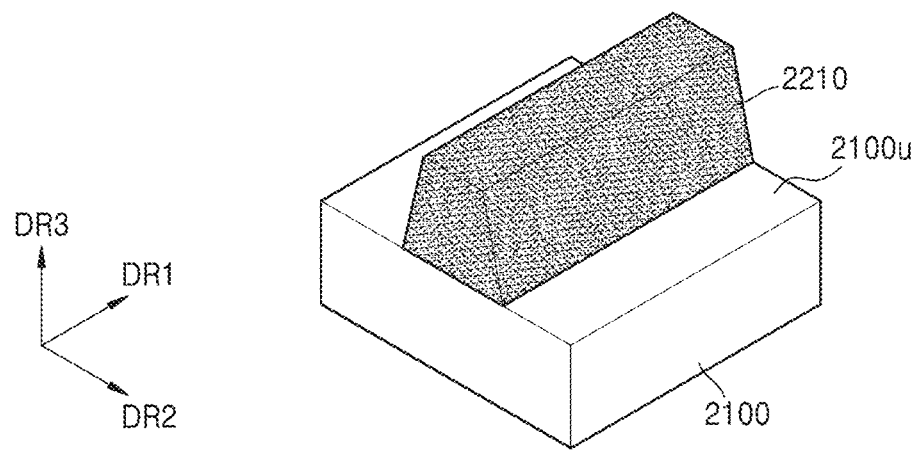

Referring to FIGS. 30 and 32, the preliminary constant current forming layer 2210p may be patterned, thereby forming a constant current forming fin 2210 (operation S2120). For example, the preliminary constant current forming layer 2210p may be patterned through an anisotropic etching process using an etching mask provided on the preliminary constant current forming layer 2210p. The preliminary constant current forming layer 2210p may be patterned until the top surface 2100u of the substrate 2100 is exposed. The etching mask may be removed during or after an etching process. The constant current forming fin 2210 may extend in the first direction DR1 parallel to the top surface 2100u of the substrate 2100. In an embodiment, the width of the constant current forming fin 2210 may increase in the direction toward the substrate 2100. The width of the constant current forming fin 2210 may be the size of the constant current forming fin 2210 in the second direction DR2 intersecting the first direction DR1. A distance between both side surfaces of the constant current forming pin 2210 may increase in the direction toward the substrate 2100. Hereinafter, both side surfaces of the constant current forming fin 2210 may be side surfaces of the constant current forming fin 2210 extending in the first direction DR1. However, the width of the constant current forming fin 2210 is not limited to that shown in FIG. 32. In another embodiment, the constant current forming fin 2210 may have a constant width. In other words, both side surfaces of the constant current forming fin 2210 may be perpendicular to the top surface 2100u of the substrate 2100. In another embodiment, the width of the constant current forming fin 2210 may decrease in the direction toward the substrate 2100. The distance between both side surfaces of the constant current forming pin 2210 may decrease in the direction toward the substrate 2100.

Figure 33:
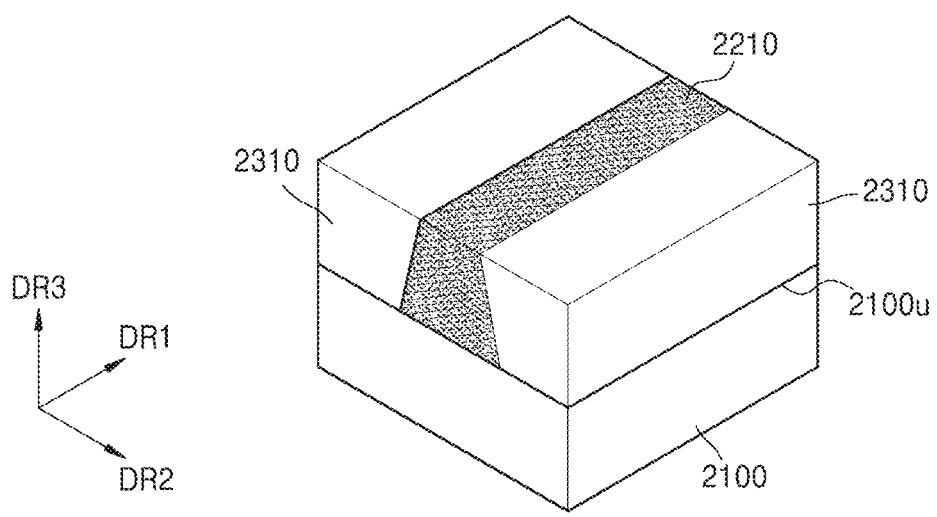

Referring to FIGS. 30 and 33, a lower insulation layer 2310 may be formed on both side surfaces of the constant current forming fin 2210 (operation S2130). The lower insulation layer 2310 may be formed on the substrate 2100. A process of forming the lower insulation layer 2310 may include a process of depositing an electrically insulating material on the substrate 2100 and a process of exposing the top surface of the constant current forming fin 2210 by etching the deposited electrically insulating material. A deposition process may include a chemical vapor deposition (hereinafter referred to as CVD) process, a physical vapor deposition (hereinafter referred to as PVD) process, or an atomic layer deposition (hereinafter referred to as ALD) process. The lower insulation layer 2310 may include, for example, $SiO_2$ or a high-k material (e.g., SiON, $HfO_2$, or $ZrO_2$). The lower insulation layer 2310 may cover both side surfaces of the constant current forming fin 2210. The lower insulation layer 2310 may expose the top surface of the constant current forming fin 2210.

Figure 34:
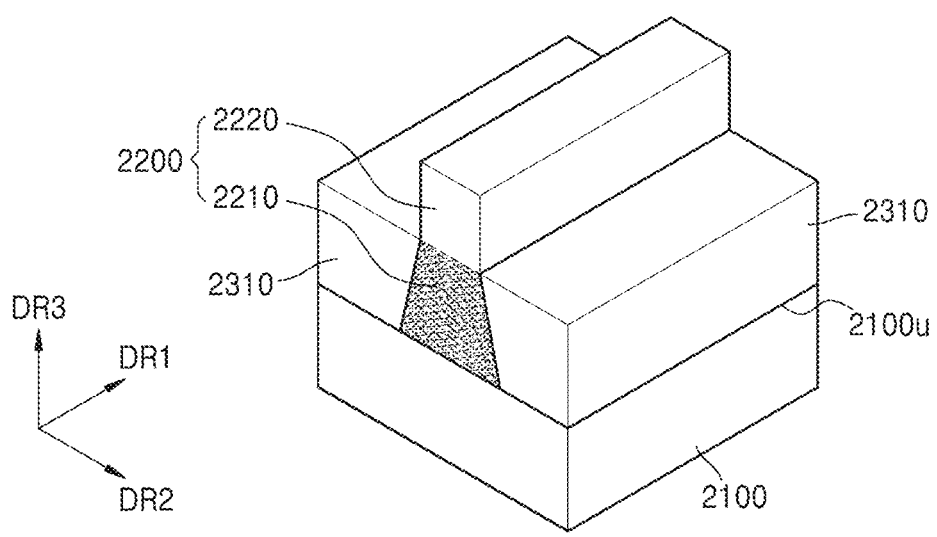

Referring to FIGS. 30 and 34, a channel fin 2220 may be formed on the constant current forming fin 2210 (operation S2140). The channel fin 2220 may be formed through an epitaxial growth process. In other words, the channel fin 2220 may be an epitaxial layer. For example, the channel fin 2220 may include silicon (Si). The channel fin 2220 may have the first conductivity type. When the conductivity type of the channel fin 2220 is n-type, the channel fin 2220 may include a group V element (e.g., P or As) as an impurity. When the conductivity type of the channel fin 2220 is p-type, the channel fin 2220 may include a group III element (e.g., B or In) as an impurity. The doping concentration of the channel fin 2220 may be lower than that of the constant current forming fin 2210. For example, the doping concentration of the channel fin 2220 may be substantially identical to that of the substrate 2100. The constant current forming fin 2210 and the channel fin 2220 may be collectively referred to as a fin structure 2200.

Figure 35:
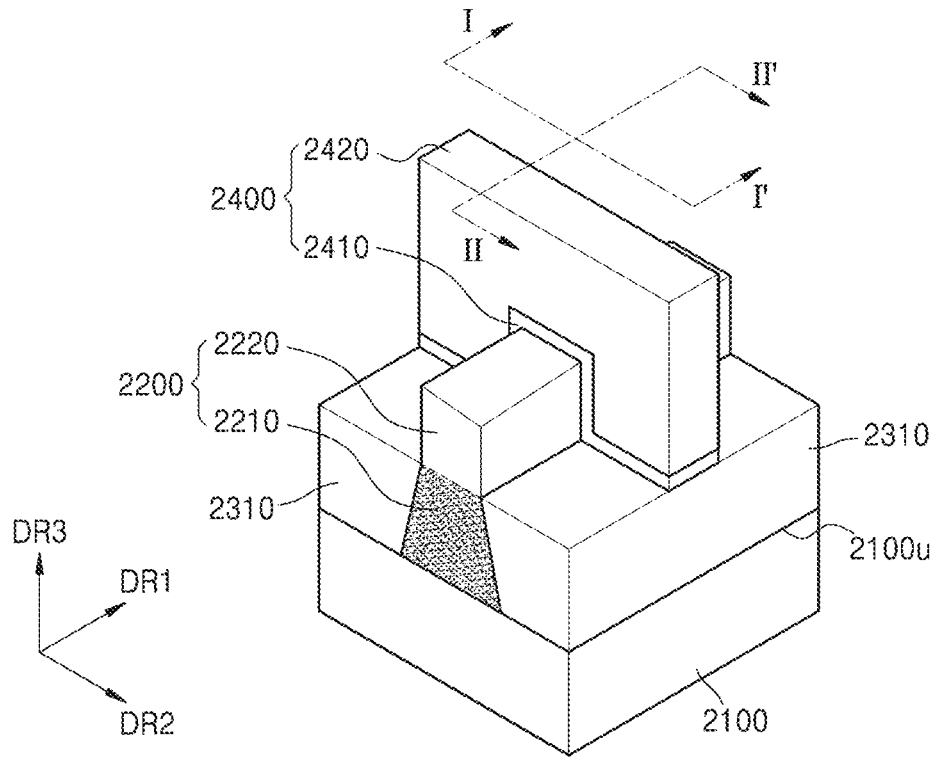
Figure 36:
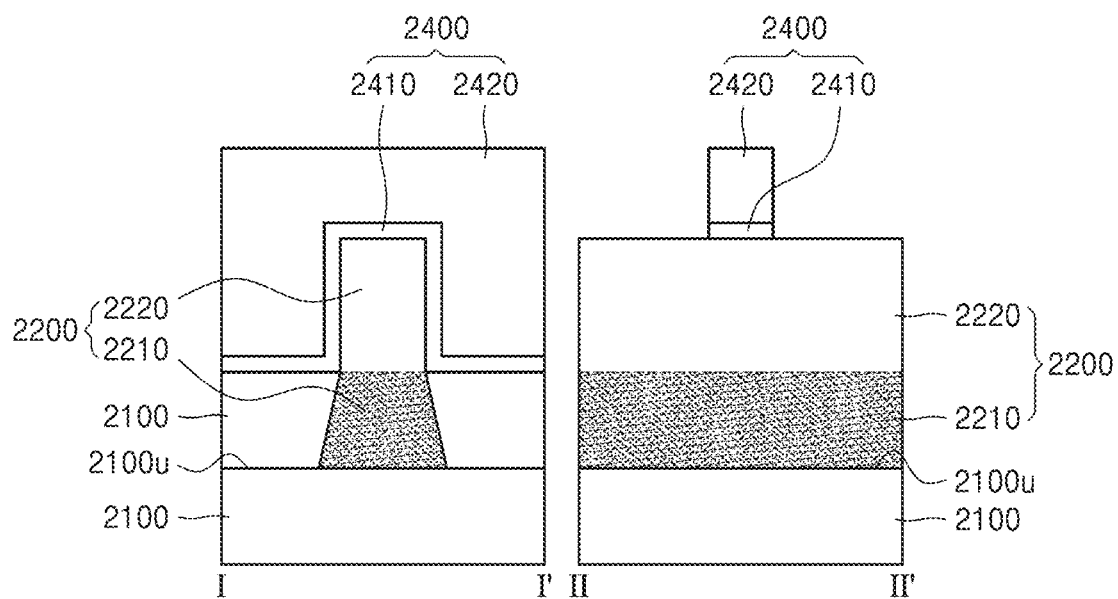
FIGS. 36 and 38 are cross-sectional views taken along lines I-I' and II-II' of FIGS. 35 and 37, respectively.

Referring to FIGS. 30, 35, and 36, a gate structure 2400 may be formed on the channel fin 2220 (operation S2150). The gate structure 2400 may include a gate insulation layer 2410 and a gate electrode 2420 that are sequentially stacked. The gate structure 2400 may extend in the second direction DR2. When viewed in the third direction DR3 perpendicular to the top surface 2100u of the substrate 2100, the gate structure 2400 may intersect the channel fin 2220. The gate structure 2400 may extend along surfaces of the lower insulation layer 2310 and the channel fin 2220.

A process of forming the gate structure 2400 may include a process of sequentially depositing an electrically insulating material and an electrically conductive material on the lower insulation layer 2310 and the fin structure 2200 and a process of patterning the conductive material and the insulating material. A deposition process may include a chemical vapor deposition (CVD) process, a physical vapor deposition (PVD) process, or an atomic layer deposition (ALD) process. For example, the electrically insulating material may include at least one material selected from among silicon oxide, silicon nitride, silicon oxynitride, oxide/nitride/oxide (ONO), and a high-k material. For example, the electrically insulating material may include a material having a dielectric constant from about 10 to about 25. For example, the electrically insulating material may include at least one material selected from among hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

For example, the electrically conductive material may include a doped semiconductor material, a metal, an alloy, or a combination thereof. For example, the electrically conductive material may include doped polysilicon, tungsten (W), titanium nitride (TiN), or a combination thereof.

The process of patterning the electrically conductive material and the electrically insulating material may include an anisotropic etching process using an etching mask. The electrically conductive material and the electrically insulating material may be patterned until the lower insulation layer 2310 and the channel fin 2220 are exposed. The etching mask may be removed during or after an etching process. The channel fin 2220 may be exposed on both side surfaces of the gate structure 2400. Hereinafter, both side surfaces of the gate structure 2400 may be side surfaces of the gate structure 2400 extending in the second direction DR2.

Figure 37:
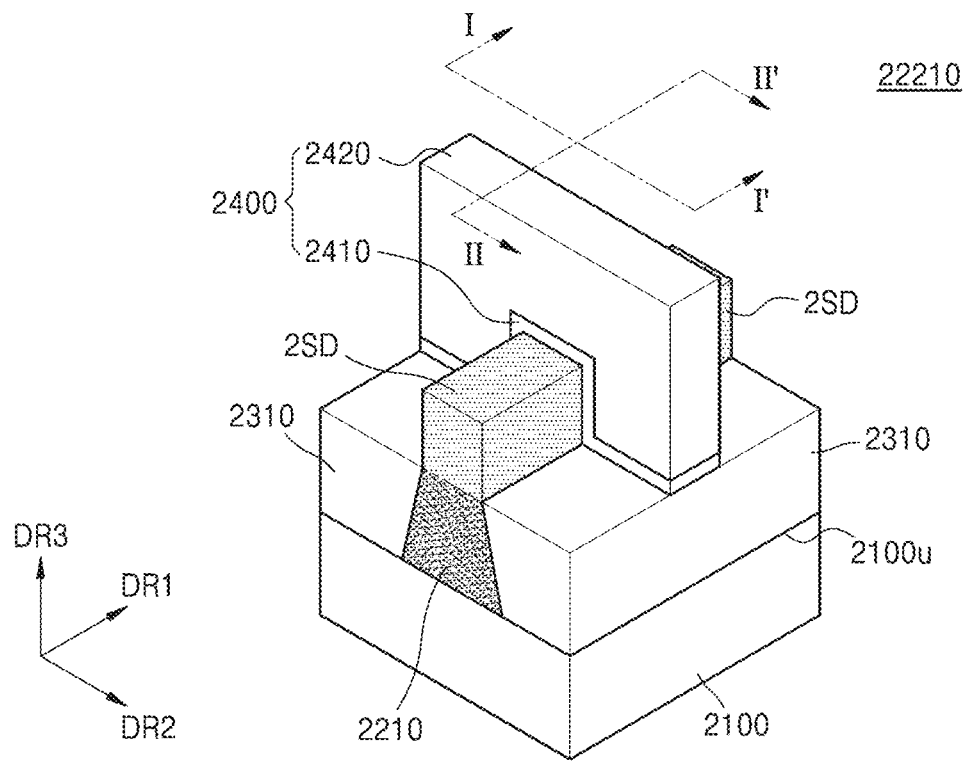
Figure 38:
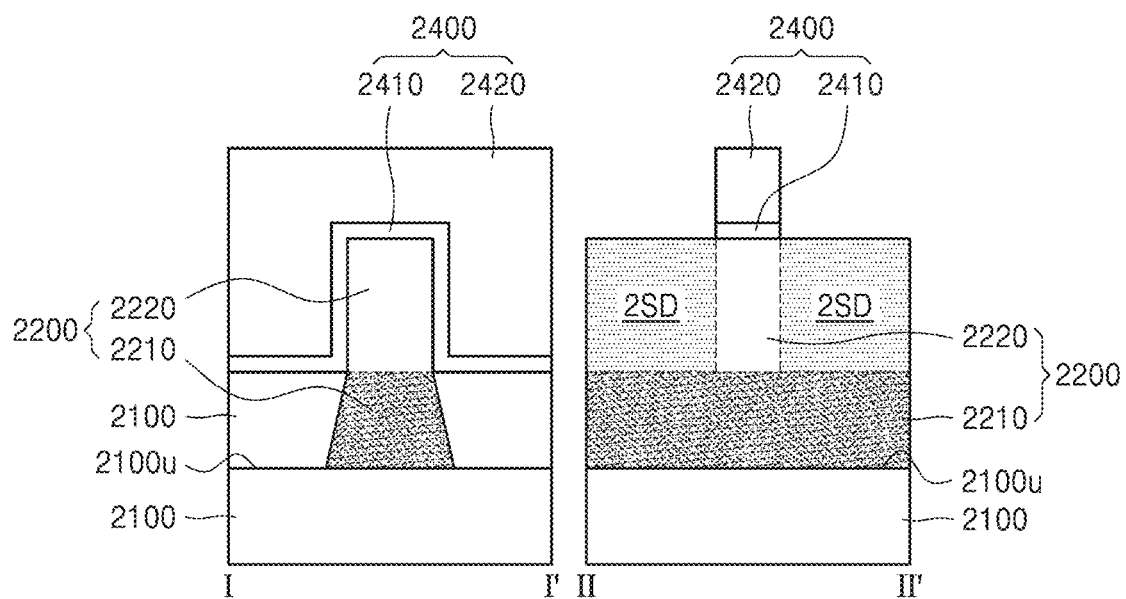

Referring to FIGS. 30, 37, and 38, a pair of source/drain regions 2SD may be respectively formed in portions of the channel fin 2220 exposed on both side surfaces of the gate structure 2400. (operation S2160) A process of forming the pair of source/drain regions 2SD may include doping the portions of the channel fin 2220 exposed on both side surfaces of the gate structure 2400. For example, a doping process may include an ion implantation process. The pair of source/drain regions 2SD may have the second conductivity type different from the first conductivity type. When the first conductivity type is p-type, the second conductivity type may be n-type. When the conductivity type of the pair of source/drain regions 2SD is n-type, group V elements (e.g., P or As) may be implanted into the portions of the channel fin 2220 exposed on both side surfaces of the gate structure 2400. When the first conductivity type is n-type, the second conductivity type may be p-type. When the conductivity type of the pair of source/drain regions 2SD is p-type, a group III element (e.g., B or In) may be implanted into the portions of the channel fin 2220 exposed on both side surfaces of the gate structure 2400. One of the pair of source/drain regions 2SD may be a source of a transistor 22210, and the other one may be a drain of the transistor 22210.

In an embodiment, an upper insulation layer (not shown) may be deposited on the pair of source/drain regions 2SD. For example, a deposition process may include a CVD process, a PVD process, or an ALD process. For example, the upper insulation layer may include $SiO_2$ or a high-k material (e.g., SiON, $HfO_2$, or $ZrO_2$).

In an embodiment, the threshold voltage of the transistor 22210 may be adjusted by a doping concentration of the channel fin 2220 and/or the work function of the gate electrode 2420. For example, the work function of the gate electrode 2420 may be controlled by the material constituting the gate electrode 2420 or by an additional work function control layer (not shown). For example, the additional work function control layer may be disposed between the gate insulation layer 2410 and the channel fin 2220.

The pair of source/drain regions 2SD and the constant current forming fin 2210 may be electrically connected to each other. For example, the pair of source/drain regions 2SD may directly contact the constant current forming fin 2210. An electric field may be formed between the pair of source/drain regions 2SD and the constant current forming fin 2210. For example, the intensity of the electric field may be $10^6$ V/cm or higher.

A constant current passing through the substrate 2100, the constant current forming fin 2210, and any one of the pair of source/drain patterns 2SD serving as a drain may be generated. The constant current may be a band-to-band tunneling (BTBT) current formed between any one of the pair of source/drain patterns 2SD serving as the drain and the constant current forming fin 2210. The constant current may be independent from a gate voltage applied to the gate electrode 2420. In other words, the constant current may flow regardless of the gate voltage. When the transistor 22210 is an NMOS transistor, a constant current may flow from any one of the pair of source/drain patterns 2SD serving as the drain to the substrate 2100 through the constant current forming fin 2210. When the transistor 22210 is a PMOS transistor, a constant current may flow from the substrate 2100 to any one of the pair of source/drain patterns 2SD serving as the drain through the constant current forming fin 2210.

The present disclosure may provide the transistor 22210 in which a constant current flows between the constant current forming fin 2210 and any one of the pair of source/drain patterns 2SD serving as the drain.

Figure 39:
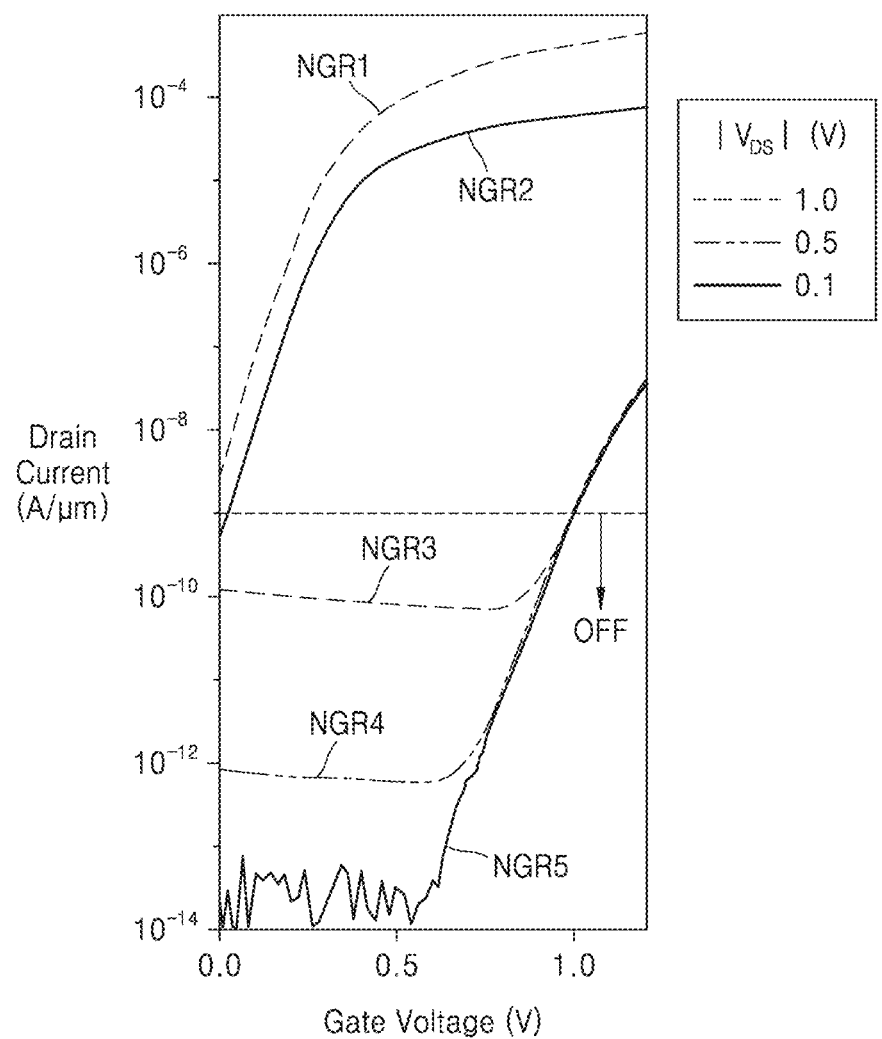
FIG. 39 shows gate voltage-drain current graphs of NMOS transistors according to the present disclosure and conventional NMOS transistors.

FIG. 39 shows gate voltage-drain current graphs of NMOS transistors according to the present disclosure and conventional NMOS transistors.

Referring to FIG. 39, gate voltage-drain current graphs NGR1 and NGR2 of conventional NMOS transistors and gate voltage-drain current graphs NGR3, NGR4, and NGR5 of NMOS transistors according to the present disclosure are shown.

Drain currents of the conventional NMOS transistors do not have a constant current component that flows regardless of a gate voltage.

Drain currents of the NMOS transistors of the present disclosure have a constant current component that flows regardless of a gate voltage. For example, even when the NMOS transistors of the present disclosure are in an OFF state, a constant current flows through the NMOS transistors of the present disclosure.

Figure 40:
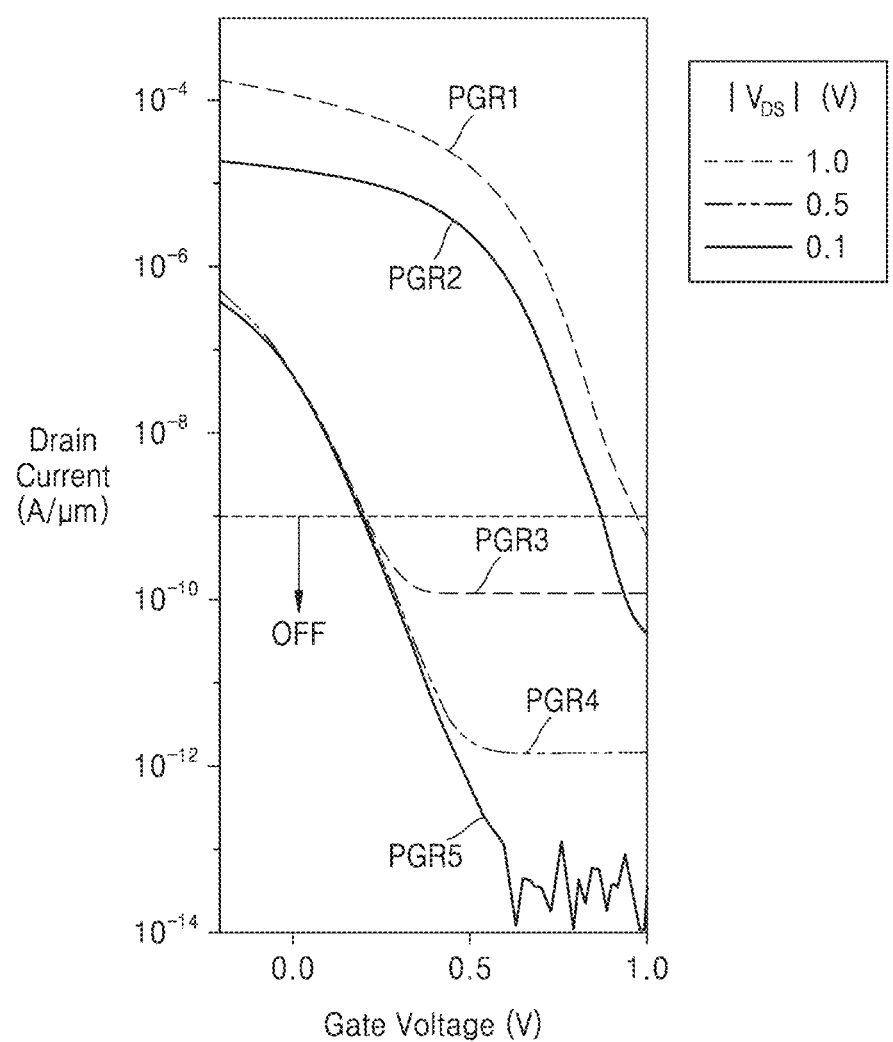
FIG. 40 shows gate voltage-drain current graphs of PMOS transistors according to the present disclosure and conventional PMOS transistors.

FIG. 40 shows gate voltage-drain current graphs of PMOS transistors according to the present disclosure and conventional PMOS transistors.

Referring to FIG. 40, gate voltage-drain current graphs PGR1 and PGR2 of conventional PMOS transistors and gate voltage-drain current graphs PGR3, PGR4, and PGR5 of PMOS transistors of the present disclosure are shown.

Drain currents of the conventional PMOS transistors do not have a constant current component that flows regardless of a gate voltage.

Drain currents of the PMOS transistors of the present disclosure have a constant current component that flows regardless of a gate voltage. For example, even when the PMOS transistors of the present disclosure are in an OFF state, a constant current flows through the PMOS transistors of the present disclosure.

Figure 41:
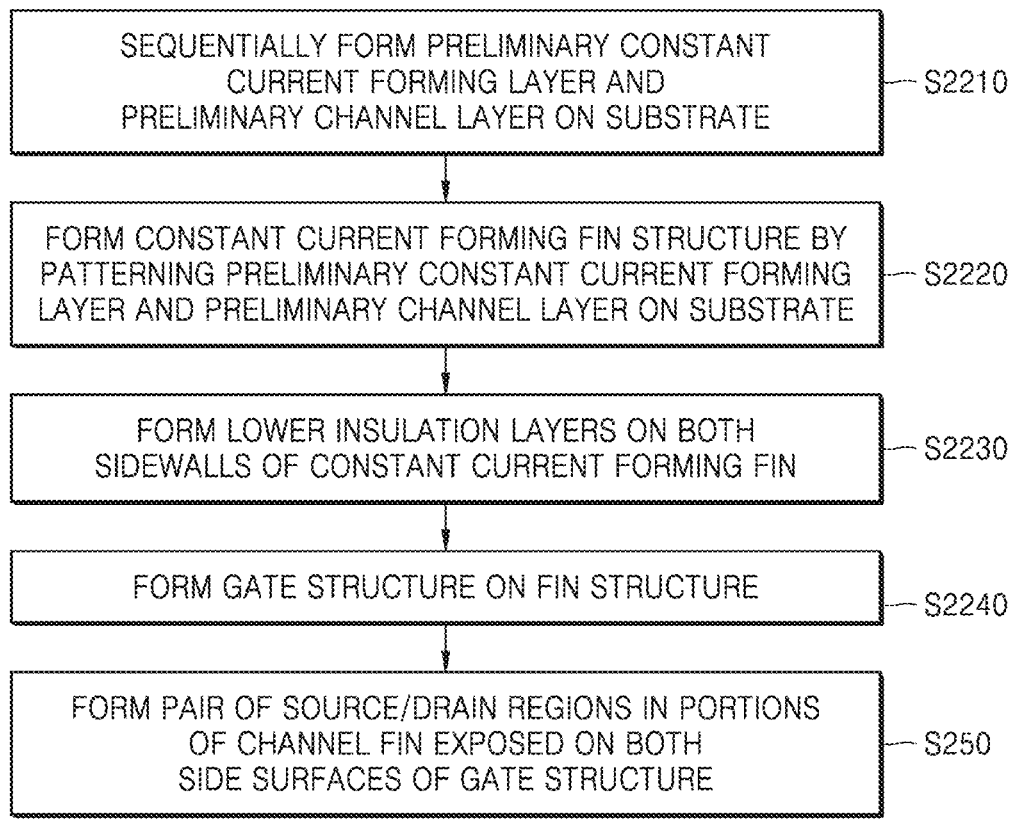
FIG. 41 is a flowchart of a method of manufacturing a transistor according to an example embodiment.
Figure 42:
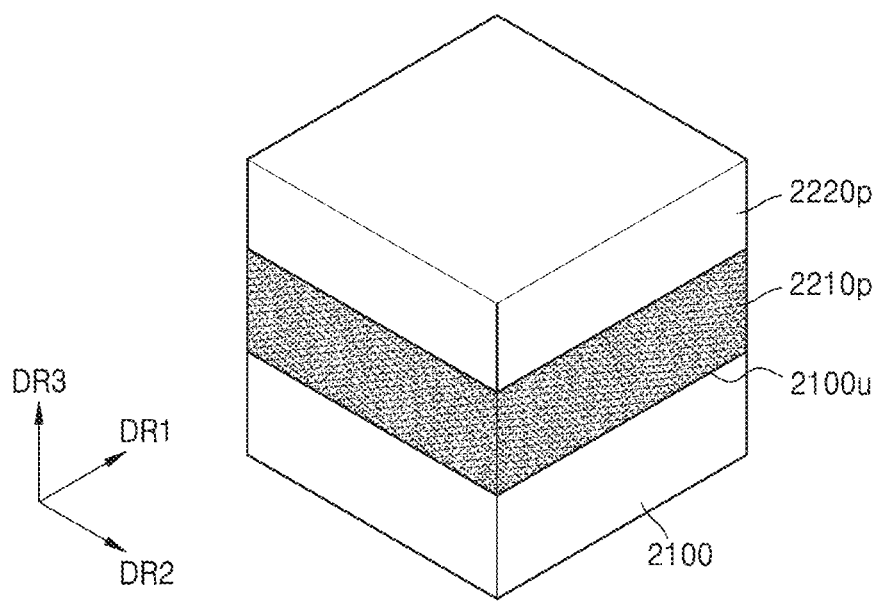
FIGS. 42 and 43 are perspective views for describing the method of manufacturing a transistor of FIG. 41.
Figure 43:
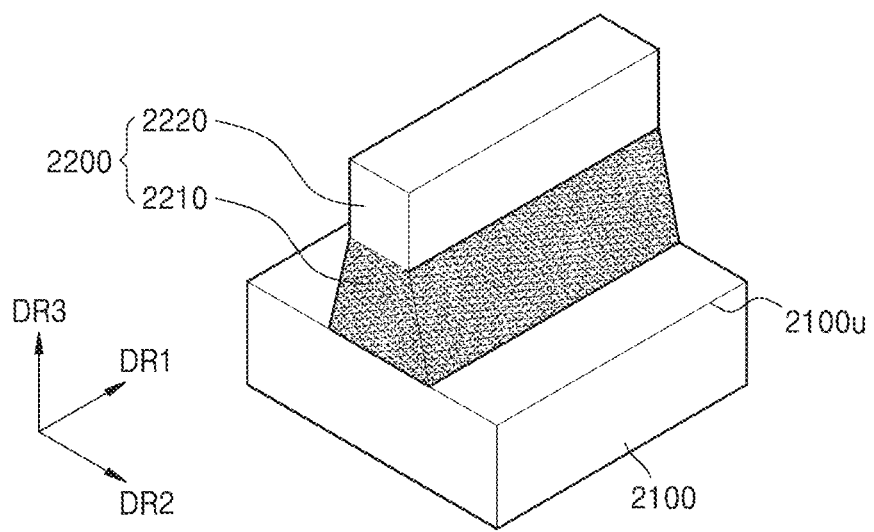

FIG. 41 is a flowchart of a method of manufacturing a transistor according to an example embodiment. FIGS. 42 and 43 are perspective views for describing the method of manufacturing a transistor of FIG. 41. For brevity of description, descriptions substantially identical to those given above with reference to FIGS. 30 to 38 may not be given.

Referring to FIGS. 41 and 42, the preliminary constant current forming layer 2210p and a preliminary channel layer 220p may be sequentially formed on the substrate 2100 (operation S2210). The substrate 2100 and the preliminary constant current forming layer 2210p may be substantially identical to the substrate 2100 and the preliminary constant current forming layer 2210p described with reference to FIGS. 30 and 31, respectively.

The preliminary channel layer 220p may be formed through an epitaxial growth process. In other words, the preliminary channel layer 220p may be an epitaxial layer. For example, the preliminary channel layer 220p may include silicon (Si). The preliminary channel layer 220p may have the first conductivity type. When the conductivity type of the preliminary channel layer 220p is n-type, the preliminary channel layer 220p may include a group V element (e.g., P or As) as an impurity. When the conductivity type of the preliminary channel layer 220p is p-type, the preliminary channel layer 220p may include a group III element (e.g., B or In) as an impurity. The doping concentration of the preliminary channel layer 220p may be lower than that of the preliminary constant current forming layer 2210p. For example, the doping concentration of the preliminary channel layer 220p may be substantially identical to that of the substrate 2100.

Referring to FIGS. 41 and 43, the preliminary channel layer 220p and the preliminary constant current forming layer 2210p may be patterned, thereby forming the fin structure 2200 (operation S2220). The fin structure 2200 may include the constant current forming fin 2210 and the channel fin 2220. The constant current forming fin 2210 and the channel fin 2220 may be substantially identical to the constant current forming fin 2210 and the channel fin 2220 described with reference to FIGS. 30 to 38, respectively.

Referring to FIGS. 34 and 41, a lower insulation layer 2310 may be formed on both side surfaces of the constant current forming fin 2210 (operation S2230). The lower insulation layer 2310 may be formed on the substrate 2100. A process of forming the lower insulation layer 2310 may include a process of depositing an electrically insulating material on the substrate 2100 and a process of exposing the top surface of the channel fin 2220 by etching the deposited electrically insulating material. A deposition process may include a CVD process, a PVD process, or an ALD process. The lower insulation layer 2310 may include, for example, $SiO_2$ or a high-k material (e.g., SiON, $HfO_2$, or $ZrO_2$). The lower insulation layer 2310 may cover both side surfaces of the constant current forming fin 2210.

Referring to FIG. 41, the gate structure 2400 may be formed on the fin structure 2200. (operation S2240) A method of forming the gate structure 2400 may be substantially identical to the method of forming the gate structure 2400 described with reference to FIGS. 30, 35, and 36.

The pair of source/drain regions 2SD may be formed in portions of the channel fin 2220 exposed on both side surfaces of the gate structure 2400 (operation S2250). A method of forming the pair of source/drain regions 2SD may be substantially identical to the method of forming the pair of source/drain regions 2SD described with reference to FIGS. 30, 37, and 38.

In an embodiment, an upper insulation layer (not shown) may be deposited on the pair of source/drain regions 2SD. For example, a deposition process may include a CVD process, a PVD process, or an ALD process. For example, the upper insulation layer may include $SiO_2$ or a high-k material (e.g., SiON, $HfO_2$, or $ZrO_2$).

The present disclosure may provide the transistor 22210 in which a constant current flows between the constant current forming layer 2200 and the pair of source/drain patterns 2SD.

Figure 44:
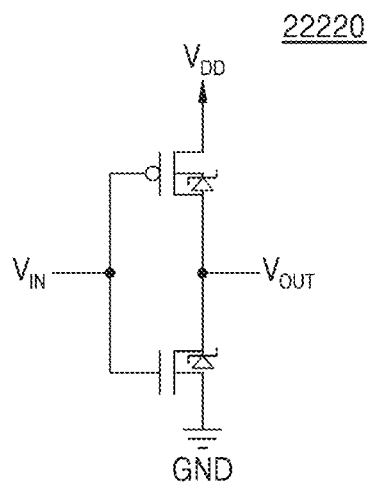
FIG. 44 is a circuit diagram of a ternary inverter according to example embodiments.

FIG. 44 is a circuit diagram of a ternary inverter according to example embodiments. For brevity of description, descriptions substantially identical to those given above with reference to FIGS. 30 to 38 and those given above with reference to FIGS. 41 to 43 may not be given.

Referring to FIG. 44, a ternary inverter 22220 including an NMOS transistor and a PMOS transistor may be provided. The NMOS transistor and the PMOS transistor may each be substantially identical to the transistor 22210 described with reference to FIGS. 30 to 38 or FIGS. 41 to 43. The conductivity type of the substrate 2100 and the constant current forming fin 2210 of the NMOS transistor may be p-type. The conductivity type of the pair of source/drain regions 2SD of the NMOS transistor may be n-type. The conductivity type of the substrate 2100 and the constant current forming fin 2210 of the PMOS transistor may be n-type. The conductivity type of the pair of source/drain regions 2SD of the PMOS transistor may be p-type.

A ground voltage may be applied to a source and a substrate of the NMOS transistor. For brevity of explanation, it is assumed that the ground voltage is 0 volts (V) hereinafter. A driving voltage $V_{DD}$ may be applied to the source and the substrate of the PMOS transistor. An input voltage Vin may be applied to each of a gate electrode of the NMOS transistor and a gate electrode of the PMOS transistor.

A drain of the NMOS transistor may be electrically connected to a drain of the PMOS transistor and may have the same voltage. The voltage of the drain of the NMOS transistor and the drain of the PMOS transistor may be an output voltage Vout of the ternary inverter 22220.

A constant current may flow from the drain of the NMOS transistor to the substrate of the NMOS transistor. A constant current may flow from the substrate of the PMOS transistor to the drain of the PMOS transistor. The constant currents may be independent of the input voltage Vin.

In an embodiment, a first input voltage may be applied to the gate electrode of the PMOS transistor and the gate electrode of the NMOS transistor, such that the PMOS transistor has a constant current dominant over a channel current and the NMOS transistor has a channel current dominant over a constant current. In this case, the output voltage Vout of the ternary inverter 22220 may be a first voltage.

In another embodiment, a second input voltage may be applied to the gate electrode of the NMOS transistor and the gate electrode of the PMOS transistor, such that the NMOS transistor has a constant current dominant over a channel current and the PMOS transistor has a channel current dominant over a constant current. In this case, the output voltage of the ternary inverter 22220 may be a second voltage greater than the first voltage.

In another embodiment, a third input voltage may be applied to the gate electrode of the PMOS transistor and the gate electrode of the NMOS transistor, such that each of the NMOS transistor and the PMOS transistor has a constant current that is dominant over the channel current. In this case, the output voltage of the ternary inverter 22220 may be a third voltage between the first voltage and the second voltage.

The constant current flowing from the drain of the NMOS transistor to the substrate of the NMOS transistor and the constant current flowing from the substrate of the PMOS transistor to the drain of the PMOS transistor may flow regardless of gate voltages applied to the gate electrodes of the PMOS transistor and the NMOS transistor. A current in the ternary inverter 22220 may flow from the substrate of the PMOS transistor to the substrate of the NMOS transistor through the drain of the PMOS transistor and the drain of the NMOS transistor. The driving voltage $V_{DD}$ applied to the substrate of the PMOS transistor may be distributed to a resistor between the substrate of the PMOS transistor and the drain of the PMOS transistor and a resistor between the substrate of the NMOS transistor and the drain of the NMOS transistor. The output voltage Vout may be a voltage applied to the resistor between the substrate of the NMOS transistor and the drain of the NMOS transistor. The output voltage Vout may have a value between the driving voltage $V_{DD}$ and 0 V.

The output voltage Vout may have a state of 0 V ('0' state), a state of a voltage between the driving voltage $V_{DD}$ and 0 V ('1' state), or a state of the driving voltage $V_{DD}$ ('2' state) according to the input voltage Vin. The present disclosure may provide the ternary inverter 22220 having three states according to the input voltage Vin.

Figure 45:
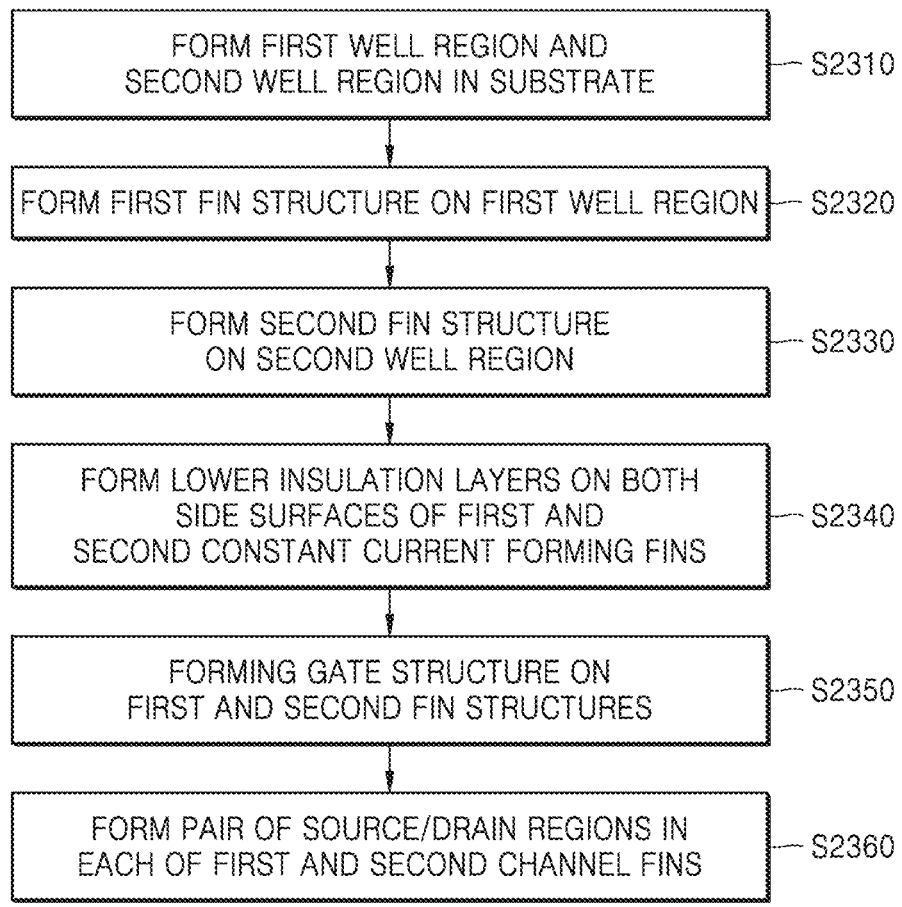
FIG. 45 is a flowchart of a method of manufacturing a ternary inverter according to an example embodiment.

FIG. 45 is a flowchart of a method of manufacturing a ternary inverter according to an example embodiment. FIGS. 48 to 51 are perspective views for describing a method of manufacturing the ternary inverter of FIG. 45. For brevity of description, descriptions substantially identical to those given above with reference to FIGS. 30 to 38 and those given above with reference to FIGS. 41 to 43 may not be given.

Figure 46:
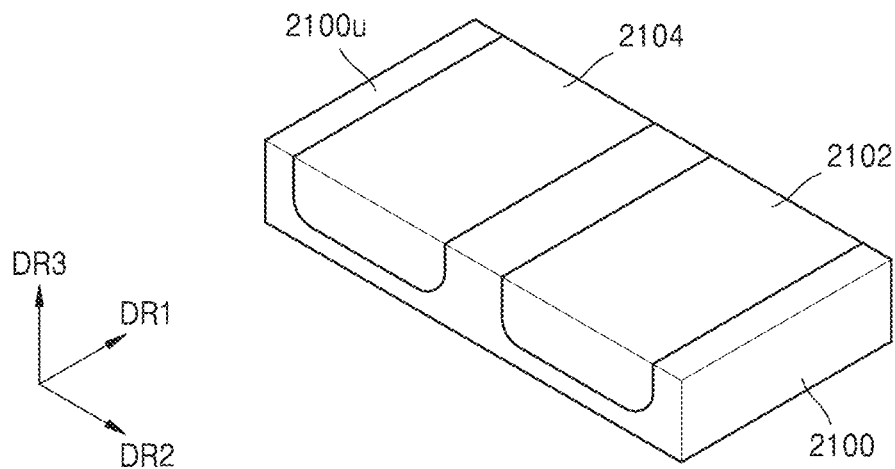
FIGS. 46 to 51 are perspective views for describing a method of manufacturing the ternary inverter of FIG. 45.

Referring to FIGS. 45 and 46, a first well region 2102 and a second well region 2104 may be formed in the substrate 2100 (operation S2310). The substrate 2100 may be a silicon (Si) substrate. The substrate 2100 may be substantially identical to the substrate 2100 described with reference to FIGS. 30 and 31.

The first well region 2102 and the second well region 2104 may extend in the first direction DR1 parallel to the top surface 2100u of the substrate 2100. The first well region 2102 and the second well region 2104 may be arranged in the second direction DR2 parallel to the top surface 2100u of the substrate 2100. The first direction DR1 and the second direction DR2 may intersect each other. The conductivity type of the first well region 2102 may be p-type. The first well region 2102 may include a group III element (e.g., B or In) as an impurity. The conductivity type of the second well region 2104 may be n-type. The second well region 2104 may include a group V element (e.g., P or As) as an impurity. For example, a process of forming the first well region 2102 and the second well region 2104 may include an ion implantation process.

Figure 47:
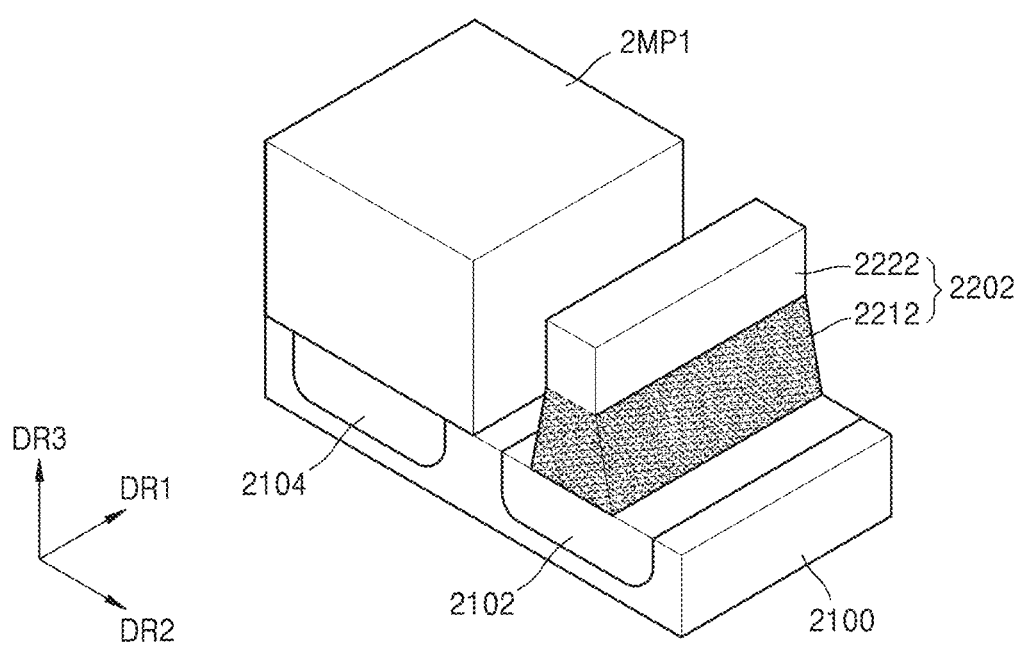

Referring to FIGS. 45 and 47, a first fin structure 2202 may be formed on the first well region 2102 (operation S2320). A method of forming the first fin structure 2202 may be substantially identical to the method of forming the fin structure 2200 described with reference to FIGS. 41 to 43. While the first fin structure 2202 is being formed, the second well region 2104 may be covered by a first mask pattern MP1. The first fin structure 2202 may have the same conductivity type as that of the first well region 2102. The first fin structure 2202 may include a p-type first constant current forming fin 2212 and a p-type first channel fin 2222. After the first fin structure 2202 is formed, the first mask pattern MP1 may be removed.

Figure 48:
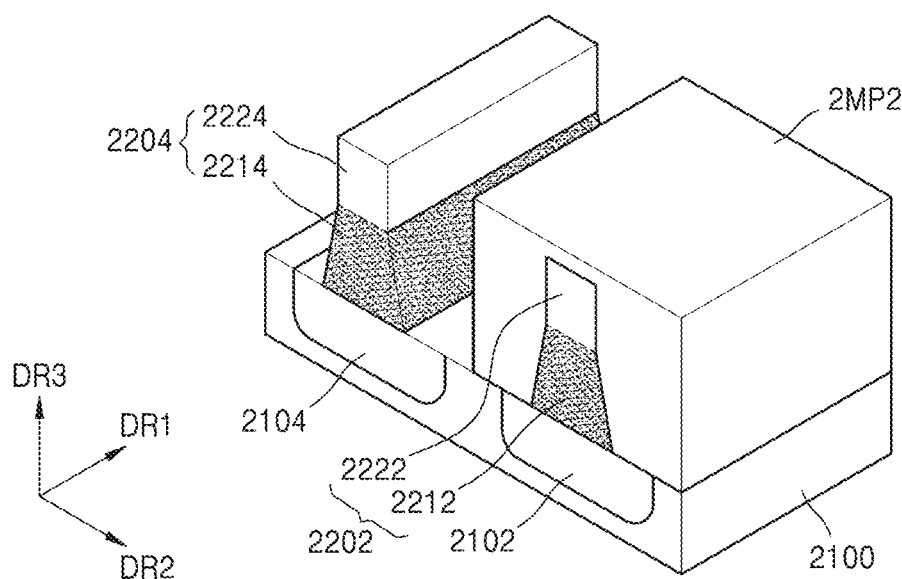

Referring to FIGS. 45 and 48, a second fin structure 2204 may be formed on the second well region 2104 (operation S2330). A method of forming the second fin structure 2204 may be substantially identical to the method of forming the fin structure 2200 described with reference to FIGS. 41 to 43. While the second fin structure 2204 is being formed, the first fin structure 2202 may be covered by a second mask pattern MP2. The second fin structure 2204 may have the same conductivity type as that of the second well region 2104. The second fin structure 2204 may include an n-type second constant current forming fin 2214 and an n-type second channel fin 2224. After the second fin structure 2204 is formed, the second mask pattern MP2 may be removed.

Figure 49:
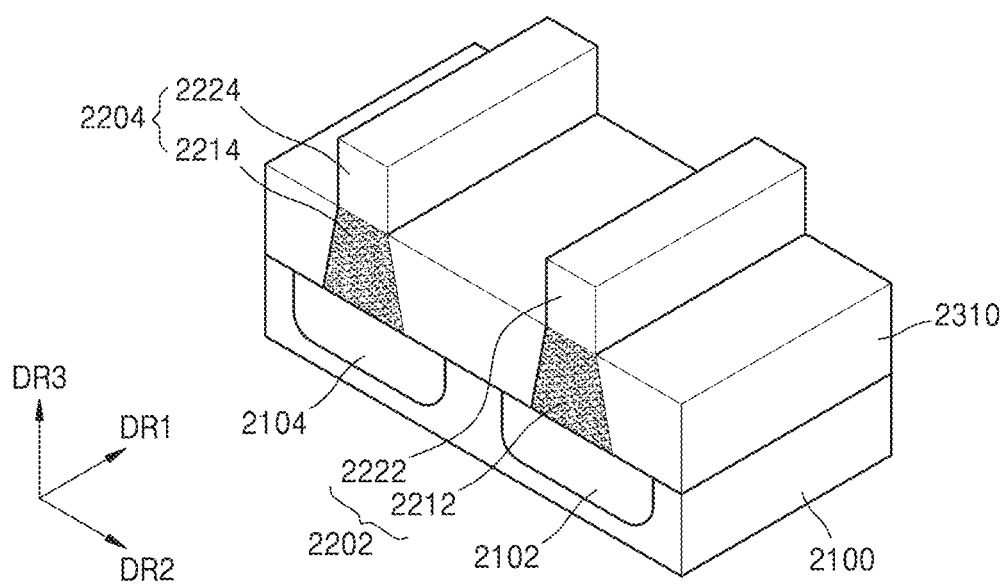

Referring to FIGS. 45 and 49, a lower insulation layers 2310 may be formed on both side surfaces of the first constant current forming fin 2212 and on both side surfaces of the second constant current forming fin 2214 (operation S2340). Both side surfaces of the first constant current forming fin 2212 and both side surfaces of the second constant current forming fin 2214 may extend in the first direction DR1. The formation of the lower insulation layer 2310 may be substantially identical to that described with reference to FIGS. 30 and 33.

Figure 50:
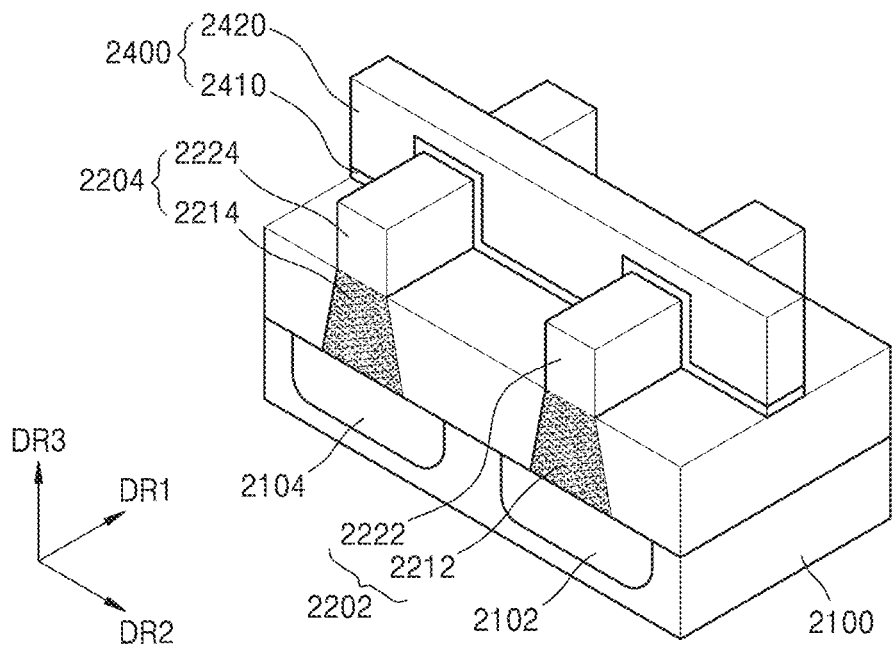

Referring to FIGS. 45 and 50, the gate structure 2400 may be formed on first and second fin structures 202 and 204 (operation S2350). The gate structure 2400 may include the gate insulation layer 2410 and the gate electrode 2420 that are sequentially stacked. The gate structure 2400 may intersect the first channel fin 2222 and the second channel fin 2224. For example, when viewed in the third direction DR3, the gate structure 2400 may extend in the second direction DR2. The gate structure 2400 may extend along surfaces of the lower insulation layer 2310, the first channel fin 2222, and the second channel fin 2224. The formation of the gate structure 2400 may be substantially identical to that described with reference to FIGS. 30 and 35.

Figure 51:
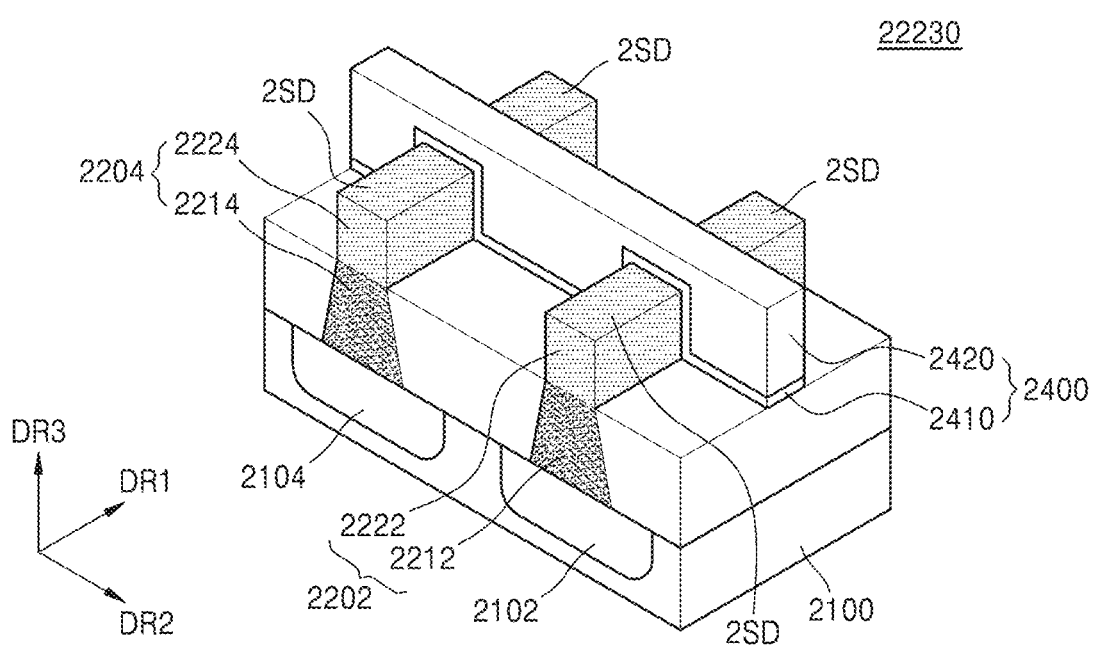

Referring to FIGS. 45 and 51, the pair of source/drain regions 2SD may be formed in each of the portions of the first channel fin 2222 and the second channel fin 2224 exposed on both side surfaces of the gate structure 2400 (operation S2360). The pair of source/drain regions 2SD may be spaced apart from each other across the gate structure 2400 therebetween. The pair of source/drain regions 2SD formed in the first channel fin 2222 may have a conductivity type different from that of the first constant current forming fin 2212. For example, the conductivity type of the pair of source/drain regions 2SD formed in the first channel fin 2222 may be n-type. For example, the pair of source/drain regions 2SD formed in the first channel fin 2222 may include a group V element (e.g., P or As) as an impurity. The pair of source/drain regions 2SD formed in the second channel fin 2224 may have a conductivity type different from that of the second constant current forming fin 2214. For example, the conductivity type of the pair of source/drain regions 2SD formed in the second channel fin 2224 may be p-type. For example, the pair of source/drain regions 2SD formed in the second channel fin 2224 may include a group III element (e.g., B or In) as an impurity. The formation of the pair of source/drain regions 2SD in each of the first channel fin 2222 and the second channel fin 2224 may be substantially identical to that described with reference to FIGS. 30, 36, and 37.

In an embodiment, an upper insulation layer (not shown) may be deposited on the pair of source/drain regions 2SD. For example, a deposition process may include a CVD process, a PVD process, or an ALD process. For example, the upper insulation layer may include $SiO_2$ or a high-k material (e.g., SiON, $HfO_2$, or $ZrO_2$).

The present disclosure may provide a ternary inverter 22230. The ternary inverter 22230 may be substantially identical to the ternary inverter 22220 described with reference to FIG. 44. The first well region 2102, the first fin structure 2202, the gate structure 2400, and the pair of source/drain regions 2SD formed in the first channel fin 2222 may be an NMOS transistor. The second well region 2104, the second fin structure 2204, the gate structure 2400, and the pair of source/drain regions 2SD formed in the second channel fin 2224 may constitute a PMOS transistor.

The driving voltage $V_{DD}$ may be applied to the second well region 2104 and a source of the pair of source/drain regions 2SD formed in the second channel fin 2224. The ground voltage may be applied to the first well region 2102 and a source of the pair of source/drain regions 2SD formed in the first channel fin 2222. The input voltage Vin may be applied to the gate electrode 2420. A drain of the pair of source/drain regions 2SD formed in the second channel fin 2224 and a drain of the pair of source/drain regions 2SD formed in the first channel fin 2222 may be electrically connected to each other and may have the same voltage. The voltage of the drain of the pair of source/drain regions 2SD formed in the second channel fin 2224 and the drain of the pair of source/drain regions 2SD formed in the first channel fin 2222 may be the output voltage Vout of the ternary inverter 22230.

A constant current (i.e., a constant current of the PMOS transistor) may flow from the second well region 2104 to the drain of the pair of source/drain regions 2SD formed in the second channel fin 2224. A constant current (i.e., a constant current of the NMOS transistor) may flow from the drain of the pair of source/drain regions 2SD formed in the first channel fin 2222 to the first well region 2102. The constant currents may be independent of the input voltage Vin.

The driving mode of the ternary inverter 22230 may be substantially identical to the driving mode of the ternary inverter 22220 described with reference to FIG. 44.

As described with reference to FIG. 44, the output voltage Vout of the ternary inverter 22230 may have a state of 0 V ('0' state), a state of a voltage between the driving voltage $V_{DD}$ and 0 V ('1' state), or a state of the driving voltage $V_{DD}$ ('2' state). The present disclosure may provide the ternary inverter 22230 having three states according to the input voltage Vin.

Figure 52:
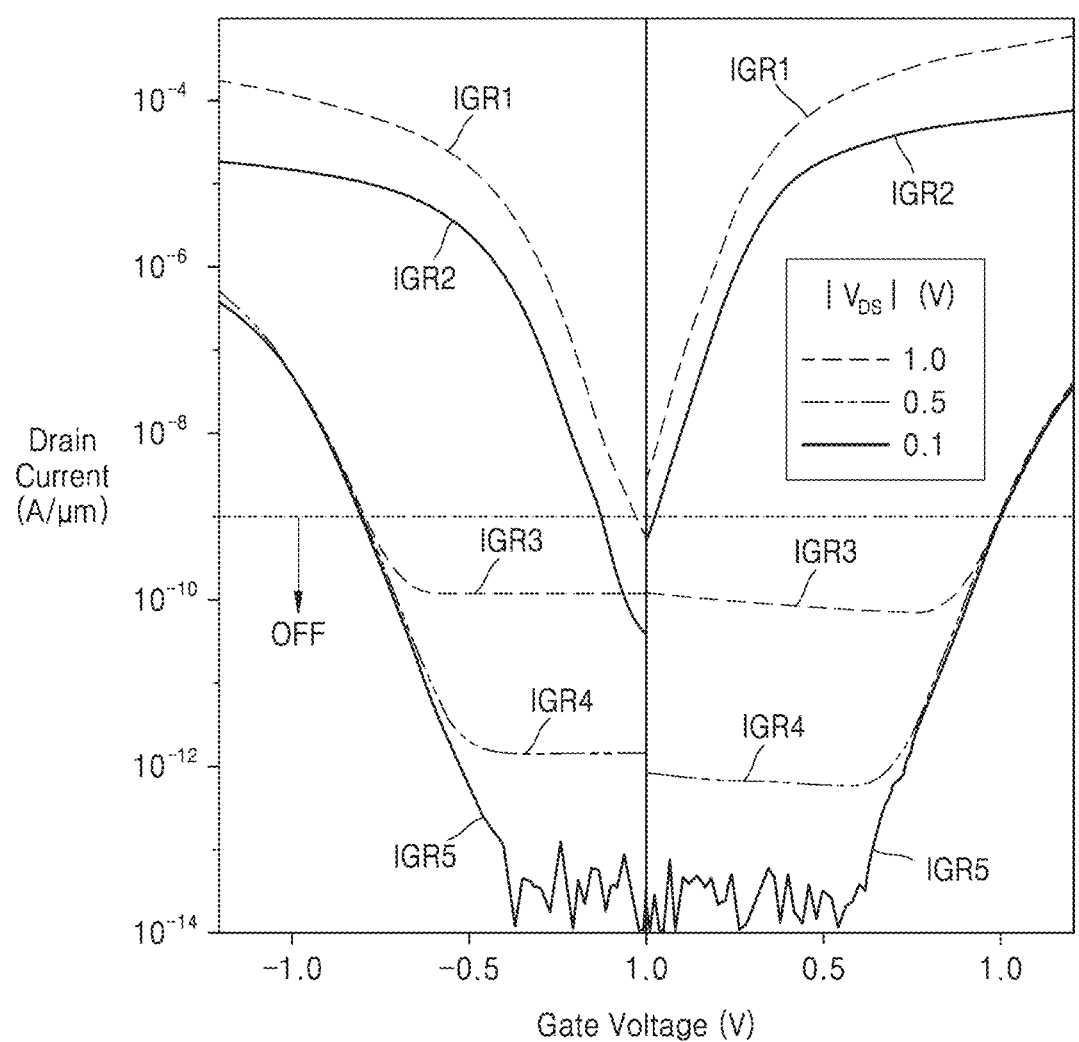
FIG. 52 is a gate voltage-drain current graph of ternary inverters of the present disclosure and binary inverters.

FIG. 52 is a gate voltage-drain current graph of ternary inverters of the present disclosure and binary inverters.

Referring to FIG. 52, gate voltage-drain current graphs IGR1 and IGR2 of binary inverters and gate voltage-drain current graphs IGR3, IGR4, and IGR5 of ternary inverters of the present disclosure are shown.

Drain currents of binary inverters do not have a constant current component that flows regardless of a gate voltage.

Drain currents of the ternary inverters of the present disclosure have a constant current component that flows regardless of a gate voltage. For example, even when the ternary inverters of the present disclosure are in an OFF state, a constant current flows through the ternary inverters of the present disclosure.

Figure 53:
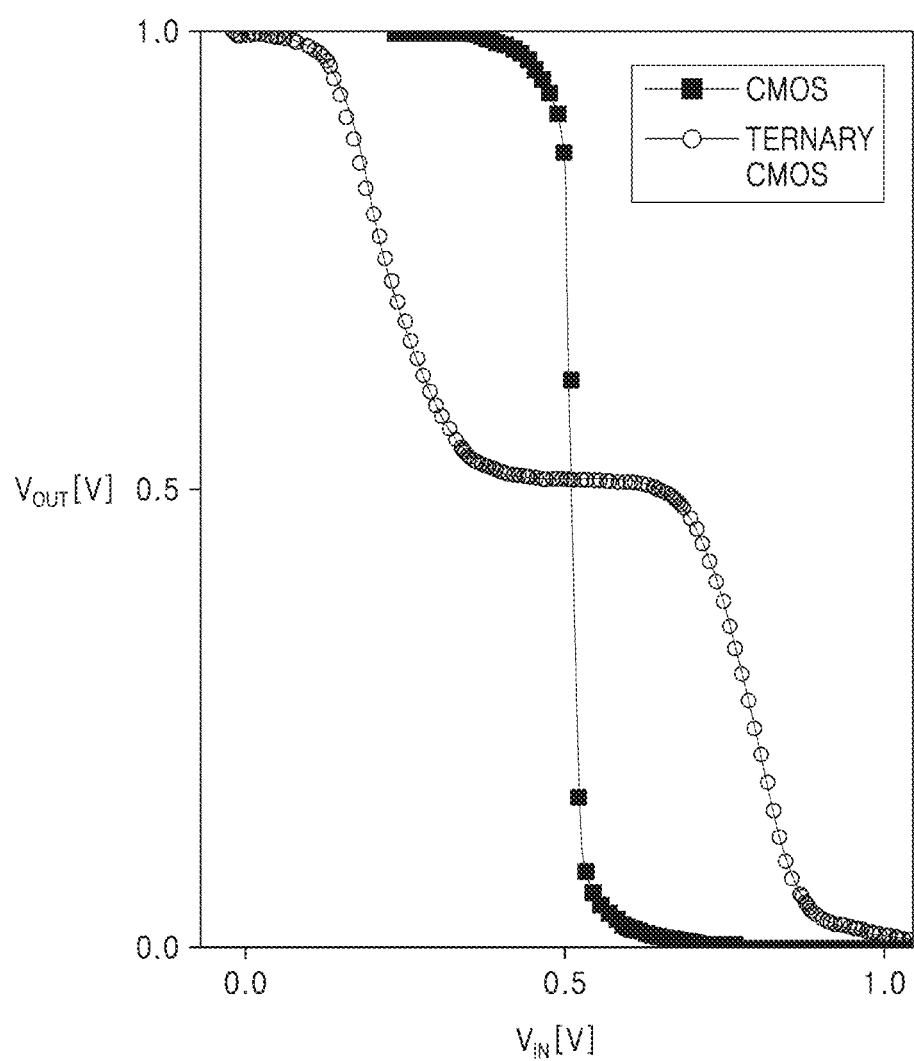
FIG. 53 is a graph showing an input voltage Vin-output voltage Vout of a ternary inverter of the present disclosure and a binary inverter.

FIG. 53 is a graph showing an input voltage Vin-output voltage Vout of a ternary inverter of the present disclosure and a binary inverter.

Referring to FIG. 53, the driving voltage $V_{DD}$ of the ternary inverter of the present disclosure and the binary inverter was 1.0 V, and the ground voltage GND was 0 V. The input voltage Vin of the ternary inverter and the binary inverter was from 0 V to 1.0 V.

In the case of the binary inverter, when the input voltage was changed from 0 V to 1 V, the output voltage Vout rapidly decreased from 1 V to 0 V when the input voltage was nearby 0.5 V. In other words, the binary inverter had two states (e.g., a '0' state and a '1' state).

In the case of the ternary inverter of the present disclosure, when the input voltage was changed from 0 V to 1 V, the output voltage Vout rapidly decreased from 1 V to 0.5 V, maintained 0.5 V, and then rapidly decreased from 0.5 V to 0 V again. In other words, the ternary inverter of the present disclosure had three states (e.g., a '0' state, a '1' state, and a '2' state).

Figure 54:
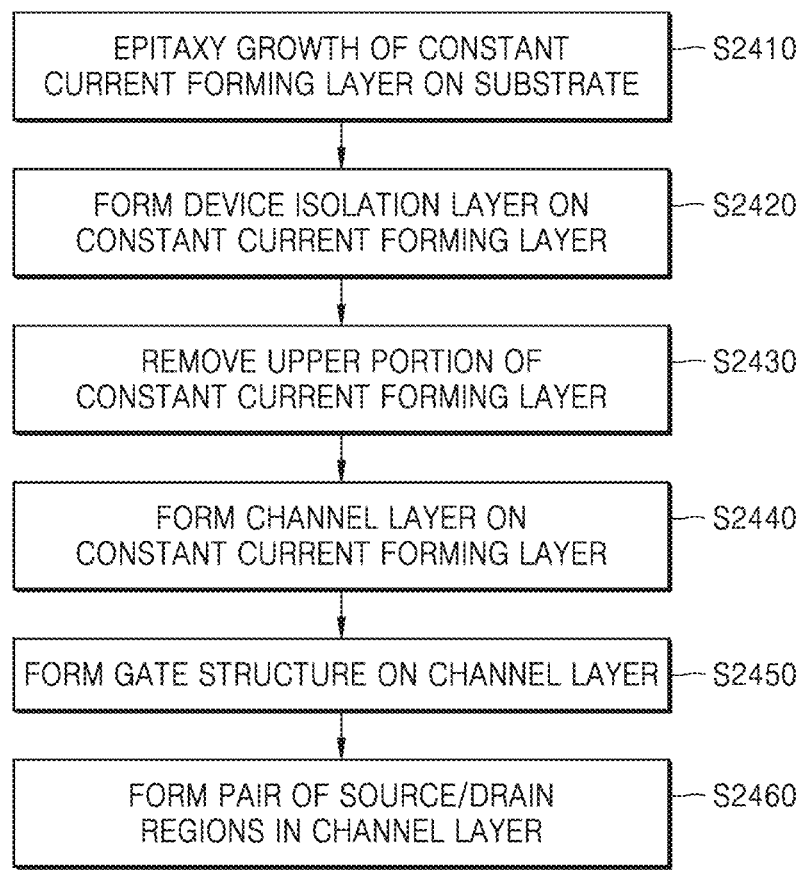
FIG. 54 is a flowchart of a method of manufacturing a transistor according to an example embodiment.

FIG. 54 is a flowchart of a method of manufacturing a transistor according to an example embodiment. FIGS. 55 to 60 are cross-sectional views for describing the method of manufacturing a transistor of FIG. 54. For brevity of description, descriptions substantially identical to those given above with reference to FIGS. 30 to 9 may not be given.

Figure 55:
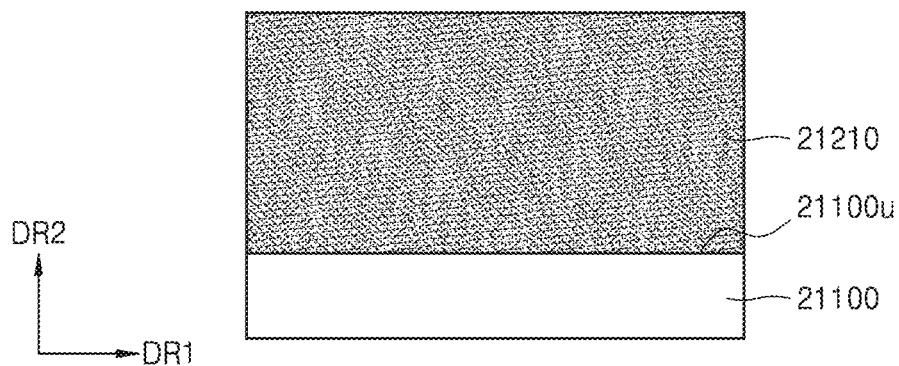
FIGS. 55 to 60 are cross-sectional views for describing the method of manufacturing a transistor of FIG. 54.

Referring to FIGS. 54 and 55, a constant current forming layer 21210 may be formed on a substrate 21100 (operation S2410). The substrate 21100 may be a semiconductor substrate. For example, the substrate 21100 may include silicon (Si). The substrate 21100 may have the first conductivity type. For example, the first conductivity type may be n-type or p-type. Men the conductivity type of the substrate 21100 is n-type, the substrate 21100 may include a group V element (e.g., P or As) as an impurity. When the conductivity type of the substrate 21100 is p-type, the substrate 21100 may include a group III element (e.g., B or In) as an impurity.

The constant current forming layer 21210 may be formed through an epitaxial growth process. In other words, the constant current forming layer 21210 may be an epitaxial layer. A process of forming the constant current forming layer 21210 may be substantially identical to the process of forming the preliminary constant current forming layer 2210p described with reference to FIGS. 30 and 31.

Figure 56:
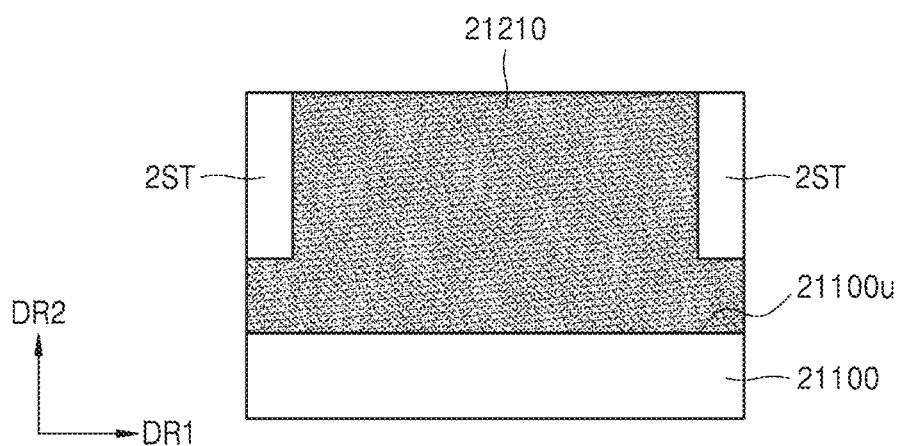

Referring to FIGS. 54 and 56, a device isolation layer 2SL may be formed on the constant current forming layer 21210 (operation S2420). For example, a process of forming the device isolation layer 2SL may include forming a recessed region in the constant current forming layer 21210 through an anisotropic etching process using an etching mask provided on the constant current forming layer 21210 and filling the recessed region with an insulating material. The etching mask may be removed during or after an etching process. For example, the insulating material may include $SiO_2$.

Figure 57:
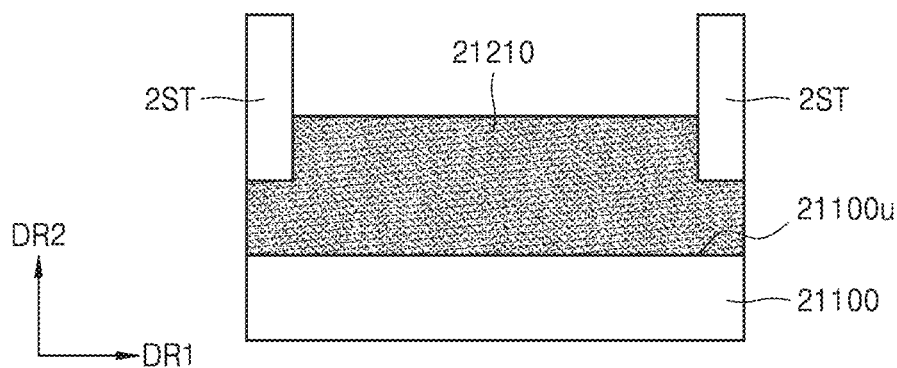

Referring to FIGS. 54 and 57, the upper portion of the constant current forming layer 21210 may be removed (operation S2430). A process of removing the upper portion of the constant current forming layer 21210 may include performing an etching process using an etching mask provided on the device isolation layer 2SL. The etching mask may be removed during or after an etching process. An etching depth of the etching process may be shallower than the depth of the device isolation layer 2SL. In other words, the top surface of the constant current forming layer 21210 remaining after the etching process may be located at a position higher than the bottom surface of the device isolation layer 2SL.

Figure 58:
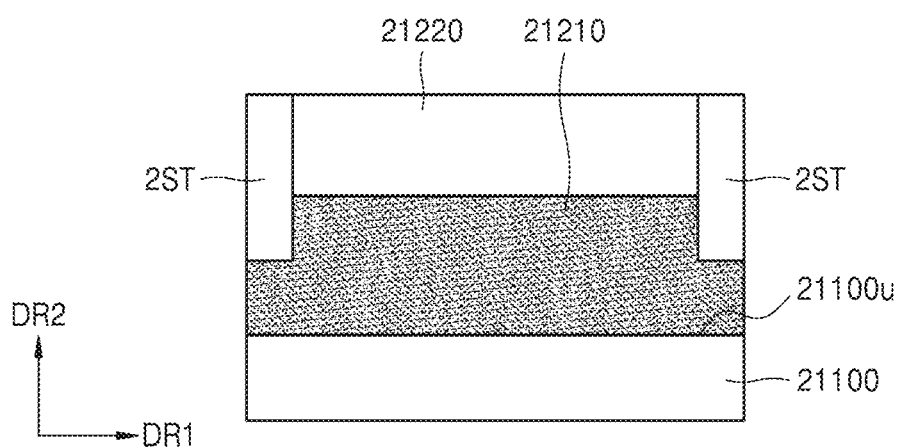

Referring to FIGS. 54 and 58, a channel layer 21220 may be formed on the constant current forming layer 21210 (operation S2440). A process of forming the channel layer 21220 may include depositing a doped semiconductor material film on the substrate 21100 and etching the doped semiconductor material film. A process of etching the doped semiconductor material layer may be performed until the device isolation layer 2SL is exposed.

Figure 59:
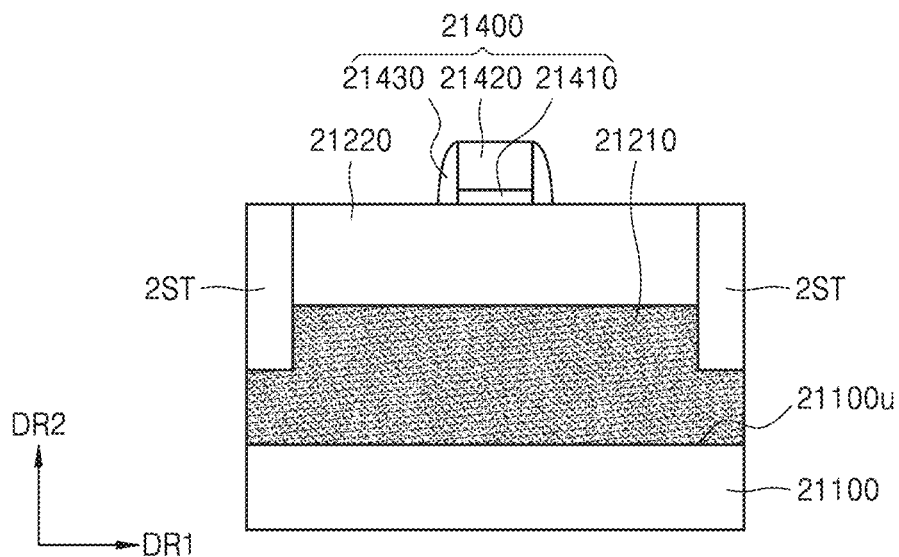

Referring to FIGS. 54 and 59, a gate structure 21400 may be formed on the channel layer 21220 (operation S2450). The gate structure 21400 may include a gate insulation layer 21410 and a gate electrode 21420 that are sequentially stacked and may include a pair of spacers 21430 covering side surfaces of the gate insulation layer 21410 and the gate electrode 21420. A process of forming the gate insulation layer 21410 and the gate electrode 21420 may include sequentially depositing an insulating film and an electrically conductive film on the channel layer 21220 and patterning the electrically conductive film and the insulating film. The gate electrode 21420 and the gate insulation layer 21410 may include substantially the same materials as the gate electrode 2420 and the gate insulation layer 2410 described with reference to FIGS. 30 to 38.

A process of forming the pair of spacers 21430 may include forming an insulation film extending along surfaces of the device isolation layer 2SL, the channel layer 21220, the gate insulation layer 21410, and the gate electrode 21420 and leaving an insulation film on side surfaces of the gate insulation layer 21410 and the gate electrode 21420 through a large-area anisotropic etching.

Figure 60:
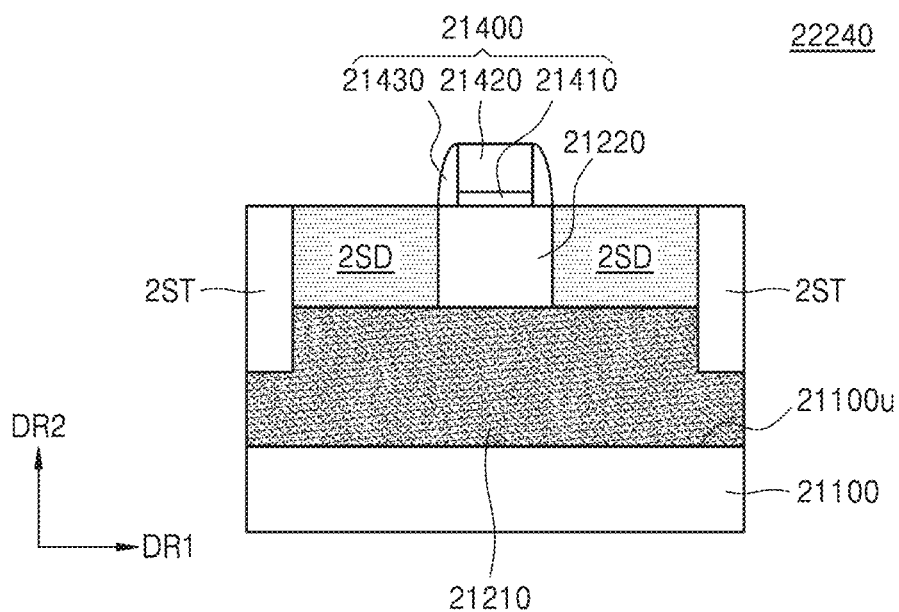

Referring to FIGS. 54 and 60, the pair of source/drain patterns 2SD may be formed in the channel layer 21220. The pair of source/drain regions 2SD may be spaced apart from each other across the gate structure 21400 therebetween. The pair of source/drain regions 2SD may have a conductivity type different from that of the constant current forming layer 21210. When the conductivity type of the pair of source/drain regions 2SD is n-type, the pair of source/drain regions 2SD may include a group V element (e.g., P or As) as an impurity. When the conductivity type of the pair of source/drain regions 2SD is p-type, the pair of source/drain regions 2SD may include a group III element (e.g., B or In) as an impurity. In an embodiment, the pair of source/drain regions 2SD may be formed through an ion implantation process.

In an embodiment, the threshold voltage of a transistor 22240 may be adjusted by a doping concentration of the channel layer 21220 and/or the work function of the gate electrode 21420. For example, the work function of the gate electrode 21420 may be controlled by the material constituting the gate electrode 21420 or by an additional work function control layer (not shown). For example, the additional work function control layer may be disposed between the gate insulation layer 21410 and the channel layer 21220.

The pair of source/drain regions 2SD and the constant current forming layer 21210 may be electrically connected to each other. For example, the pair of source/drain regions 2SD may directly contact the constant current forming layer 21210. An electric field may be formed between the pair of source/drain regions 2SD and the constant current forming layer 21210. For example, the intensity of the electric field may be $10^6$ V/cm or higher.

A constant current passing through the substrate 2100, the constant current forming layer 21210, and any one of the pair of source/drain patterns 2SD serving as a drain may be generated. The constant current may be a band-to-band tunneling (BTBT) current formed between any one of the pair of source/drain patterns 2SD serving as the drain and the constant current forming layer 21210. The constant current may be independent from a gate voltage applied to the gate electrode 21420. In other words, the constant current may flow regardless of the gate voltage. When the transistor 22240 is an NMOS transistor, a constant current may flow from any one of the pair of source/drain patterns 2SD serving as the drain to the substrate 21100 through the constant current forming layer 21210. When the transistor 22240 is a PMOS transistor, a constant current may flow from the substrate 21100 to any one of the pair of source/drain patterns 2SD serving as the drain through the constant current forming layer 21210.

The present disclosure may provide the transistor 22240 in which a constant current flows between the constant current forming layer 21210 and any one of the pair of source/drain patterns 2SD serving as the drain.

Figure 61:
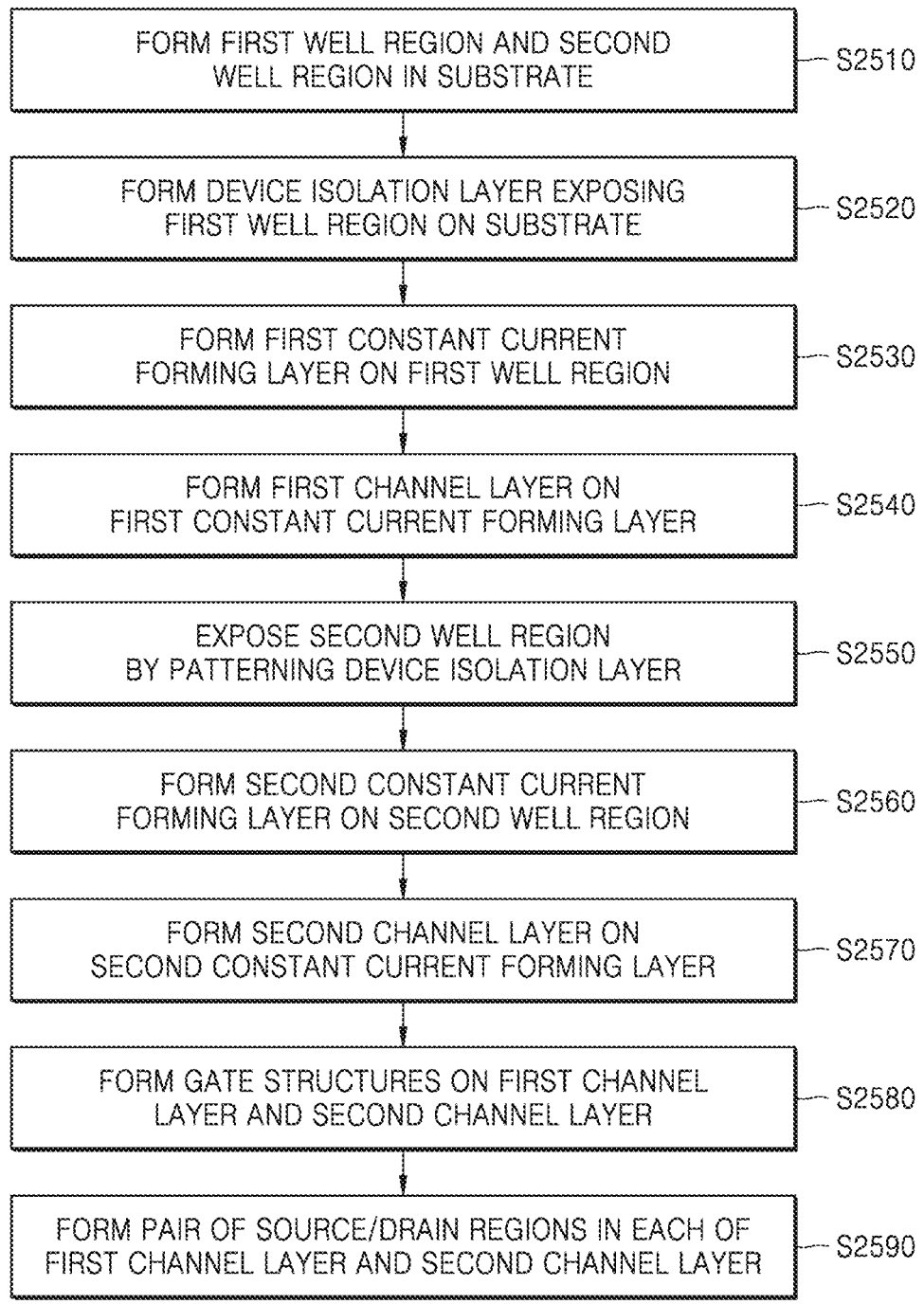
FIG. 61 is a flowchart of a method of manufacturing a ternary inverter according to an example embodiment.

FIG. 61 is a flowchart of a method of manufacturing a ternary inverter according to an example embodiment. FIGS. 62 to 70 are cross-sectional views for describing the method of manufacturing a ternary inverter of FIG. 61. For brevity of description, descriptions substantially identical to those given above with reference to FIGS. 54 to 60 may not be given.

Figure 62:
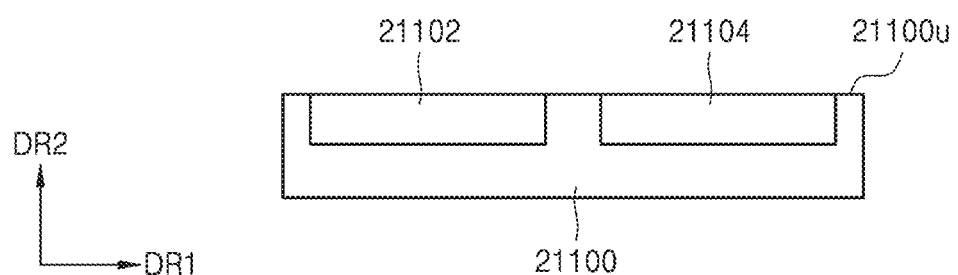
FIGS. 62 to 70 are cross-sectional views for describing the method of manufacturing a ternary inverter of FIG. 61.

Referring to FIGS. 61 and 62, a first well region 21102 and a second well region 21104 may be formed on the substrate 21100 (operation S510). The substrate 21100 may be a semiconductor substrate. For example, the substrate 21100 may include silicon (Si). The substrate 21100 may be an intrinsic semiconductor substrate 21100 or a semiconductor substrate having a conductivity type.

The first well region 21102 and the second well region 21104 may be formed in the upper portion of the substrate 21100. The first well region 21102 and the second well region 21104 may extend in the first direction DR1 parallel to a top surface 21100u of the substrate 21100. The first well region 21102 may be a p-type region. For example, the first well region 21102 may include a group III element (e.g., B or In) as an impurity. A process of forming the first well region 21102 may include providing a mask on the substrate 21100 for exposing a region in which the first well region 21102 is to be formed and implanting an impurity (e.g., a group III element) into the region in which the first well region 21102 is to be formed. For example, the implantation of an impurity may be performed through an ion implantation process. The mask may be removed after the process of implanting the impurity.

The second well region 21104 may be an n-type region. For example, the second well region 21104 may include a group V element (e.g., P or As) as an impurity. A process of forming the second well region 21104 may include providing a mask on the substrate 21100 for exposing a region in which the second well region 21104 is to be formed and implanting an impurity (e.g., a group V element) into the region in which the second well region 21104 is to be formed. For example, the implantation of an impurity into the region in which the second well region 21104 is to be formed may be performed through an ion implantation process. The mask may be removed after the process of implanting the impurity.

Figure 63:
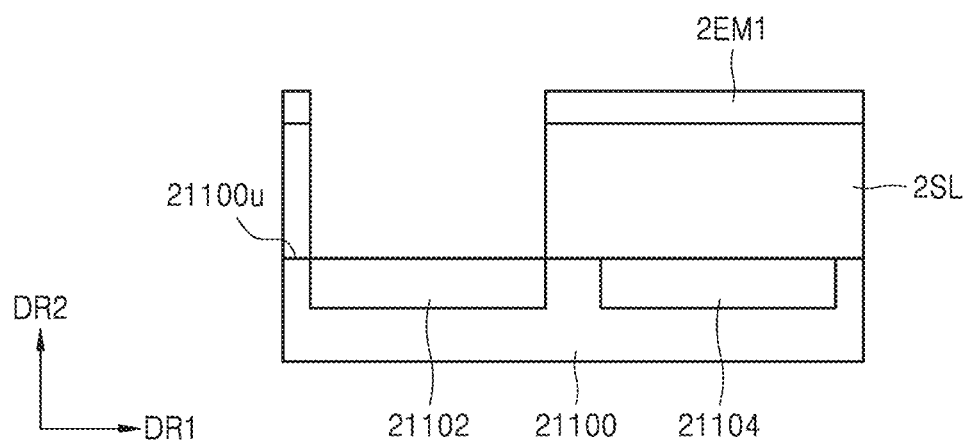

Referring to FIGS. 61 and 63, the device isolation layer 2SL exposing the first well region 21102 may be formed on the substrate 21100 (operation S520). For example, the device isolation layer 2SL may be formed through a process of depositing an insulating material on the substrate 21100. For example, the device isolation layer 2SL may include $SiO_2$. The device isolation layer 2SL may be patterned to expose the first well region 21102. A process of patterning the device isolation layer 2SL may include an anisotropic etching process using a first etching mask EM1 provided on the device isolation layer 2SL. For example, the first etching mask EM1 may include a photoresist material.

Figure 64:
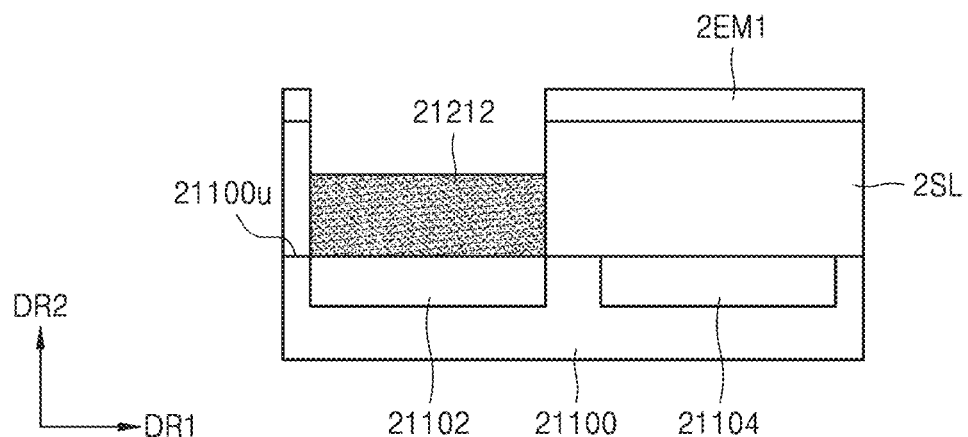

Referring to FIGS. 61 and 64, a first constant current forming layer 21210 (이하 불용납비) may be formed on the first well region 21102 (operation S530). The first constant current forming layer 21210 may be formed through an epitaxial growth process. In other words, the first constant current forming layer 21210 may be an epitaxial layer. For example, the first constant current forming layer 21210 may include silicon (Si). The conductivity type of the first constant current forming layer 21210 may be p-type. For example, the first constant current forming layer 21210 may include a group III element (e.g., B or In) as an impurity. The doping concentration of the first constant current forming layer 21210 may be higher than that of the substrate 21100. For example, the doping concentration of the first constant current forming layer 21210 may be $3\times10^{18}$ cm$^{-3}$ or higher. The first constant current forming layer 21210 may be selectively grown on the first well region 21102 exposed by the device isolation layer 2SL. The first constant current forming layer 21210 may be formed to a position lower than the top surface of the device isolation layer 2SL. The height of the top surface of the first constant current forming layer 21210 may be lower than the height of the top surface of the device isolation layer 2SL. The height may be a distance from the top surface 21100u of the substrate 21100.

Figure 65:
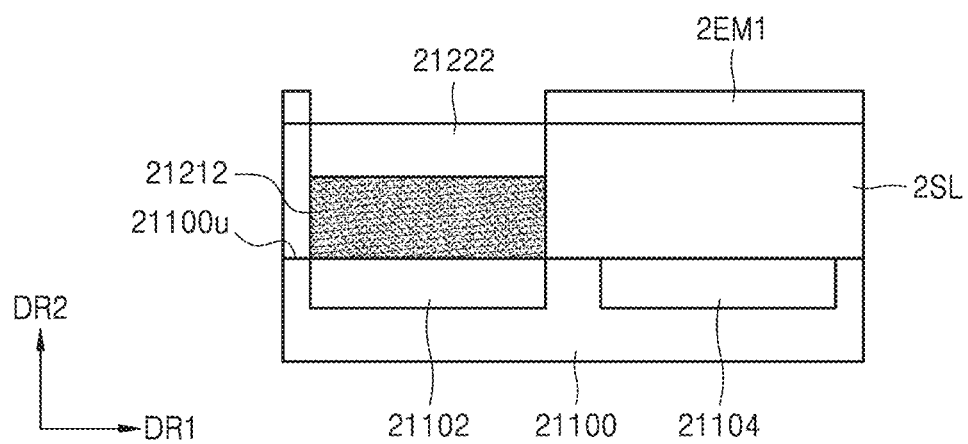

Referring to FIGS. 61 and 65, a first channel layer 21222 may be formed on the first constant current forming layer 21210 (operation S540). The first channel layer 21222 may be formed through an epitaxial growth process. In other words, the first channel layer 21222 may be an epitaxial layer. For example, the first channel layer 21222 may include silicon (Si). The conductivity type of the first channel layer 21222 may be p-type. For example, the first channel layer 21222 may include a group III element (e.g., B or In) as an impurity. The doping concentration of the first channel layer 21222 may be lower than that of the first constant current forming layer 21212. For example, the doping concentration of the first channel layer 21222 may be substantially identical to the doping concentration of the substrate 21100. The first channel layer 21222 may be selectively grown on the first constant current forming layer 21212 by the device isolation layer 2SL. The first etching mask EM1 may be removed after the first channel layer 21222 is formed.

Figure 66:
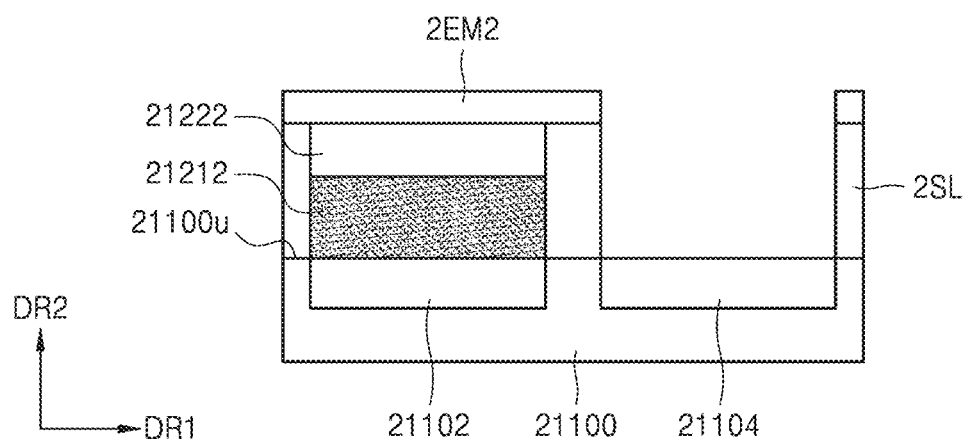

Referring to FIGS. 61 and 66, the device isolation layer 2SL may be patterned to expose the second well region 21104 (operation S550). A process of patterning the device isolation layer 2SL may include an anisotropic etching process using a second etching mask EM2 provided on the device isolation layer 2SL.

Figure 67:
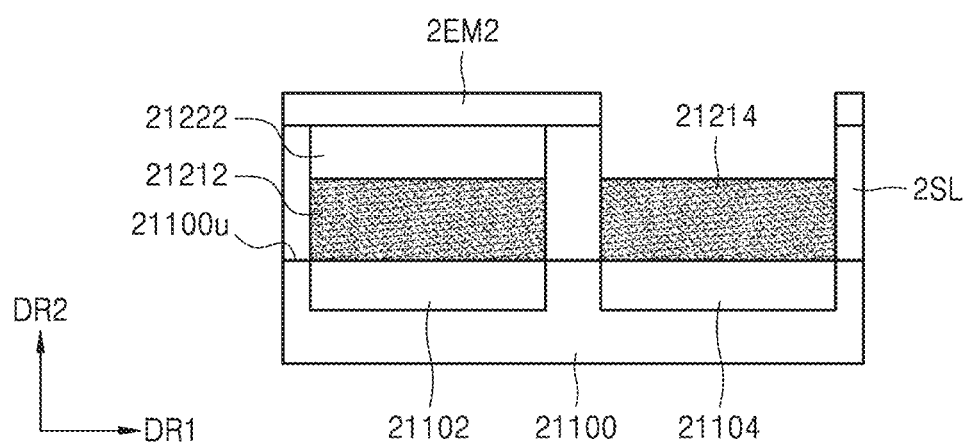

Referring to FIGS. 61 and 67, a second constant current forming layer 21214 may be formed on the second well region 21104 (operation S560). The second constant current forming layer 21214 may be formed through an epitaxial growth process. In other words, the second constant current forming layer 21214 may be an epitaxial layer. The second constant current forming layer 21214 may be selectively grown on the second well region 21104 exposed by the second device isolation layer 2SL. For example, the second constant current forming layer 21214 may include silicon (Si). The conductivity type of the second constant current forming layer 21214 may be n-type. For example, the second constant current forming layer 21214 may include a group V element (e.g., P or As) as an impurity. The doping concentration of the second constant current forming layer 2220 may be higher than that of the substrate 21100. For example, the doping concentration of the second constant current forming layer 2220 may be $3 \times 10^{18}$ cm$^{-3}$ or higher. The second constant current forming layer 21214 may be selectively grown on the second well region 21104 exposed by the device isolation layer. The second constant current forming layer 21214 may be formed to a position lower than the top surface of the device isolation layer 2SL. The height of the top surface of the second constant current forming layer 21214 may be lower than the height of the top surface of the device isolation layer 2SL. The height may be a distance from the top surface 21100u of the substrate 21100. For example, the height of the top surface of the second constant current forming layer 21214 may be substantially identical to the height of the top surface of the first constant current forming layer 21212.

Figure 68:
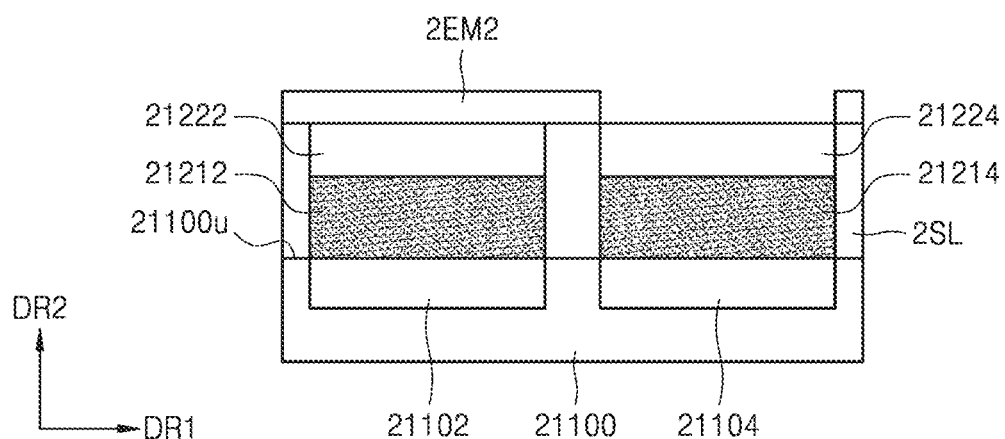

Referring to FIGS. 61 and 68, a second channel layer 21224 may be formed on the second constant current forming layer 21214 (operation S570). The second channel layer 21224 may be formed through an epitaxial growth process. In other words, the second channel layer 21224 may be an epitaxial layer. For example, the second channel layer 21224 may include silicon (Si). The conductivity type of the second channel layer 21224 may be n-type. For example, the second channel layer 21224 may include a group V element (e.g., P or As) as an impurity. The doping concentration of the second channel layer 21224 may be lower than that of the second constant current forming layer 21214. For example, the doping concentration of the second channel layer 21224 may be substantially identical to the doping concentration of the substrate 21100. The second channel layer 21224 may be selectively grown on the second constant current forming layer 21214 by the device isolation layer 2SL. The second etching mask EM2 may be removed after the second channel layer 21224 is formed.

Figure 69:
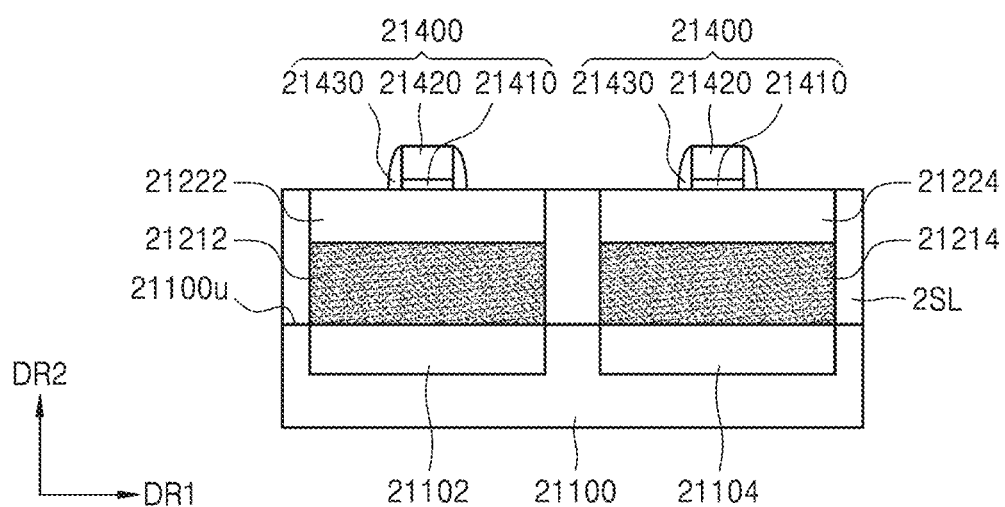

Referring to FIGS. 61 and 69, the gate structure 21400 may be formed on each of the first channel layer 21222 and the second channel layer 21224 (operation S580). The gate structure 21400 may include the gate insulation layer 21410 and the gate electrode 21420 that are sequentially stacked and may include the pair of spacers 21430 covering side surfaces of the gate insulation layer 21410 and the gate electrode 21420. A process of forming the gate insulation layer 21410 and the gate electrode 21420 may include sequentially depositing an electrically insulating film and an electrically conductive film on each of the first channel layer 21222 and the second channel layer 21224 and patterning the electrically conductive film and the electrically insulating film. A process of forming the pair of spacers 21430 may include forming an electrically insulating film extending along surfaces of the device isolation layer 2SL, the channel layer 21220, the gate insulation layer 21410, and the gate electrode 21420 and performing a large-area anisotropic etching process on the substrate 21100. The first channel layer 21222 and the second channel layer 21224 may each be exposed on both side surfaces of the gate structure 21400.

Figure 70:
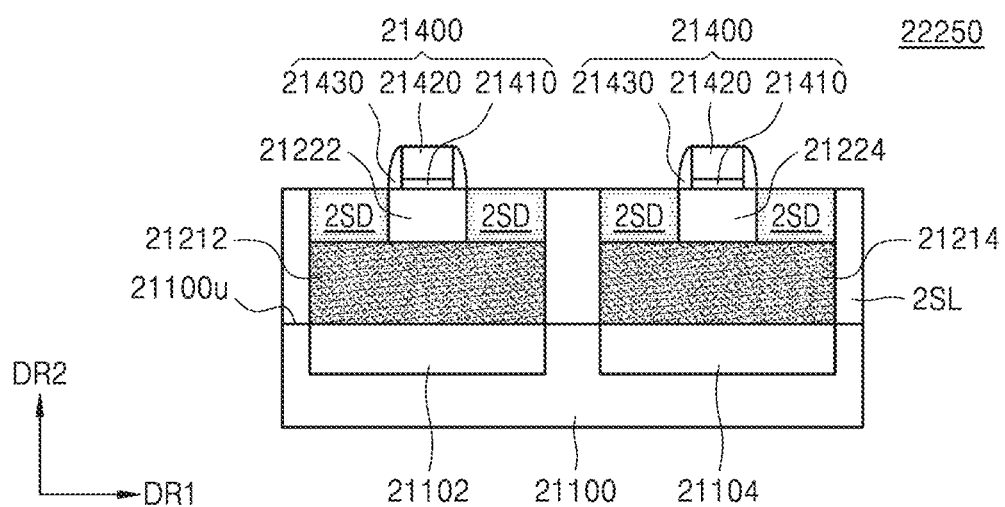

Referring to FIGS. 61 and 70, the pair of source/drain regions 2SD may be formed in each of the first channel layer 21222 and the second channel layer 21224 (operation S590) Second direction. When viewed in the second direction DR2, the pair of source/drain regions 2SD may be spaced apart from each other across the gate structure 21400 therebetween. A process of forming the pair of source/drain regions 2SD may include doping each of the first channel layer 21222 and the second channel layer 21224 exposed by the gate structure 21400. For example, a doping process may include an ion implantation process. A group V element (e.g., P or As) may be implanted into the first channel layer 21222 exposed by the gate structure 21400. The conductivity type of the pair of source/drain regions 2SD formed on the first well region 21102 may be n-type. A group III element (e.g., B or In) may be implanted into the second channel layer 21224 exposed by the gate structure 21400. Therefore, the conductivity type of the pair of source/drain regions 2SD formed in the second channel layer 21224 may be p-type.

The present disclosure may provide a ternary inverter 22250. The first well region 21102, the first constant current forming layer 21212, the first channel layer 21222, the pair of source/drain regions 2SD formed in the first channel layer 21222, and the gate structure 2400 may constitute an NMOS transistor. The second well region 21104, the second constant current forming layer 21214, the second channel layer 21224, the pair of source/drain regions 2SD formed in the second channel layer 21224, and the gate structure 2400 may constitute a PMOS transistor. A ground voltage may be applied to the first well region 21102 and a source of the NMOS transistor. A driving voltage may be applied to the second well region 21104 and a source of the PMOS transistor. An input voltage Vin may be applied to each of the gate electrode 21420 of the NMOS transistor and the gate electrode 21420 of the PMOS transistor.

A drain of the NMOS transistor and a drain of the PMOS transistor may be electrically connected to each other. The voltage of the drain of the NMOS transistor and the drain of the PMOS transistor may be an output voltage Vout of the ternary inverter 22250. The descriptions of the ternary inverter 22250 may be substantially identical to those given above with reference to FIG. 44.

The above description of embodiments of the technical spirit of the present invention provides examples for the description of the technical spirit of the present invention. Therefore, the technical spirit of the present invention is not limited to the above embodiments, and it is obvious that, within the technical spirit of the present invention, one or ordinary skill in the art may perform various modifications and changes such as combining the above embodiments.

The invention claimed is:

1. A transistor comprising:
a substrate;
a pair of constant current forming regions provided in the substrate;
a pair of source/drain regions respectively provided on the pair of constant current forming regions in the substrate; and
a gate structure provided between the pair of source/drain regions,
wherein any one of the constant current forming regions immediately adjacent to any one of the pair of source/drain regions serving as a drain forms a constant current between the any one of the pair of source/drain region serving as the drain and the any one of the constant current forming regions,
wherein the substrate and the pair of constant current forming regions have a first conductivity type,
the pair of source/drain regions have a second conductivity type different from the first conductivity type, and
a doping concentration of the pair of constant current forming regions is higher than a doping concentration of the substrate.

2. The transistor of claim 1,
wherein the gate structure comprises:
a gate electrode; and
a gate insulation layer provided between the gate electrode and the substrate, and
the constant current is independent of a gate voltage applied to the gate electrode.

3. The transistor of claim 1,
wherein the pair of constant current forming regions overlap the pair of source/drain regions in a direction perpendicular to a top surface of the substrate.

4. The transistor of claim 3,
wherein the pair of constant current forming regions are in contact with bottom surfaces of the pair of source/drain regions.

5. The transistor of claim 1,
wherein the doping concentration of the pair of constant current forming regions is $3 \times 10^{18}$ cm$^{-3}$ or higher.

6. The transistor of claim 1,
wherein an electric field of at least $10^6$ V/cm is formed between the any one of the pair of source/drain regions and the any one of the pair of constant current forming regions.

7. The transistor of claim 1,
further comprising a support substrate provided on a opposite side of the gate structure with respect to the substrate,
wherein the substrate protrudes from a top surface of the support substrate in a direction perpendicular to the top surface of the support substrate, and
the gate structure covers both side surfaces and the top surface of the substrate.

8. The transistor of claim 7,
wherein the gate structure extends in a first direction parallel to the top surface of the support substrate, and
the substrate extends in a second direction parallel to the top surface of the support substrate and intersecting the first direction.

9. The transistor of claim 8,
further comprising a pair of lower insulation layers provided between the support substrate and the gate structure on both side surfaces of the substrate.

10. The transistor of claim 9,
wherein the pair of source/drain regions are exposed on the lower insulation layer.

11. A ternary inverter comprising an NMOS transistor and a PMOS transistor,
wherein the NMOS transistor and the PMOS transistor each includes a substrate, a pair of constant current forming regions provided in the substrate, and a source pattern and a drain region respectively provided on the pair of constant current forming regions,
any one of the pair of constant current forming regions immediately adjacent to the drain region forms a constant current between the drain region and the any one of the pair of constant current forming regions, and
the drain region of the NMOS transistor and the drain region of the PMOS transistor are electrically connected to each other and have the same voltage as each other,
wherein, in each of the NMOS transistor and the PMOS transistor, the substrate and the pair of constant current forming regions have the same conductivity type, and a doping concentration of each of the pair of constant current forming regions is higher than the doping concentration of the substrate.

12. The ternary inverter of claim 11,
wherein the NMOS transistor and the PMOS transistor each comprises:
a gate electrode provided on the substrate; and
a gate insulation layer provided between the gate electrode and a top surface of the substrate, and
the constant current is independent of a gate voltage applied to the gate electrode.

13. The ternary inverter of claim 11,
wherein, in each of the NMOS transistor and the PMOS transistor, the doping concentration of each of the pair of constant current forming regions is $3 \times 10^{18}$ cm$^{-3}$ or higher.

14. A method of manufacturing a transistor, the method comprising:
forming a gate structure on a substrate;
forming a pair of etching regions on the substrate;
forming a pair of constant current forming regions in the pair of etched regions, respectively; and
forming a pair of source/drain regions on the pair of constant current forming regions, respectively,
wherein the pair of etching regions are spaced apart from each other across the gate structure therebetween, and
any one of the constant current forming regions immediately adjacent to any one of the pair of source/drain regions serving as a drain forms a constant current between the any one of the pair of source/drain region serving as the drain and the any one of the constant current forming regions,
wherein the substrate and the pair of constant current forming regions have a first conductivity type,
the pair of source/drain regions have a second conductivity type different from the first conductivity type, and
a doping concentration of the pair of constant current forming regions is higher than a doping concentration of the substrate.

15. The method of claim 14,
wherein the doping concentration of the pair of constant current forming regions is $3 \times 10^{18}$ cm$^{-3}$ or higher.

16. The method of claim 14,
wherein the pair of constant current forming regions are formed through an epitaxy growth process.

17. The method of claim 14,
further comprising: forming the substrate protruding from a top surface of a supporting substrate in a direction perpendicular to a top surface of the supporting substrate on a supporting substrate; and
forming a pair of lower insulation layers between the support substrate and the gate structure on both side surfaces of the substrate,
wherein the gate structure extends in a first direction parallel to the top surface of the support substrate and covers both side surfaces and the top surface of the substrate, and
the substrate extends in a second direction parallel to the top surface of the support substrate and intersecting the first direction.

18. A method of manufacturing a transistor, the method comprising:
forming a fin structure extending in a first direction on a substrate;
forming a gate structure extending in a second direction intersecting the first direction on the fin structure; and
forming a source region and a drain region in the fin structure,
wherein the fin structure comprises a constant current forming fin and a channel layer sequentially stacked on the substrate,
the source region and the drain region are formed on the channel layer and are spaced apart from each other across a gate electrode therebetween, and
the constant current forming fin forms a constant current between the drain region and the substrate and is formed through an epitaxial growth process,
wherein the forming of the fin structure comprises:
forming a preliminary constant current forming layer on the substrate;
forming a preliminary channel layer on the preliminary constant current forming layer; and
patterning the preliminary channel layer and the preliminary constant current forming layer.

19. The method of claim 18,
wherein the forming of the fin structure comprises:
forming a preliminary constant current forming layer on the substrate;
forming the constant current forming fin by patterning the preliminary constant current forming layer; and
forming the channel layer on the constant current forming fin.

20. The method of claim 19,
wherein the preliminary constant current forming layer and the channel layer are formed through an epitaxial growth process.

21. The method of claim 18,
wherein the preliminary constant current forming layer and the preliminary channel layer are formed through an epitaxial growth process.

22. The method of claim 18,
wherein the substrate and the constant current forming fin have a first conductivity type, and
a doping concentration of the constant current forming fin is $3 \times 10^{18}$ cm$^{-3}$ or higher.

23. The method of claim 22,
wherein an electric field is formed between the drain region and the constant current forming fin, and
an intensity of the electric field is $10^6$ V/cm or higher.

24. The method of claim 18,
further comprising forming a lower insulation layer on side surfaces of the constant current forming fin,
wherein a top surface of the lower insulation layer is disposed at a position identical to or higher than a top surface of the constant current forming fin.

25. A method of manufacturing a ternary inverter, the method comprising:
forming a first well region and a second well region different from each other in a substrate;
forming a first fin structure and a second fin structure extending in a first direction on the first well region and the second well region, respectively;
forming a gate structure extending in a second direction intersecting the first direction on the first fin structure and the second fin structure; and
forming a source region and a drain region spaced apart from each other across the gate structure therebetween in each of the first fin structure and the second fin structure,
wherein the first fin structure and the second fin structure comprise a first constant current forming fin and a second constant current forming fin, respectively,
the first constant current forming fin forms a constant current between the drain region and the first well region of the first fin structure and is formed through an epitaxial growth process, and
the second constant current forming fin forms a constant current between the drain region and the second well region of the second fin structure and is formed through an epitaxial growth process,
wherein the first fin structure further comprises a first channel layer formed on the first constant current forming fin,
the second fin structure further comprises a second channel layer formed on the second constant current forming fin, and
the forming of the first fin structure and the second fin structure comprises:
forming a preliminary constant current forming layer on the substrate;
forming the first constant current forming fin and the second constant current forming fin by patterning the preliminary constant current forming layer; and
forming the first channel layer and the second channel layer on the first constant current forming fin and the second constant current forming fin, respectively.

26. The method of claim 25,
wherein the preliminary constant current forming layer, the first channel layer, and the second channel layer are formed through an epitaxial growth process.

27. The method of claim 25,
wherein the first fin structure further comprises a first channel layer formed on the first constant current forming fin,
the second fin structure further comprises a second channel layer formed on the second constant current forming fin, and
the forming of the first fin structure and the second fin structure comprises:
forming a preliminary constant current forming layer on the substrate;
forming a preliminary channel layer on the preliminary constant current forming layer; and
patterning the preliminary channel layer and the preliminary constant current forming layer.

28. The method of claim 27,
wherein the preliminary constant current forming layer and the preliminary channel layer are formed through an epitaxial growth process.

29. The method of claim 25,
wherein the first well region and the first constant current forming fin have a first conductivity type,
the second well region and the second constant current forming fin have a second conductivity type different from the first conductivity type, and
a doping concentration of each of the first constant current forming fin and the second constant current forming fin is $3 \times 10^{18}$ cm$^{-3}$ or higher.

30. The method of claim 29,
wherein an electric field of at least $10^6$ V/cm is formed between the drain region of the first fin structure and the first constant current forming fin, and
an electric field of at least $10^6$ V/cm is formed between the drain region of the second fin structure and the second constant current forming fin.

31. The method of claim 25,
further comprising forming a lower insulation layer on side surfaces of the first constant current forming fin and side surfaces of the second constant current forming fin,
wherein a top surface of the lower insulation layer is disposed at a position equal to or higher than those of a top surface of the first constant current forming fin and a top surface of the second constant current forming fin.

32. The method of claim 25,
wherein the drain region of the first fin structure and the drain region of the second fin structure are electrically connected to each other and have the same voltage.

* * * * *